United States Patent [19]

Keith et al.

[11] Patent Number: 4,785,349

[45] Date of Patent: Nov. 15, 1988

[54] DIGITAL VIDEO DECOMPRESSION SYSTEM

[75] Inventors: John M. Keith, Washington Crossing, Pa.; Stuart J. Golin, East Windsor, N.J.; Allen H. Simon, Belle Mead, N.J.; Brian Astle, Cranbury, N.J.

[73] Assignee: Technology Inc. 64, Princeton, N.J.

[21] Appl. No.: 104,131

[22] Filed: Oct. 5, 1987

[51] Int. Cl.$^4$ .............................................. H04N 7/13
[52] U.S. Cl. .................................... 358/136; 358/11; 358/13; 358/133; 358/135
[58] Field of Search ............... 358/133, 136, 135, 105, 358/13, 11; 375/27, 122

[56] References Cited

U.S. PATENT DOCUMENTS

| | | | |
|---|---|---|---|
| 4,225,885 | 9/1980 | Lux et al. | 340/146.3 |
| 4,334,246 | 6/1982 | Saran | 358/261 |
| 4,386,366 | 5/1983 | Mori | 358/135 |
| 4,430,670 | 2/1984 | Netravali | 358/135 |
| 4,468,708 | 8/1984 | Coleman | 358/310 |
| 4,520,401 | 5/1985 | Takahashi et al. | 358/310 |
| 4,546,342 | 10/1985 | Weaver et al. | 340/347 |
| 4,667,233 | 5/1987 | Furukawa | 358/136 |
| 4,691,329 | 9/1987 | Juri | 358/136 |

OTHER PUBLICATIONS

Leonardi & Kunt, "Adaptive Split and Merge for Image Analysis and Coding", Image Coding, Cannes, France, Dec. 1985 vol. 594 pp. 2-9, 1986.
Leonardi & Kunt, "Adaptive Split for Image Coding", International Symposium On Applied Signal Proc. and Digital Filtering, Paris 1985.
Milford et al., "Quad Encoded Display", IEEE Proceedings, vol. 131, Pt. E, No. 3, May 1984, pp. 70-75.
Baker & Gray "Image Compression Using Non-Adaptive Spatial Vector Quantization", IEEE Cat. #CH1809-3183/0000/0055 Conf. Paper in 16th Asilomar Conf. On Circuits, Sys. and Computers, Ca. 11/82 IEEE.

Primary Examiner—Howard W. Britton
Attorney, Agent, or Firm—Paul J. Rasmussen; Eric P. Herrmann; Kenneth N. Nigon

[57] ABSTRACT

A full motion color digital video signal is compressed, formatted for transmission, recorded on compact disc media and decoded at conventional video frame rates. During compression, regions of a frame are individually analyzed to select optimum fill coding methods specific to each region. Region decoding time estimates are made to optimize compression thresholds. Region descriptive codes conveying the size and locations of the regions are grouped together in a first segment of a data stream. Region fill codes conveying pixel amplitude indications for the regions are grouped together according to fill code type and placed in other segments of the data stream. The data stream segments are individually variable length coded according to their respective statistical distributions and formatted to form data frames. The number of bytes per frame is dithered by the addition of auxiliary data determined by a reverse frame sequence analysis to provide an average number selected to minimize pauses of the compact disc during playback thereby avoiding unpredictable seek mode latency periods characteristic of compact discs. A decoder includes a variable length decoder responsive to statistical information in the code stream for separately variable length decoding individual segments of the data stream. Region location data is derived from region descriptive data and applied with region fill codes to a plurality of region specific decoders selected by detection of the fill code type (e.g., relative, absolute, dyad and DPCM) and decoded region pixels are stored in a bit map for subsequent display.

15 Claims, 32 Drawing Sheets

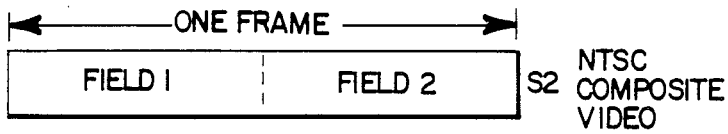

FIG. 3 — NTSC COMPOSITE VIDEO (ONE FRAME: FIELD 1, FIELD 2, S2)

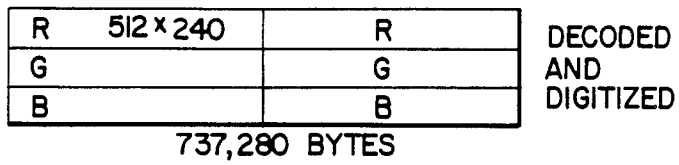

FIG. 4 — DECODED AND DIGITIZED (R G B, 512×240, 737,280 BYTES)

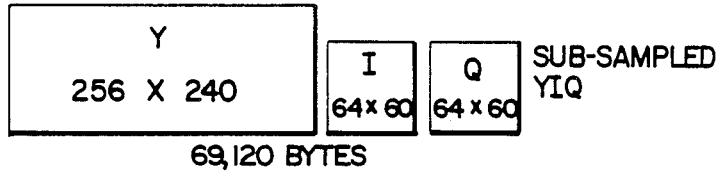

FIG. 5 — SUB-SAMPLED YIQ (Y 256×240, I 64×60, Q 64×60, 69,120 BYTES)

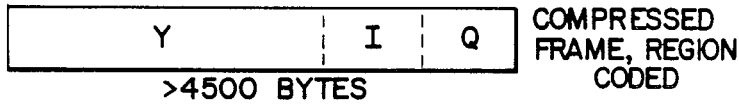

FIG. 6 — COMPRESSED FRAME, REGION CODED (Y, I, Q, >4500 BYTES)

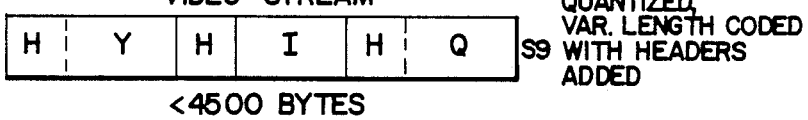

FIG. 7 — VIDEO "STREAM" QUANTIZED, VAR. LENGTH CODED WITH HEADERS ADDED (H Y H I H Q, S9, <4500 BYTES)

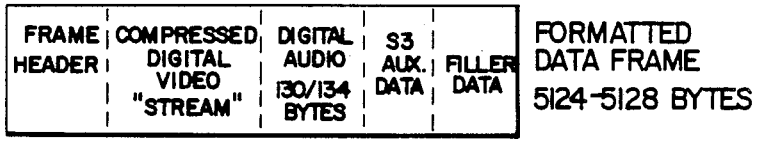

FIG. 8 — FORMATTED DATA FRAME 5124–5128 BYTES (FRAME HEADER, COMPRESSED DIGITAL VIDEO "STREAM", DIGITAL AUDIO 130/134 BYTES, S3 AUX. DATA, FILLER DATA)

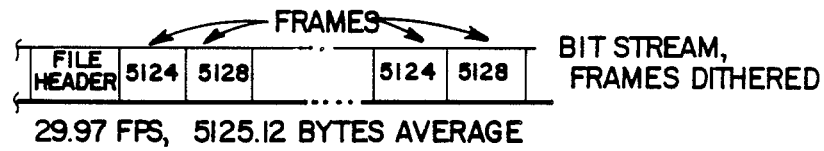

FIG. 9 — BIT STREAM, FRAMES DITHERED (FILE HEADER, 5124, 5128, ..., 5124, 5128; FRAMES; 29.97 FPS, 5125.12 BYTES AVERAGE)

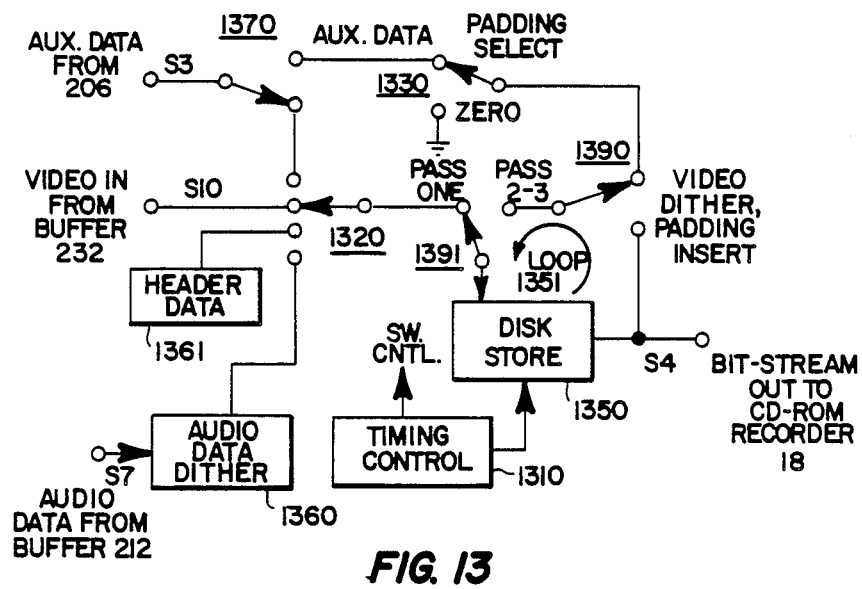

NO "SLOPE" OR GRADIENT
FILL = Ax + By + C
A = 0
B = 0
C = 5
CODE: ABS 0 0 5

UNIFORM HOR. SLOPE
FILL = Ax + By + C
A = 1
B = 0
C = 4
CODE: ABS 1 0 4

UNIFORM VERT. SLOPE
FILL = Ax + By + C
A = 0
B = -1
C = 6
CODE: ABS 0 -1 6

VERT. AND HOR. SLOPE
FILL = Ax + By + C
A = 1
B = -1
C = 5
CODE: ABS 1 -1 5

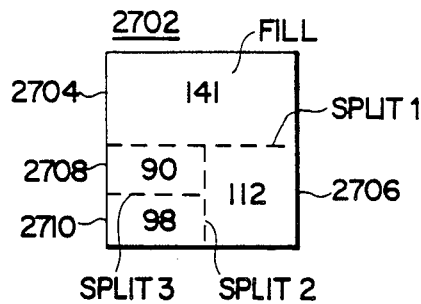
*FIG. 27*
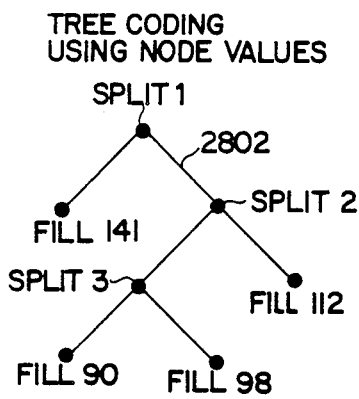
*FIG. 28*
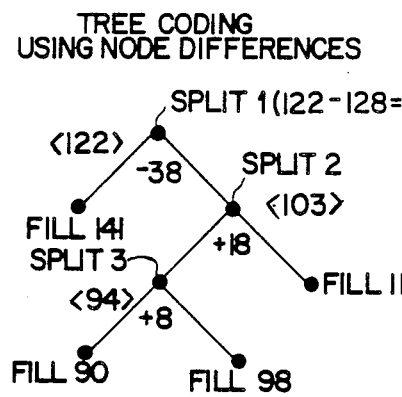
*FIG. 29*
*FIG. 30*
SPLIT/FILL
TREE CODE
HF 141 VHF 90 F 98 F 112
H: HORIZONTAL SPLIT ACTION
V: VERTICAL SPLIT ACTION
F: FILL ACTION
*FIG. 31*
SPLIT/FILL
TREE CODE
A. -6H -38 FV18 H8 FFF
B. 12H76 FV36 H 16 FFF
C. 12S 76 FS36 S 16 FFF
(S-Simple SPLIT)
(A-Alternate SPLIT)

| LEFT HALF (V13) | RIGHT HALF (V24) | TOP HALF (H12) | BOTTOM HALF (H34) |
|---|---|---|---|
| $(V1-V3)^2$ $+(H1-H3)^2$ $+HO^2+H1$ $+H3+1$ | $(V2-V4)^2$ $+(H2-H4)^2$ $+HO^2+H2$ $+H4+1$ | $(H1-H2)^2$ $+(V1-V2)^2$ $+VO^2+V1$ $+V2+1$ | $(H3-H4)^2$ $+(V3-V4)^2$ $+VO^2+V3$ $+V4+1$ |

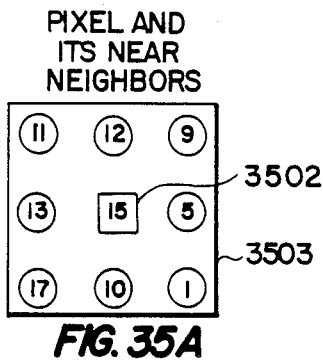
FIG. 35A
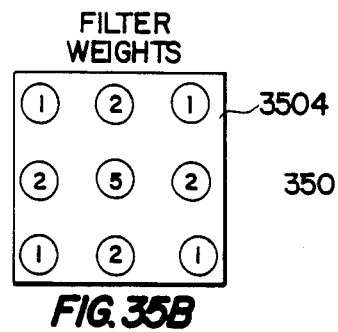
FIG. 35B
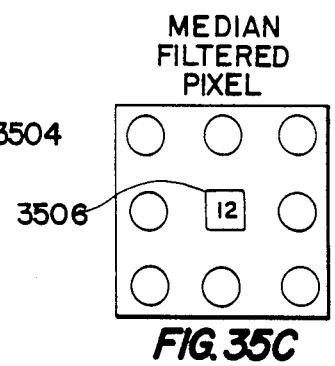
FIG. 35C
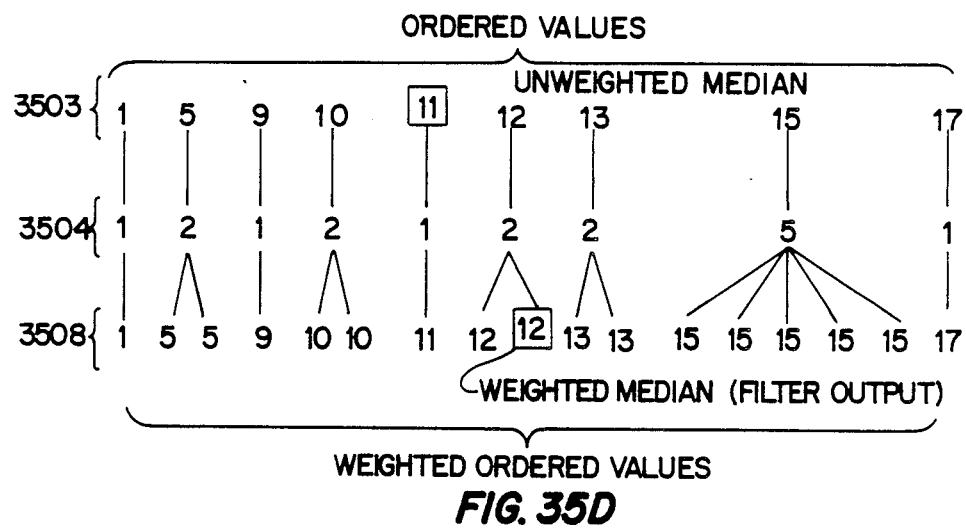
FIG. 35D
FIG. 35E
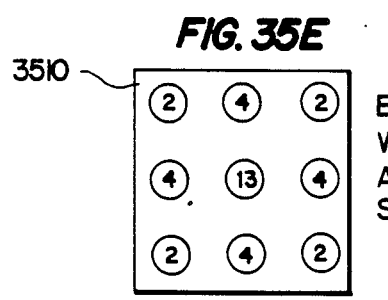
EXEMPLARY WEIGHTS FOR AVERAGE SCENE

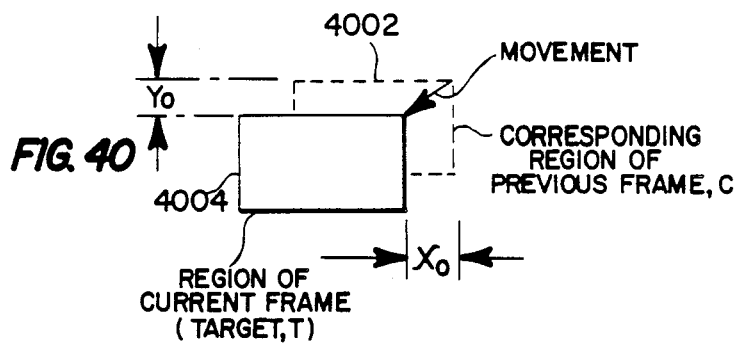
FIG. 40
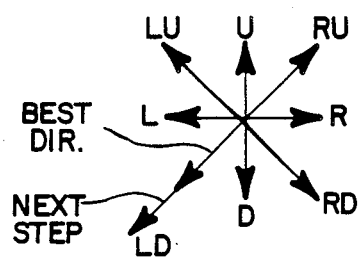
FIG. 41
FIG. 42
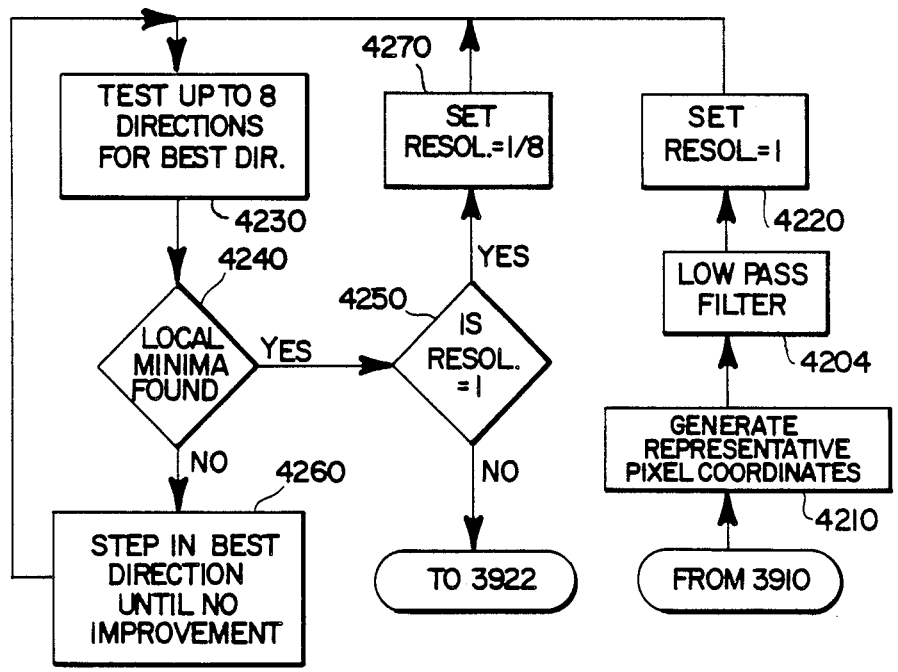

| REGION AREA (PIXELS) | QUANTIZATION (BITS) |
|---|---|
| 1 | 3 |
| 2-3 | 4 |
| 4-7 | 5 |
| 8-15 | 6 |
| 16-31 | 7 |
| 32-N | 8 |

| REGION TYPE | X Y | H W | OTHER VALUES |
|---|---|---|---|
| ABSOLUTE RELATIVE DPCM OR DYAD | REGION LOCATION (UPPER LEFT CORNER) | DIMENSION (HEIGHT, WIDTH) | "C" (ABS. REGIONS) Xo Yo (REL. OR DYAD REGIONS) |
(ONE ENTRY PER REGION) FIG. 49
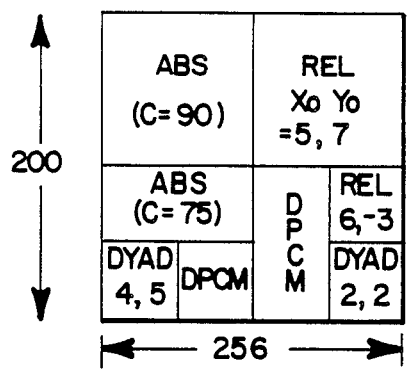
FIG. 50
FIG. 51
| TYPE | X | Y | H | W | OTHER |
|---|---|---|---|---|---|
| ABS | 0, | 0 | 100 | 128 | 90 |
| REL | 128 | 0 | 100 | 128 | 5, 7 |
| ABS | 0 | 100 | 50 | 128 | 75 |
| DYAD | 0 | 150 | 50 | 64 | 4, 5 |
| DPCM | 64 | 150 | 50 | 64 | |
| DPCM | 128 | 100 | 100 | 64 | |
| REL | 192 | 100 | 50 | 64 | 6,-3 |
| DYAD | 192 | 150 | 50 | 64 | 2, 2 |
FIG. 52
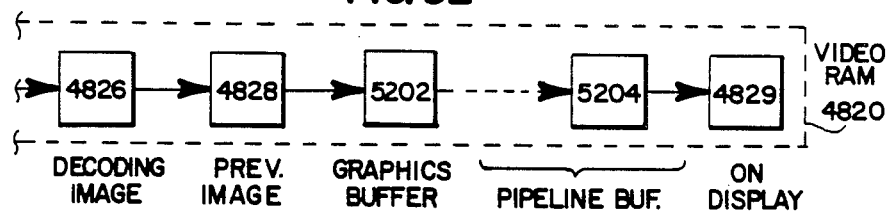

$$P(x,y)=P'(x,y)+Ax+By+C$$

$P(x,y) = Ax + By + C$

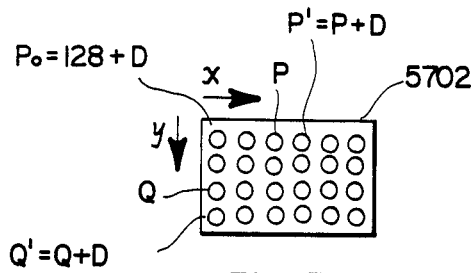
FIG. 57
FIG. 58
DPCM FILL DECODER 4852
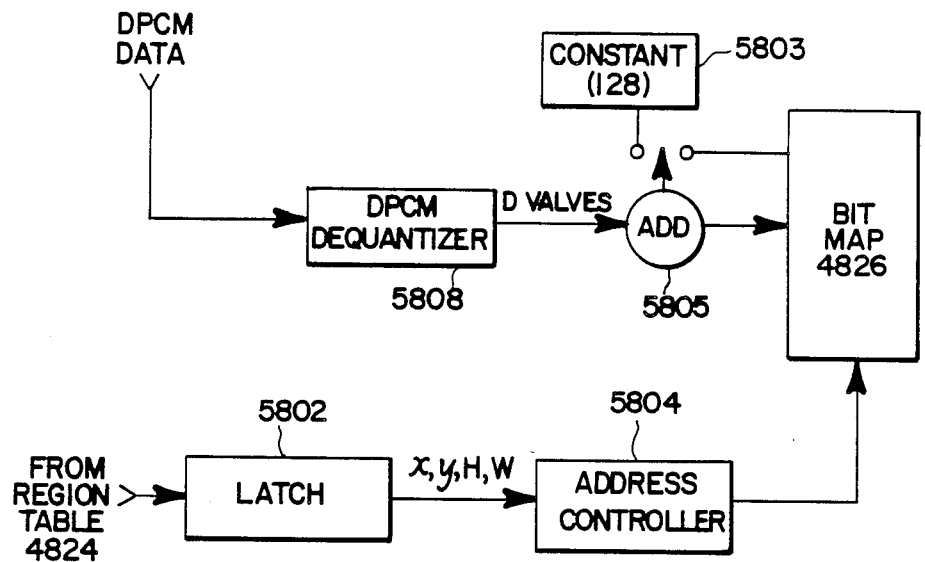

| REGION AREA | QUANT. (BITS) | NUMBER OF LEVELS | SHIFT VALUE |
|---|---|---|---|
| 1 | 3 | 8 | 5 |
| 2-3 | 4 | 16 | 4 |
| 4-7 | 5 | 32 | 3 |
| 8-15 | 6 | 64 | 2 |
| 16-31 | 7 | 128 | 1 |
| >32 | 8 | 256 | 0 |

TABLE LOOK-UP $(CODE_i) = R_i, S_i$ $A_i = C_i + R_i \quad B_i = D_i + S_i$ ated pulse code modulation (DPCM) for recording on a digital audio disc. In the known system, luminance (Y) and chrominance (R−Y, B−Y) components of a video frame are separately compressed using DPCM. A circuit divides the components into picture element data groups of a specific number of rows or columns which are adjacent on a screen. A header signal is provided having a synchronizing signal, a picture mode identification signal and a picture information quantity identification code. The header signal is added to the beginning position of each of the divided picture element data groups to produce a digital video output signal having a signal format in which the digital luminance, the two kinds of digital color difference signal and the header signal are time sequentially multiplexed and recorded.

DIGITAL VIDEO DECOMPRESSION SYSTEM

FIELD OF THE INVENTION

This invention relates generally to systems for reducing the amount of digital data required to represent a digital video signal and particularly to systems for decoding a compressed digital video signal representative of a full motion color video signal.

BACKGROUND OF THE INVENTION

The need for compression to facilitate recording of a digital video signal on relatively narrow-band media, such as a compact disc (CD), has been recognized. In a system proposed by Takahashi et al. in U.S. Pat. No. 4,520,401, a digital video signal is encoded using differential pulse code modulation (DPCM) for recording on a digital audio disc. In the known system, luminance (Y) and chrominance (R−Y, B−Y) components of a video frame are separately compressed using DPCM. A circuit divides the components into picture element data groups of a specific number of rows or columns which are adjacent on a screen. A header signal is provided having a synchronizing signal, a picture mode identification signal and a picture information quantity identification code. The header signal is added to the beginning position of each of the divided picture element data groups to produce a digital video output signal having a signal format in which the digital luminance, the two kinds of digital color difference signal and the header signal are time sequentially multiplexed and recorded.

In an example of the Takahashi et al. system still frames of digital video are recorded and updated at a rate of about four seconds per frame. The division of the compressed data into groups of lines with each group containing complete color information provides a psuedo-motion effect in that the line groups may be sequentially updated while displaying the previous frame thereby providing a partially moving picture.

SUMMARY OF THE INVENTION

A system for compressing and formatting a full motion color digital video signal is described herein. The present invention is directed to satisfying the need for apparatus for decoding a compressed signal of the type herein described to enable display of full motion video images at normal video frame rates.

Decoding apparatus in accordance with an aspect of the invention includes means for providing a compressed digital video signal of a type in which each frame thereof comprises a plurality of coded regions, each region being encoded by a region desrriptive code and a region fill code, said region descriptive codes conveying data representative of the size and location of said regions within said frames, said region fill codes conveying pixel amplitude indications for said regions. A first decoding means, coupled to said input means, decodes said region descriptive code to provide region address data. A second decoding means, coupled to said input means, decodes said region fill codes to provide pixel values. A memory means, coupled to said first and second decoding means, stores said pixel values for said regions at addresses provided by said address data to provide a decoded bit map containing one frame of pixels.

In accordance with another aspect of the invention, said region descriptive and fill codes are conveyed by separate segments of said video input signal and further comprising control means for causing said first decoding means to decode said region descriptive codes prior to the decoding of said region fill codes by said second decoder means.

In accordance with a further aspect of the invention, said region descriptive and fill codes are conveyed by separate segments of said video input signal, said segments being individually variable length coded in accordance with their respective statistical distributions and said decoding apparatus includes a multimode variable length decoder for variable length decoding said region descriptive codes in accordance with a first statistical code and for variable length decoding said region fill codes in accordance with a second statistical code, said decoding apparatus further including circuit means coupled to said input means for deriving said statistical codes from data included in a third segment of said video input signal.

BRIEF DESCRIPTION OF THE DRAWING

The foregoing and further features of the invention are shown in the accompanying drawing in which like elements are denoted by like reference designators and in which:

FIGS. 3–9 are diagrams illustrating digital video signal formats at various stages of processing in the encoder of FIG. 2;

FIGS. 10–12 are diagrams illustrating two methods of processing "oversized" frames in the encoder of FIG. 2;

FIG. 13 is a block diagram of a formatter providing padding and dithering for use in the encoder of FIG. 2;

FIG. 27 is a diagram illustrating binary tree regionalization of an image in the compressor of FIG. 16;

FIGS. 28 and 29 are examples of split/fill coding diagrams for the regionalized image of FIG. 27;

FIGS. 30 and 31 are examples of "tree" codes for the coding diagrams of FIGS. 28 and 29, respectively;

FIGS. 35A-35E are diagrams illustrating weighted median filtering in the compressor of FIG. 16;

FIG. 40 is a diagram illustrating region translation in the inter-frame coder of FIG. 39;

FIGS. 41 and 42 are vector and flow chart diagrams, respectively, illustrating selection of a best region search direction in the inter-frame coder of FIG. 39;

FIGS. 49, 50 and 51 are examples of table listings of data stored in a region location memory of the decoder of FIG. 48 for absolute, relative, dyad and DPCM coded regions of FIG. 48;

FIG. 52 is a block diagram illustrating a memory organization for use in the decoder of FIG. 48;

FIG. 57 is a diagram illustrating DPCM decoding of a region in the decoder of FIG. 48;

FIG. 58 is block diagram of apparatus providing the region DPCM decoding of FIG. 57;

DETAILED DESCRIPTION

Figure 1:
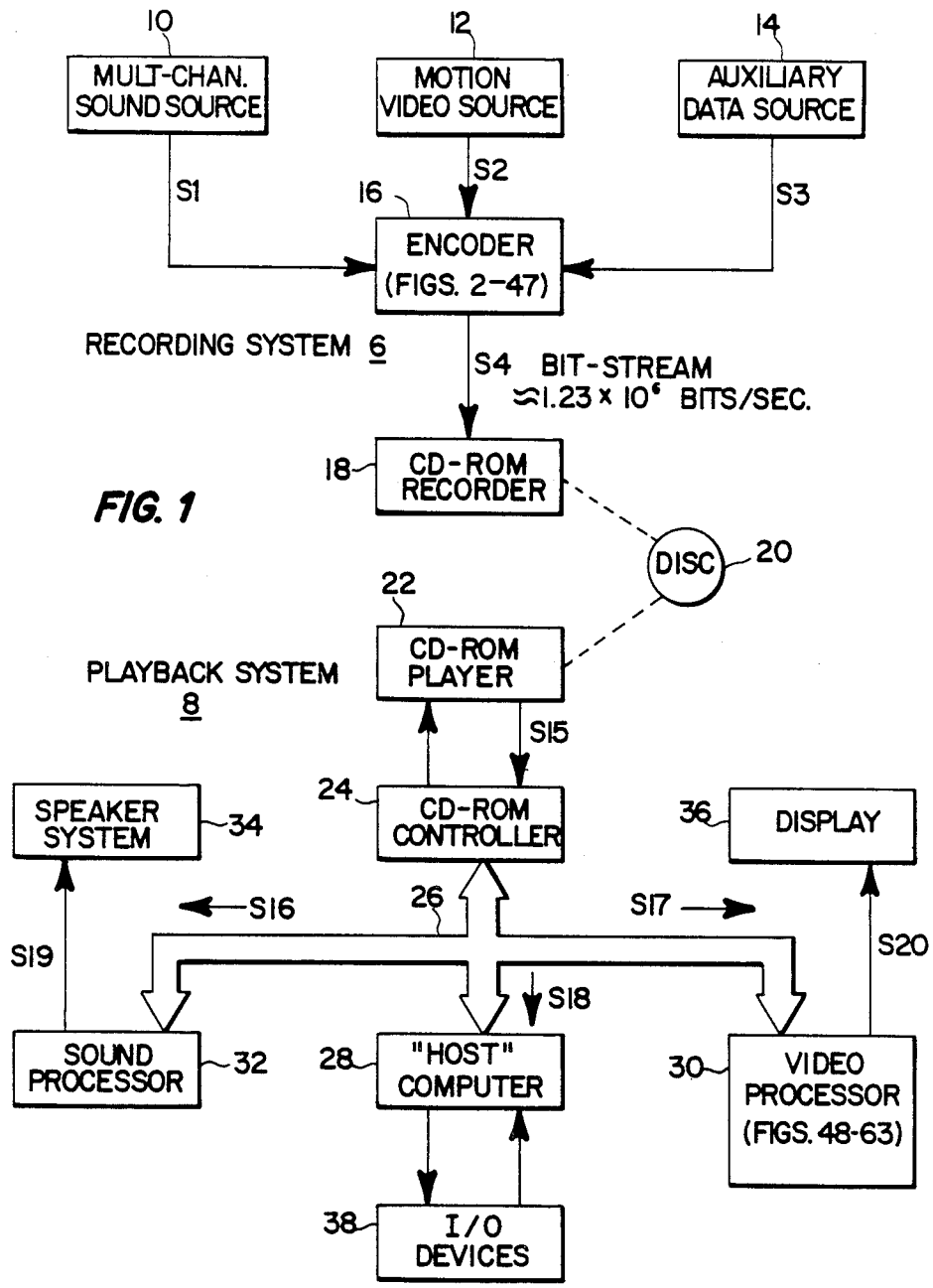
FIG. 1 is a block diagram of a digital video interactive system embodying the invention providing recording and reproduction of full-motion video, multi-channel digital audio and auxiliary (e.g., interactive) data using a compact disc read-only memory (CD-ROM) as the recording media.

The digital video interactive system of FIG. 1 comprises a recording system 6 and a playback system 8. The recording system includes sources 10, 12 and 14 which provide, respectively, a multi-channel sound signal S1, a color motion video signal S2 and an auxiliary data signal S3. An encoder 16 encodes and combines signals S1, S2 and S3 to form a digital recording signal S4 (hereinafter, "bit-stream") that is recorded on a compact disc read-only memory (CD-ROM) disc 20 by means of a CD-ROM recorder 18. Auxiliary data signal S3 may comprise interactive data associated with the video or audio signals or some other type of digital data which may be independent of the audio or video data.

The average data rate of the bit-stream S4 is controlled by a selection of encoding parameters to equal the standard CD-ROM record/playback bit-rate of about 1.2 mega-bits per second. The parameters are selected, as will be explained, so as to enable recording of up to one hour of full-motion digitally encoded color video, multi-channel digital audio and auxiliary data on CD-ROM disc 20.

The encoding of the digital full-motion color video portion of the recording signal to meet the relatively low channel capacity of the CD-ROM disc player requires very substantial data reduction. In a specific example to be described, this data reduction is on the order of about 150:1 for an exemplary video frame rate of 30 FPS (frames per second). To meet this critical requirement, while avoiding visible "artifacts" associated with conventional video compression techniques, encoder 16 converts the video signal S2 to a color frame sequential component form and separately subjects each frame of each component to a number of specially adapted processes as will be described. Briefly listed, these include variable sub-sampling, variable inter-frame and intra-frame compression employing what will herein be termed "region-specific" encoding, area dependent adaptive quantization, "segmented" variable length coding, reverse frame sequence reformatting, padding and frame dithering.

The selection of the individual processes, the selection of the share of data reduction provided by each process and the selection of variable compression parameters (e.g., thresholds, operating modes and, particularly, when to quit compressing) represents critical choices in meeting the objective of encoding full motion color video for storage on CD-ROM digital audio tape (DAT) or other bandwidth limited media. Such choices depend on more than merely the channel capacity of the CD-ROM media. They depend as well on variables such as the video frame rate, the desired spatial resolution, certain specific characteristics of the video image content and on parameters of the decoder that is ultimately used for reconstituting the image. As will be explained, each individual video frame is converted to a component form and each component is divided to form a number of blocks (hereafter "regions") of picture elements ("pixels"). Each region is then individually "custom" encoded. This process is hereafter referred to as "region-specific" coding. The coding for each region is selected from a group of codes to enable the video decoder in playback system 8 to meet the strict requirement of completing all decoding tasks assigned to it in "real time", that is, within one video frame interval (a variable).

The foregoing and other aspects of recording system 6 are discussed in detail with reference to FIGS. 2–47 and 61, 62. Details of playback system 8 are discussed later with reference to FIGS. 48–63.

Figure 2:
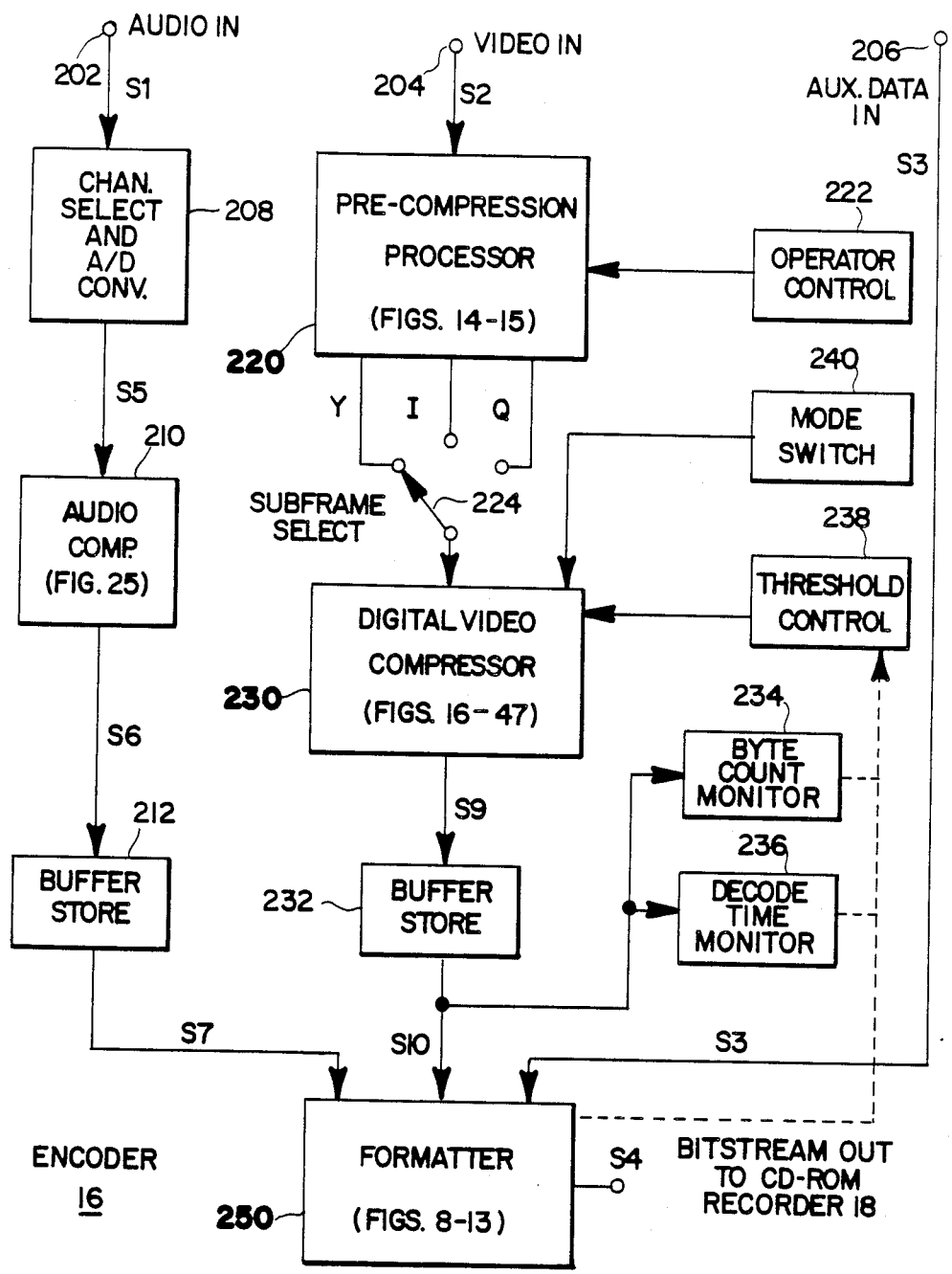
FIG. 2 is a block diagram of a digital video encoder used in a recording portion of the system of FIG. 1.

Encoder 16, in FIG. 2, includes input terminals 202, 204 and 206 for receiving audio signal S1 from source 10, video signal S2 from source 12 and auxiliary data signal S3 from source 14, respectively. As an overview of the audio processing, signal S1 is subjected to channel selection and analog-to-digital (A/D) conversion, compressed with provisions for preventing frame-to-frame propagation of errors and stored for later recovery as blocks of audio data to be included in each video frame of bit stream S4 thereby providing audio/video synchronization.

In detail, audio signal S1 is applied to a channel selector and analog-to-digital A/D converter unit 208 which includes operator controls (not shown) for selecting the number of channels to be encoded and the channel sampling rate. One channel is selected for monophonic recording, two for stereo, four for stereo/bilingual, etc. The sampling rate currently used for high quality audio recording is 31.25 KHz which supports a 15 KHz audio bandwidth. The rate may be halved for standard quality or quartered for voice grade audio applications.

The data rate of the digitized audio signal S5 is reduced for recording by means of an adaptive differential pulse code modulation (ADPCM) encoder 210 which encodes the sample-to-sample differences of signal S5 to form a compressed digital audio signal S6. Since successive audio samples are often highly correlated, fewer bits are required to encode the sample differences. The term "adaptive" means that the encoder is of a type that changes the bit significance of encoded differences as a function of the previous encoded difference so as to provide fine resolution over a wide dynamic range.

Encoder 210 may be of conventional design but it is highly desirable for purposes of overall audio/video coding that provision be made either to bypass or reset it on a periodic basis so as to periodically encode an audio sample with full resolution. Illustratively, encoder 210 (FIG. 25) is reset once every 256 bytes. Recall that the audio signal is ultimately organized in a block form with one block of audio data included with each block of video data in bit stream S4. The formation of audio data "blocks" is supported via buffer store 212 which stores signal S6. Later the formatter 250 recovers the stored signal (S7) periodically on a frame-by-frame basis when the audio and video data are combined as will be explained. Typical audio block sizes currently used are 130 and 134 bytes for a video frame rate of 30 FPS and voice grade audio. The audio block size depends on the sampling rate, the number of audio channels to be recorded, and audio dithering within the formatter 250.

One reason for periodically resetting or bypassing DPCM encoder 210 is to prevent audio errors, which may occur in the CD-ROM transmission system, from propagating from frame-to-frame. This feature also facilitates subsequent editing of sequences to enable any frame to be chosen as an edit point. This feature is implemented as, shown in FIG. 25 by means of a comparator 214 which supplies a reset signal to reset input R of audio A DPCM encoder 211 when the byte count of the compressed audio signal S6 (produced by a byte counter 216) exceeds the byte limit set by a byte limit source 218.

Video Coding Overview

The principal elements providing video encoding in FIG. 2 comprise a pre-compression processor 220, a digital video compressor 230 and an output signal formatter 250 which are described herein in detail with refeence to FIGS. 3–47. As an overview, processor 220 provides conversion of video signal S2 to a non-standard format that provides a variable amount of data reduction, facilitates subsequent compression and contributes to certain features of the system relating to variable frame-rate processing for controlling spatial-temporal resolution. Some images are converted at one frame rate for subsequent display at an entirely different rate.

Compressor 230 employs, broadly speaking, four types of processing for reducing the quantity of digital data to encode a frame to a specific "optimum" value. This value is related to the CD-ROM channel capacity but varies as a function of several variables including the frame rate, the desired spatial-temporal resolution, and other factors relating to error propagation and visual appearance. The processing "types" include intra-frame region-specific coding for still frames and for the first frame of a motion video sequence. Inter-frame region-specific coding is used for the second and subsequent frames of a motion video sequence. Encoded frames are subjected to further data reduction by two processes in compressor 230 which will be referred to herein as "area dependent adaptive quantization" and "segmented stream variable length coding". These processes are applied to each video frame to reach the desired "optimum" value noted above. Some sequences of frames may be repeatedly compressed with a change of compression thresholds to reach the optimum compression value.

From time to time, an "impossible" frame may be encountered which is hopelessly oversized and can not be reduced to the desired byte count by altering compression parameters without introducing noticeable visual artifacts. Such oversized frames receive special treatment in formatter 250 which combines the audio, video, auxiliary (e.g., interactive) and other data to create the recording bit-stream signal S4. Specifically, formatter 250 analyzes frames backwards from the last frame to the first and "borrows" space from short frames to hold the extra data of the oversized frames. Other functions provided by formatter 250 include adding "padding" data to undersized frames and dithering the number of bytes of data per frame to arrive at a specific average frame rate selected to keep the CD-ROM system operating at its maximum channel capacity and to avoid pauses during playback. Pauses are avoided because the recovery time (the "seek mode latency") of a CD-ROM player can be lengthy and unpredictable.

Details of video processing are discussed in the following five sections entitled "Video Pre-Compression-Processing", "Video Compression Processing", "Post-Compression Processing", "Playback System", and "Video Decoding".

Video Pre-Compression Processing

Pre-compression processor 220 is coupled to input terminal 204 (in FIG. 2) for converting the standard video signal S2 to a non-standard form specially adapted for the particular types of compression and formatting functions subsequently employed in encoder 16. Specifically, each frame of the video signal S2 is converted in the "pre-compression" processor 220 to form three separate component frames comprising one luminance sub-frame and a pair of color-difference signal sub-frames. Each of the color-difference sub-frames is sub-sampled by a predetermined amount with respect to the luminance sub-frame which, itself, may or may not be sub-sampled with respect to the original video frame. The original video signal may be analog or digital and may be of component form, composite form or of another suitable form such as multiplexed analog component (MAC) form.

FIGS. 3, 4 and 5 illustrate the pre-compression processing of one frame of video signal S2 for the case where signal S2 is assumed to be an NTSC standard composite video signal, one frame of which is shown in FIG. 3. FIG. 4 illustrates an intermediate stage of pre-compression processing in which the composite signal has been decoded to RGB component form, stripped of synchronizing and blanking intervals and digitized to form RGB picture element (pixel) arrays representing the "active" video portion of each RGB field. The array dimensions, as illustrated, are 512 pixels horizontally by 240 pixels vertically for each RGB component.

FIG. 5 illustrates the final stage of pre-compression processing in which the digital RGB arrays of FIG. 4 have been converted to form a single luminance signal sub-frame (Y) measuring 256×240 pixels and two color difference signal subframes (I and Q) each measuring 64×60 pixels. The three sub-frames are stored in a memory (to be described) for subsequent individualized "custom" compression. Comparing FIGS. 3, 4 and 5 it is seen that one frame of signal S2 (FIG. 3) which requires 737,280 bytes in digital RGB form (FIG. 4) is reduced to 69120 bytes after sub-sampling, conversion and formatting (FIG. 5) thus providing an effective data reduction for the frame of a factor of about 11:1 for the assumed rate of 30 FPS.

An operator control unit 222 is provided in FIG. 2 for varying the sizes of the sub-frames of FIG. 5 as a function of the frame rate to facilitate varying the temporal and spatial resolution of encoded frames. This feature of the system relates to subsequent compression of the signals in the following way. The CD-ROM recording system can support a bit rate of about 1.2 mega-bits per second as previously noted. For 30 FPS (frame per second) video this channel capacity corresponds to a video byte count (8-bits/byte) of 5125.12 bytes per frame. Of this, typically about 4500 bytes per frame are available for video with the remainder being used for audio and other data. The video compressor (to be described) meets this requirement by compressing the formatted YIQ sub-frames by another factor of about 15:1 from 69120 to under 4500 bytes per frame for the assumed rate of 30 FPS. If the playback frame rate is halved then twice as much time (1/15th second) is available for decoding each frame and 9,000 bytes are available for encoding each frame. This increased decoding time and quantity of image data can be used in a variety of ways to provide improved image quality. One may for example, increase the number of pixels in the encoded frame or may more accurately encode the same number of pixels as at the higher frame rate (30 FPS).

Figure 14:
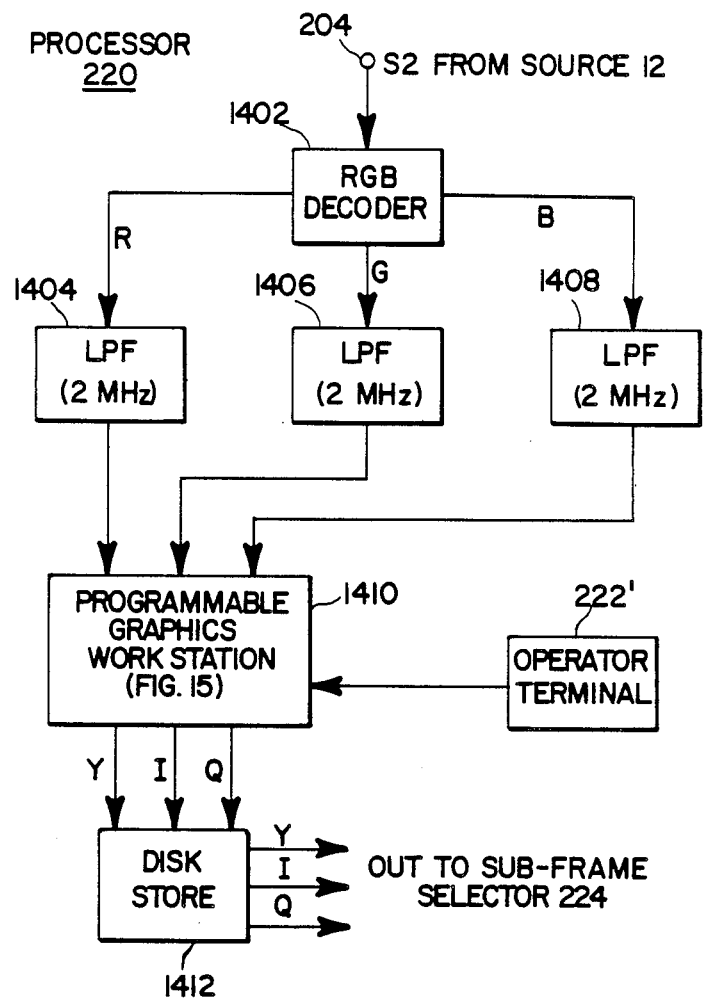
FIG. 14 is a block diagram of a pre-compression processor used in the encoder of FIG. 2.

FIG. 14 shows a specific implementation of pre-compression processor 220 for providing the variable sub-sampling and format conversion functions previously described. Processor 220 comprises an RGB decoder 1402 which converts the composite video signal to RGB component form. The RGB components are applied via anti-aliasing (2 MHz) low-pass filters (1404, 1406 and 1408) to inputs of a programmable graphics workstation 1410. A suitable workstation is the "Adage 3000 Color Raster Display System". Operator control unit 222 of FIG. 2 comprises a terminal unit 222' (in FIG. 14) which supplies a "skip list" of fields, lines and pixels to workstation 1410 as well as anti-alias filter coefficients and sample rate control data. Data reduced sub-frames of Y, I and Q samples are produced by the work station and stored in a disc store 1412.

Figure 15:
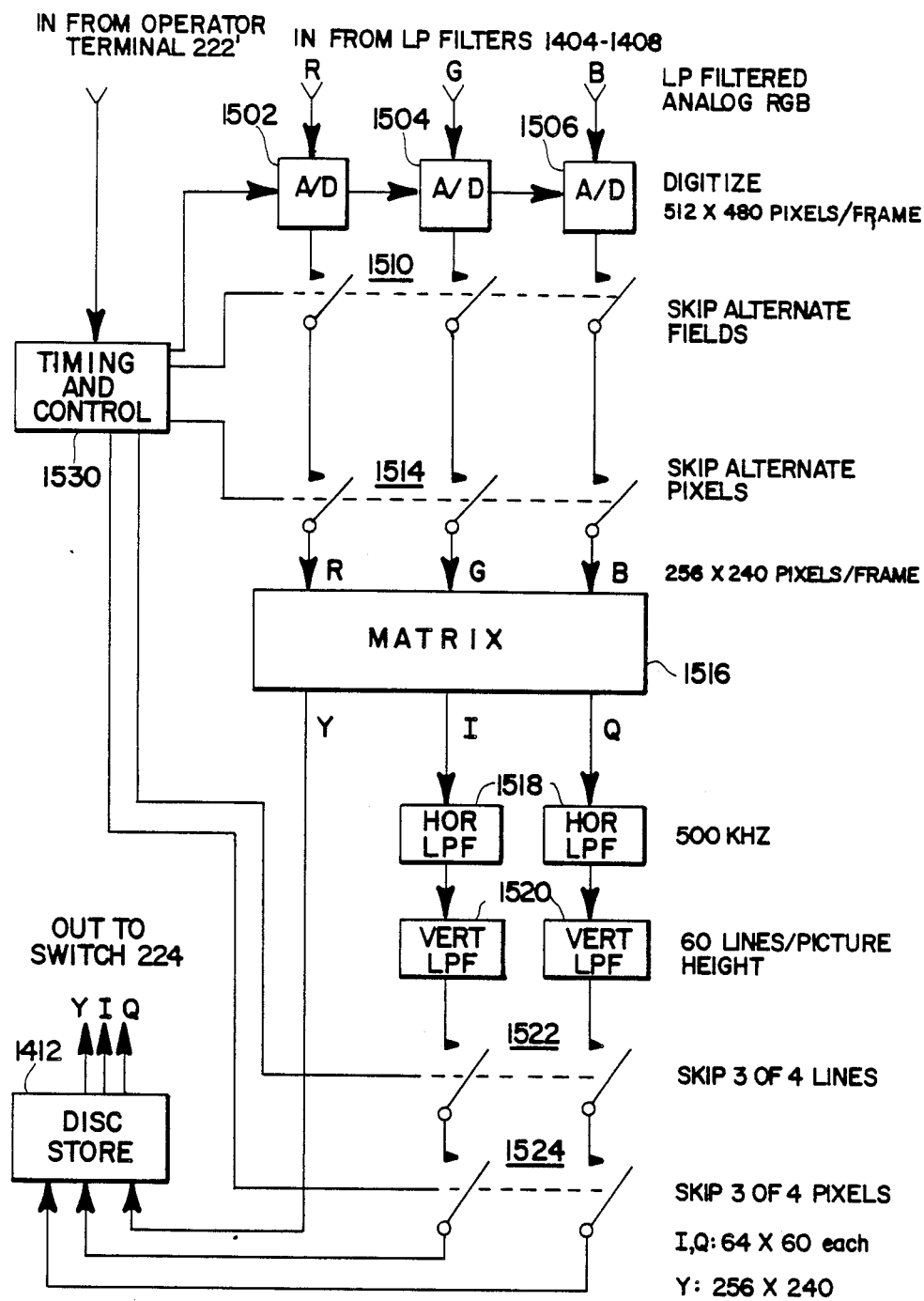
FIG. 15 is a block diagram illustrating details of a portion of the processor of FIG. 14.

FIG. 15 is a block diagram illustrating the specific programmed configuration of workstation 1410 for use in processing video signal S2 to create the non-standard sub-frame signal format of FIG. 5. The anti-alias filtered analog RGB signals provided by filters 1404-1408 are applied to respective analog-to-digital converters 1502-1506 which digitize the signals at a rate selected to provide 512 pixels per active line interval as controlled by terminal 222' coupled to the workstation timing and control unit 1530. The digitized RGB signals (FIG. 4) are sub-sample by two banks of switches 1510 and 1514. Switches 1510 are timed by unit 1530 to skip alternate fields of the RGB signals. Switches 1514 skip alternate pixels, so that the resultant digitized and sub-sampled RGB signals each comprise arrays of 256×240 pixels per frame.

A matrix 1516 converts the sub-sampled RGB signals to YIQ form. The I and Q color difference signals are each sub-sampled 4:1 both vertically and horizontally with respect to the luminance signal Y. This is provided by horizontal anti-alias low-pass filters 1518 (500 KHz), vertical anti-alias low-pass filters 1520 (60 lines/picture height), switches 1522 which skip 3 of 4 lines and switches 1524 which skip 3 of 4 pixels. The formatted Y, I and Q sub-frame signals (FIG. 5) are then stored in respective sub-frame locations in the disc store (e.g., a hard disc drive) 1412 for subsequent recovery and compression.

As previously explained, the filtering and sub-sampling parameters are variables which depend on the frame rate. For the specific examples of FIGS. 14 and 15 the frame rate is assumed to be 30 FPS. At different frame rates the operator inputs appropriate anti-alias filter coefficients, skip lists and conversion frequencies to timing and control unit 1530 via terminal 222'. At any frame rate or resolution, however, it is important that the original signal, of whatever form (analog or digital, component, composite or MAC), be converted as shown in FIG. 5 to a form comprising a luminance component Y and a pair of color-difference components that are filtered and sub-sampled both vertically and horizontally with respect to the luminance component. Color difference components I and Q are used as examples herein. Alternatively, the color components may be of other forms, such as R-Y and B-Y or U and V.

Pre-compression processor 220 of FIG. 14 may be modified for processing a video input signal of MAC format by replacing RGB decoder 1408 with a MAC decoder providing YUV line sequential to YUV line parallel outputs, deleting the RGB/YIQ matrix in FIG. 15 and changing the sub-sampling parameters as needed to arrive at the individual (separated) sub-frames of luminance and color-difference components of FIG. 5. It will be appreciated that other variations are possible. For example, the source may be decoded to YIQ or YUV component form prior to filtering. Sampling may be done on either RGB or YIQ.

Video Compression Processing

After pre-compression processing the Y, I and Q video sub-frames are recovered one at a time from disc store 1412 for independent compression. The sequential recovery of sub-frames is indicated symbolically in FIG. 2 by sub-frame selector switch 224. In the position shown, switch 224 applies all Y sub-frames of a motion video sequence to compressor 230 which compresses and stores the complete sub-frames in a buffer store 232. Switch 224 is then advanced and the compression process is repeated for all of the I sub-frames of the sequence. Finally, compression is applied to all of the Q sub-frames of the sequence thereby completing an initial stage of compression of a sequence of color frames. Alternatively, switch 224 may be advanced to select the Y, I and Q subframes of one complete frame of the sequence for compression before advancing to the next frame of a sequence.

The compressed signal S9, as shown in FIG. 7, includes the three individually compressed sub-frames, each of which consists of a bitstream hader (H) followed by the compressed data for the sub-frame (Y, I, or Q). The header identifies which sub-frame the data corresponds to, the size (number of pixels horizontally and vertically) of the sub-frame, a checksum for diagnostic purposes, and various tables used by the decoder. Further details of the format of signal S9 are discussed later with reference to FIGS. 46 and 47. The compressed data of FIG. 7 will hereafter be referred to as a video data "stream".

The feature of compressor 230 of individually compressing the YIQ sub-frames to form the compressed digital video "stream" S9 greatly enhances the compression efficiency. One reason is that even though the sub-frames represent the same image, they can differ from one-another dramatically because they represent different color measures of the image. Some images, for example, may contain no flesh tones. Others may contain no blue-green tones. Others may contain no color at all. A further reason for individual sub-frame compression relates to the statistical distribution of codes representing the image. Variable length coding is employed as one compression step. Variable length codes are selected in accordance with the frequency distribution or statistics of data to be coded. Since the statistics of Y, I and Q encoded sub-frames differ, individual variable length codes are employed that are optimized for each sub-frame. There are, in fact a number of separate statistical codes for each sub-frame as will be discussed.

After compression, the compressed video streams (S10) are recovered from buffer store 232 and applied to a byte count monitor 234 and to a decode time monitor 236 which identify, respectively, the number of data bytes and the decoding time for each individual frame of a video sequence. Since audio and auxiliary data will be added to each frame, the average byte count should be less than the total number of bytes allowed per frame in the bit stream S4. For encoding a video signal for playback at 30 FPS from a CD-ROM, the average number of bytes available per frame is 5125.12. This is determined by dividing the CD-ROM channel capacity by the video frame rate. Monitor 234 provides an accumulated average byte count over a sequence of video frames (alternatively monitor 234 may be arranged to count bytes on a frame-by-frame basis). This count is used for setting compression thresholds in a compression threshold control unit 238 to maintain the average byte count of signal S10 below 4500 bytes per frame. This allows room in the frame for audio and other data that is later added. Dashed lines are used to signify this closed loop procedure which is presently performed manually in a current implementation of encoder 16.

As previously noted, oversized video frames that can not be reduced to 4500 bytes are accounted for during reformatting by borrowing space from an earlier frame. The mechanics of this are discussed later, in the section on video post compression. Decode time monitor 236 measures the time it takes to decompress each sub-frame of the compressed digital video signal S10. This measurement may be accomplished by applying the signal S10 to a decoder such as processor 30 of the playback system 8 and measuring the processor decode time. For an exemplary playback rate of 30 FPS, the decode tim of a frame should be no more than 1/30th of a second. When this monitor detects a larger decode time, thresholds in the threshold control 238 are adjusted to reduce the decode time of the "oversized" frame.

Alternatively, threshold 238 can be adjusted to merely keep the running average of the decode time below 1/30th of a second. With such a strategy, there is no need to repeat a compression, even if it exceeds the allowed decode time. In other words, the average can still be acceptable even if individual frames are not. As will be described subsequently, the playback system can cope with such temporary excesses in the decode time, without any effect on the playback rate, by using a technique of borrowing decode time from "short" frames (i.e., those frames that require less than 1/30th of a second to decode). This alternative technique of coding "oversized" frames applies where the average decode time is less than 1/30th of a second, and the playback system has adequate buffer storage. The amount of buffer storage needed by the playback system is monitored within the formatter 250 (FIG. 2), and if it is excessive, the threshold control is adjusted to reduce the decode time further. This alternative strategy for using the decode time monitor is desirable, because it permits a more accurate encoding of those frames that need a long decode time.

The decode time monitor may alternatively comprise an estimator, based on the known decoding time characteristics of the video processor 30. A careful examination of the decode process will reveal that it consists of a fixed number of well defined operations (say "A", "B", etc.) each of which requires a maximum length of time to complete. The encoder has available to it the precise bit stream that will be processed by the decoder. Hence the encoder can determine precisely how many times each of these operations will be performed for each sub-frame. The decode time estimate, T, is simply the sum of products:

$$T = \sum_{i=1}^{N} A_i K_i \qquad (1)$$

In the summation, each term "$A_i$" represents the total number of times a particular decoding action is performed. The term $K_i$ represents the maximum decoding time of the action. Examples of such actions include relative, absolute, DPCM and dyad decoding. Moreover, each decoding action may comprise several actions depending on where the pixel is in the region being decoded. To facilitate the use of such an estimator, the digital video compressor 230 stores the $A_i$ counts associated with each sub-frame in the buffer-store 232. They are retrieved by means of a connection (not shown) from monitors 234 and 236 to store 232. As an example of the use of equation 1 for estimating decoding time, the products that may be summed are (1) the number of regions described by respective fill data codes times respective first constants, (2) the number of pixels included in each type of region times respective second constants and (3) the number of rows of pixels included in respective types of regions times respective third constants. A constant term may be added to the sum of products to account for decoding steps common to all regions to be decoded.

Figure 16:
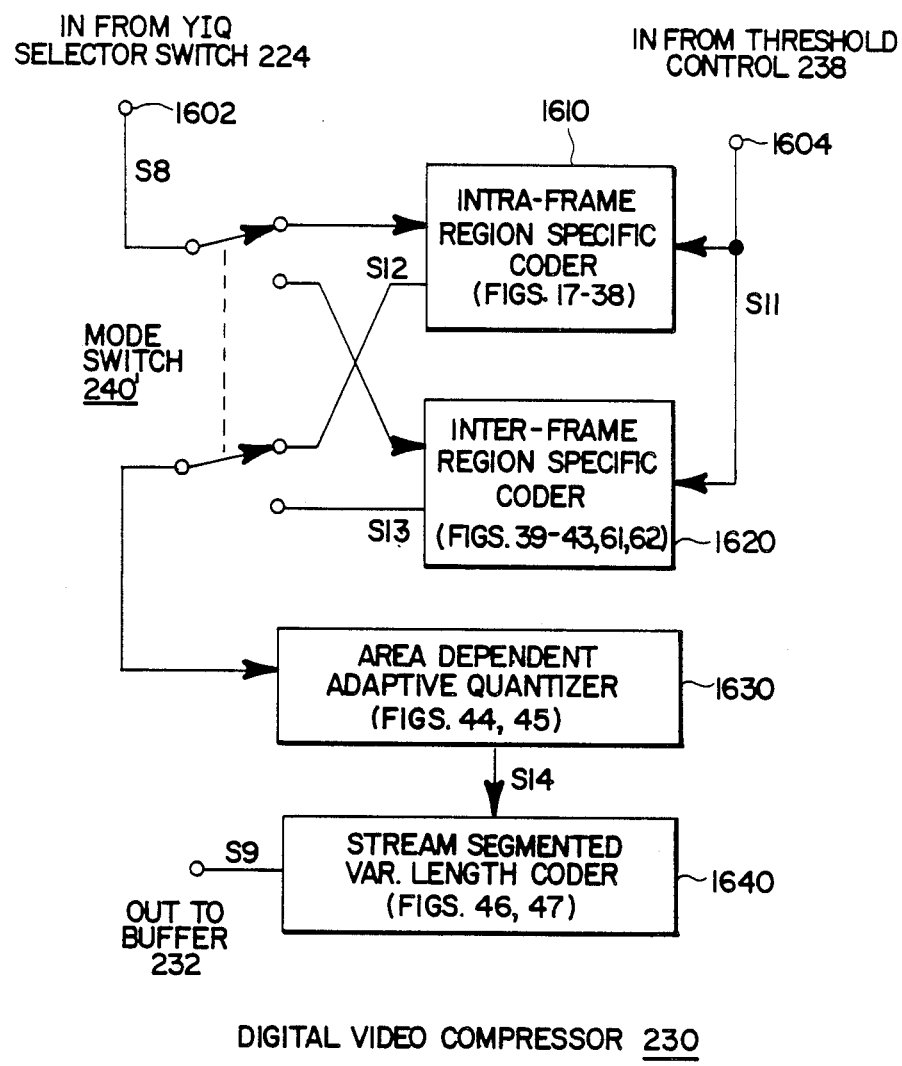
FIG. 16 is a block diagram of a digital video compressor used in the encoder of FIG. 2 providing intra-frame and inter-frame region-specific coding, quantization by region area and frame-segmented variable length coding.

FIG. 16 is a simplified block diagram of digital video compressor 230 which includes an input terminal 1602 for receiving the YIQ selected sub-frame signal S8 from switch 224 and another input 1604 for receiving the threshold control signal S11 from control 238. Mode switch 240 of FIG. 2 is indicated symbolically as switch 240' in FIG. 16. In the position shown (UP), mode switch 240' applies the video sub-frame signal S8 to an intra-frame region-specific coder 1610 which produces a region-specific coded signal S12 that is applied via mode switch 240' to an area dependent adaptive quantizer 1630. The quantized region coded signal S14 is applied to a stream-segmented variable length coder 1640 as the final compression step in producing the compressed signal S9 for storage in buffer 232 (FIG. 2). Reversing the position of switch 240' applies the video input signal S8 to an inter-frame region-specific coder 1620 and selects the inter-frame coded signal S13 for quantization. Both encoders 1610 and 1620 are coupled to receive the threshold control signal S11.

In operation, mode switch 240' is placed in the UP position for encoding still frames and the first frame of a motion video sequence using intra-frame coder 1610. Briefly stated, coder 1610 splits the frame into a number of small groups of similar pixels referred to herein as "regions". For each region a code is produced for representing the values of all pixels of the region. This technique provides very substantial data reduction (compression) because very few bytes of code are needed to specify where a region is, how big it is and what "fill" values are to be used to represent the region pixels. Further, the specific coding method used for each region is optimally chosen based on detailed characteristics of each region. This technique (herein, "region-specific" coding) of tailoring the encoding strategy, not just to individual images, but actually to individual regions within an image, greatly increases the amount of compression possible. Details of (1) how to find the regions, (2) how to code or "fill" the region (3) how to identify "good" and "bad" fill values and (4) what to do about "bad" fills are shown and described with reference to FIGS. 17–38.

Switch 240' is placed in the down position for encoding the second frame and all subsequent frames of a motion video sequence using inter-frame coder 1620. This different coding mode is used because once the first frame is encoded by coder 1610, the second and later frames can be coded on a "relative" basis using differences of the regions from frame-to-frame. One advantage of this "relative" coding of region differences is that smaller numbers are produced and smaller numbers can be represented using fewer bits by means of variable length coding in which shorter codes are assigned to smaller numbers. Details of (1) how to find the best direction to look for corresponding regions in a previous frame, (2) how to encode the region if found and (3) what to do if a corresponding region does not exist are discussed with reference to FIGS. 39–43 and 61, 62.

The region-specific coded signals S12 and S13 are subjected to what is termed herein as "area dependent" adpative quantization in quantizer 1630 which provides further data reduction. Recall that frames are coded as regions of pixels. The size of each region varies with details of the overall image. For example, in areas of high detail there will be many small regions of a few pixels each. Conversely, in areas of low detail there will be a smaller number of regions but these regions will contain tens or even hundreds of pixels each. Quantizer 1630 achieves data reduction by variably quantizing region data as a function of the region area (i.e., the number of pixels in the region) such that smaller regions are more coarsely quantized (and thus require fewer bits) than larger regions. This process, and the psycho-visual effect that makes the quantization essentially invisible, will be discussed with reference to FIGS. 44 and 45.

The quantized region-specific coded signal S14 receives additional data reduction (compression) in variable length coder 1640. Briefly, the data describing an image is rather complex. It includes data describing how the regions were split and filled, how regions were shifted, parameters describing the fill values in terms of bi-linear polynomial coefficients and further data in DPCM and dyad coded form. The point is that each video stream includes many types of data. These different types of data are formatted to occur in separate "segments" of each video stream. Coder 1640 determines the statistical occurrence of data for each individual segment of a video stream and assigns the shortest code to the most frequently occurring data within each segment. This is done independently for each one of the Y, I and Q sub-frames comprising a stream. In a preferred application, the different forms of region-specific codes are biased, so to speak, towards zero so that small numbers have a higher frequency of occurrence than larger numbers and thus are assigned shorter variable length codes by coder 1640. Details of the foregoing "stream segmented" variable length coding are described with reference to FIGS. 46 and 47.

Compressor 230 of FIG. 16 has been implemented by programming a digital computer as described with reference to FIGS. 17–47. For the computer, a model VAX 11/785 manufactured by Digital Equipment Corporation was selected. Compression speeds of a few minutes per frame have been achieved for typical motion video sequences. The principal goal of compressor 230 is not speed but rather is high quality for the images that are ultimately displayed. This goal is achieved in large part through the use of what is herein termed "region-specific" coding as will now be described.

Region specific coding comprises two actions, namely, (1) dividing the image into seeral regions ("regionalization"), and (2) selecting "optimal" fill parameters for each region. These two actions are performed concurrently, as will be described with reference to FIG. 17.

FIGS. 27-31 provide an overview of the regionalization process called binary tree decomposition. In this simplified example, the region 2702 consists of four subregions (2704, 2706, 2708, 2710) in which the pixels are assumed to have uniform gray levels (e.g., 141, 112, 90 and 98 out of a possible range of 256 gray levels). The pixel value distribution of this sub-frame is atypical, and is only intended to illustrate how binary tree regionalization is applied, and how the resulting decomposition can be efficiently encoded. In the more general case, the "fill" (i.e., the code representing the region pixel values) is described by the linear expression $Ax+By+C$, where the coefficient "A" represents the slope or brightness gradient in the horizontal (X) direction, "B" represents the gradient in the vertical (Y) direction and "C" represents a constant or uniform level of brightness over the region. In the example of FIG. 27, the terms A and B of the fill polynomial $Ax+By+C$ are both zero.

Binary tree decomposition is performed by splitting a region in half, and then possibly splitting each of the resulting sub-regions in half, until the resulting sub-regions can be efficiently encoded. Later, in the discussion of FIG. 17, a number of strategies are described for deciding when a sub-region should be split, and in which direction it should be split, horizontal or vertical. For FIG. 27, these decisions are easy. The first split, labeled split 1 in FIG. 27 splits the region horizontally into two equal halves. The top half 2704 can be efficiently encoded by the single value 141, while the bottom half needs further decomposition. A further vertical split, split 2 divides the remaining area in half. The right half (2706) can be efficiently encoded by the value 112 and hence is not split any further. The left half, however, requires a further horizontal split, into two subregions 2708 and 2710 which can be efficiently encoded by the values 90 and 98.

Figure 26:
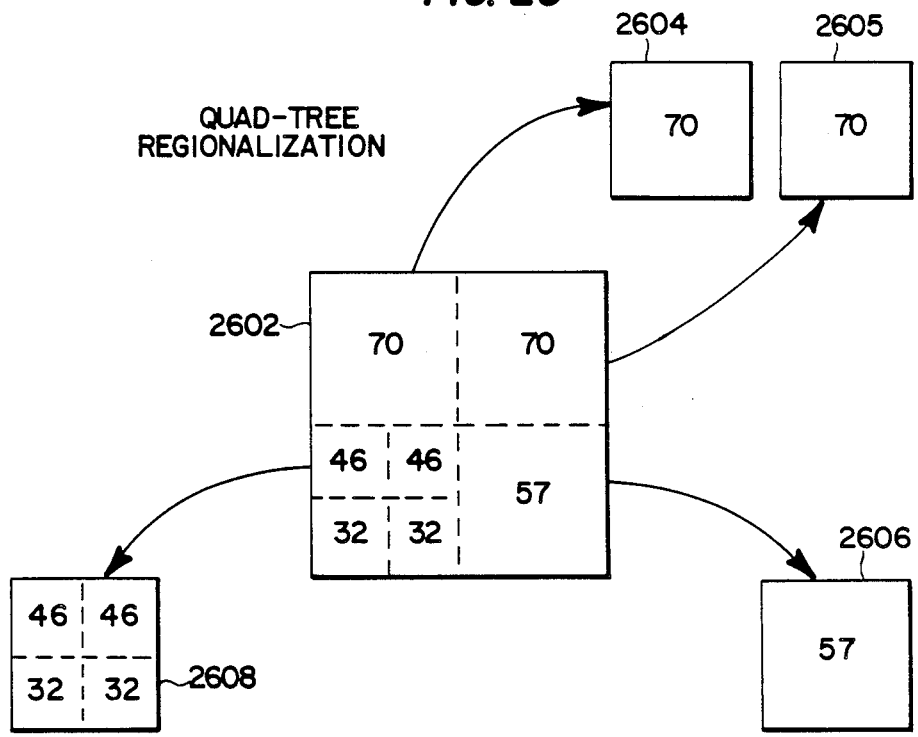
FIG. 26 is a diagram illustrating quad-tree regionalization.

Other regionalization strategies are possible. For example in quad-tree decomposition, instead of picking a single split direction, both split directions are used together. This leads to a regionalization as shown in FIG. 26 where region 2602 is split to form four more regions 2604-2608 one of which (2608) is further split to form four reigons. Binary tree regionalization is the preferred mode because it has been found to normally result in fewer regions and hence fewer bits and less decode time.

FIGS. 28 and 30 illustrate the encoding of the absolute fill values and region locations of the example of FIG. 27. The term "absolute" as used herein signifies fill values obtained solely from the region data of the region being coded. The term "relative" as used herein signifies region fill values based upon frame-to-frame region differences. The inverted tree-like structure of the coding diagram 2802 in FIG. 28 represents successive divisions of region 2702 and is called a "binary tree" because each branch is split to form two branches. The top node of the tree represents the whole image. Each time a region is split, two new node values are formed. Terminal nodes of the tree are encoded with the region fill values.

The code (FIG. 30) to describe the complete tree consists, therefore, of two types of data: "values," which are the fill values, and "actions", which are the split or fill commands. The "actions" and "values" are encoded using the same code "space". That is, they each comprise variable-length-encoded non-negative numbers. It is always possible, however, to distinguish between an action and a value based on context, that is, the position of the action or value in the code sequence. For instance, in the example of FIG. 28, when a "fill" action is encountered, the next number must be a value. The next item after this value must be another action, etc.

In more detail, the tree description data is ordered using the following rule. For each node that is split, all the data pertaining to the "top" node (if a horizontal split) or the "left" node (if a vertical split) is listed, followed by all the data for the other node. This is an inherently recursive procedure that begins with the root node of the tree and operates successively on nodes of the tree until all terminal nodes of the tree are reached. For the example tree in FIG. 28 this yields the tree code shown in FIG. 30. This short code, together with the dimensions of the original image, gives all the information one needs to specify the size and location of every region and the value of every pixel in the image 2702. The "H" and "V" symbols signify horizontal and vertical splits. The "F" symbol signifies a fill action.

FIG. 29 illustrates an alternative and preferred format for encoding the binary tree data for the regions of FIG. 27. It differs from the method of FIG. 28 in that the fill data is encoded as node differences rather than as the actual values of the end nodes. This requires calculation in the decoder to recover the actual fill values but has an advantage in that the encoded values are numerically smaller. Compare, for example, the values 141, 90, 98, 112 of FIG. 30 with the values $-7$, $-37$, $-18$, and 8 of FIG. 31. Since the values are encoded using a variable-length code, this produces greater coding efficiency, since this weights the statistics of the values more heavily towards small numbers.

The coding procedure which results in the binary tree illustrated in FIG. 29 is performed as follows. First, the encoding process which develops the binary tree of FIG. 28 is performed. Next, pairs of fill values at terminal nodes from the same branch point are differenced and averaged. The difference value is assigned to the branch point and is the value which will subsequently be encoded in the tree description. The average value is also assigned to the branch point, but only for the purpose of determining other nodal or branch values working backwards up the tree. That is, the average values are averaged and differenced with absolute or average values from a corresponding node on a parallel branch. The difference value is assigned to the branch point as the value to be encoded, and the new average value is used to determine the next difference and average value working hierarchically up the tree. Differences are determined by subtracting the left nodal or branch value from the right nodal or branch value.

In the example illustrated the terminal nodal value 90 is subtracted from the terminal value 98 to produce the difference value $+8$ which is assigned to the branch point designated "split 3". The average of the nodal values $(90+98)/2=94$ is also applied to the branch point and shown in angle brackets. The average value 94 at the branch point "split 3" is differenced and averaged with the terminal nodal value 112 to generate the difference +18 and average 103 which are assigned to the branch point designated "split 2". This process is carried out all the way up the tree until the firstmost branch point is reached.

A further encoding efficiency is accomplished at the top node of the tree by referencing the top node to the value 128. That is, the value 128 is subtracted from the average value established for the top node. In this example, the average value for the top node or branch is 122. Subtracting 128 from 122 yields a value of −6. This value is assigned the first position in the encoded tree description.

The tree description is illustrated in line "A" FIG. 31 and includes in order of occurrence the value −7 followed by the direction "H" of the first split, followed by the difference value assigned the first branch, followed by the instruction to fill the left branch, followed by the direction "V" of the next split, followed by the difference value assigned that branch point etc. This code contains the same number of instructions as FIG. 30 but has smaller numerical values.

For decoding, the average value of the first two nodes (141 and branch point "split 2") is calculated by adding −6 to +128 to yield 121 which equals (R+L)/2 where R and L are the right and left node or average values respectively. The difference value, −37, transmitted in the code is equal to (R−L) i.e., R−L=38. But (R+L)/2=121. Solving these equations simultaneously yields the left nodal value, L, equal to 141 and the right branch average value R equal to 103. This process is continued down the tree. Occasionally, the averaging process described above may require dividing an odd number by 2. This may be dealt with by having the encoder and decoder agree on the same truncation or rounding strategy.

The foregoing binary tree encoding methods require encoding negative numbers. This is accomplished in the following way: A positive (or zero) number P is encoded by the positive number 2P, and a negative number −N is encoded by the positive number 2N −1. Positive and negative numbers are differentiated because all positive values (2P) are even and all negative values 2N −1 are odd. This technique avoids placing a sign bit in the most significant bit position of fixed bit-width codewords and therefore eliminates extra bits between the sign bit and value bits for small values. When using this coding scheme, the tree code assumes the values in line "B" of code in FIG. 31.

As a further efficiency measure, it has been found useful to encode the "actions" and the "values" using different variable-length codes. Since there are only a few different actions, and many more possible values, their statistics are significantly different. Thus, using separate variable-length codes produces some additional code savings.

The above description applies specifically to images containing absolute fills by constants. In actuality, there are four types of fills currently used, namely: absolute, relative, DPCM, and dyad. Each of these has its own separate action code. The node values discussed above only apply to absolute fills. The fill values for the other three types of fills are encoded separately in different code "segments" that are later combined with the split/fill segment to form the overall video bit-stream. The use of many code segments is described in a subsequent discussion of "segmented stream variable length coding" and FIGS. 46 and 47.

Figure 34A:
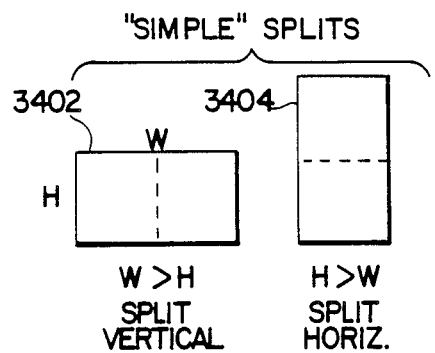
FIGS. 34A and 34B are diagrams illustrating two forms of region splitting in the compressor of FIG. 16.
Figure 34B:
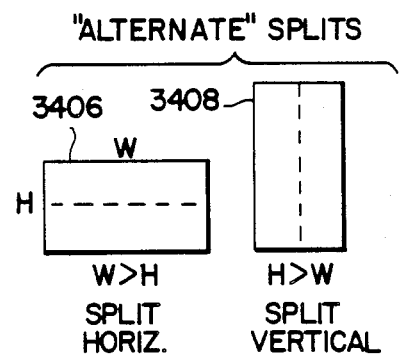

Vertical splits, V, and horizontal splits H, have approximately equal probabilities of occurence. An alternative way of encoding this information has been found that uses fewer bits on average. It has been found that most splits tend to split the longer dimension (e.g., regions 3402 and 3404 in FIG. 34A). Such a split is called a simple split and is encoded as S. If the dimensions of a region are equal and it is to be split horizontally, it is added as a simple split, S. This encoding is not ambiguous to the decoder because the region dimensions are available and if they are equal, the split code S is interpreted as a horizontal split. Any split which is no a "simple" split is called an alternate split and is encoded as A (e.g., regions 3406 and 3408 as shown in FIG. 34B). Because of the greater probability of occurrence of simple splits the variable length encoder is able to use fewer bits on average by assigning a shorter code to represent simple splits. With this encoding strategy, the tree of FIG. 29 would be encoded via line "C" of FIG. 31. While this approach does decrease the code size, it has the disadvantage that the decoding time is increased by the need to deduce vertical and horizontal split actions (V and H) from the simple and alternative split codes (S and A).

For images containing relative or dyad coded regions (described later), the region shift values ($X_o$, $Y_o$) are also encoded in the split/fill tree description, using another action (called "shift") followed by the two shift values. As will be explained, a "shift" value is a measure of the horizontal ($X_o$) and vertical ($Y_o$) offset between a region of a given frame and a corresponding region of a previous frame. The shift is a measure of frame-to-frame motion of a region. These values are encoded in the tree description, rather than separately, for further efficiency of coding. Since many regions tend to have the same $X_o$, $Y_o$ values, the "shift" action is defined to mean "apply these $X_o$, $Y_o$ values to this node and all child nodes of this node". Advantageously, this permits the shift values for regions having the same shift to only be encoded once.

Figure 17:
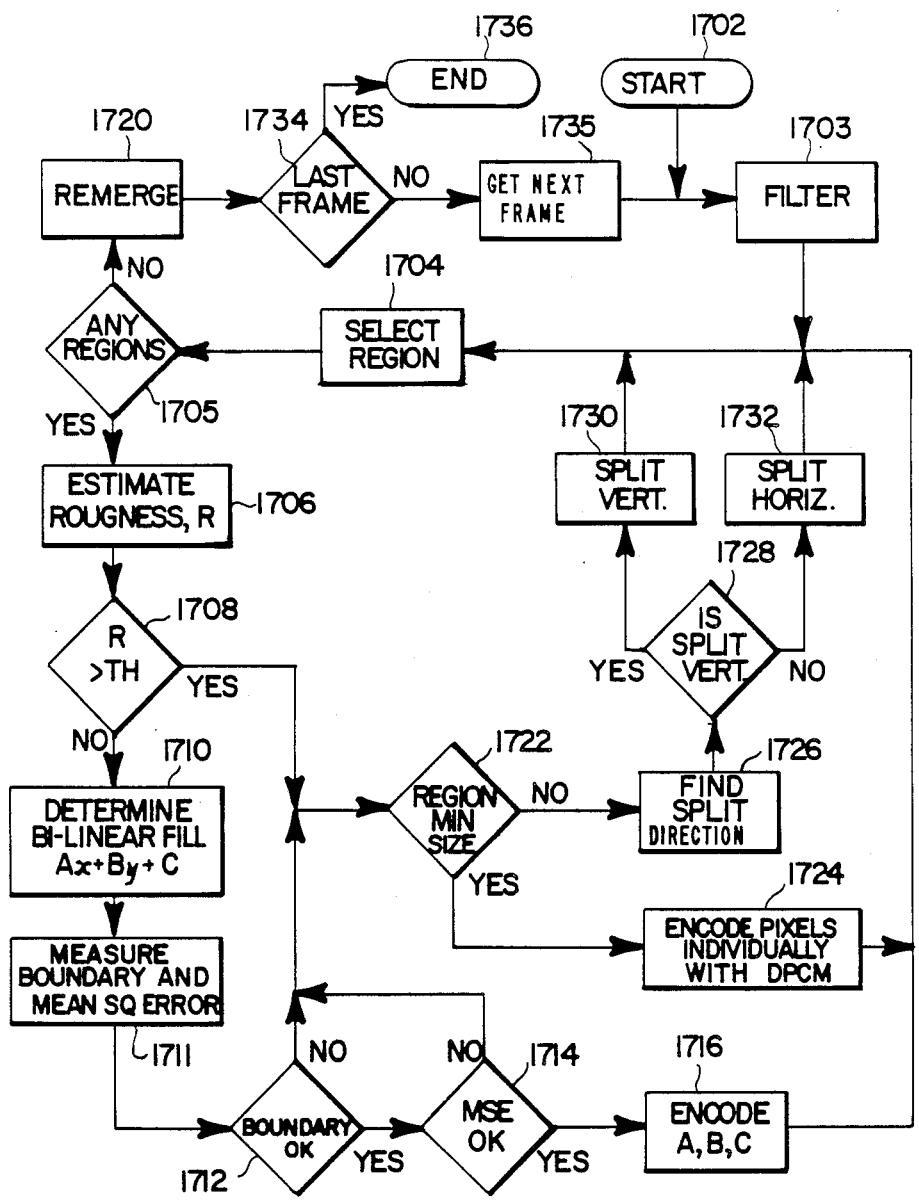
FIG. 17 is a flow chart illustrating operation of an intra-frame coder used in the compressor of FIG. 16 for compressing still video frames and the first frame of a motion video sequence.

FIG. 17 and FIGS. 18–38 related thereto provide the details of intra-frame coder 1610 that encodes all "still" frames and the first frame of a motion video sequence. FIG. 17 is a flow chart illustrating each step in the encoding process provided by coder 1610. This "software" implementation of coder 1610 is presently preferred. However, it will be appreciated that the individual processing functions may readily be implemented by individual elements of apparatus providing the functions shown in the flow chart. Specific examples of such "hardware" implementations are included in FIGS. 18–38.

The first step for intra-frame coding (FIG. 17) comprises the START step (1702) and is initiated by placing mode switch 240' in the UP position (FIG. 16) for still frames or the first frame of a motion sequence. Simultaneously, switch 224 (FIG. 2) is placed to select the Y sub-frame. All of the Y sub-frames will be compressed before advancing switch 224 to select the I and finally the Q sub-frames.

As a brief overview, FIG. 17 has four main actions. Prefiltering occurs in step 1703. Sub-region stacking and selection is provided by steps 1730, 1732, and 1704. This is the process (to be described) by which the same strategy can be applied to every sub-region regardless of its size. Linear fill encoding, provided by steps 1706 to 1716, determines whether a region is suitable for encoding as a plane surface (Ax+By+C), and if so, what the details of the encoding should be. DPCM encoding, provided by 1722 and 1724, are used for regions that are not suitable for linear fill encoding. Step 1720 performs post-processing on the resulting encoding to further reduce code size and decode time. Processing provided by steps 1734 and 1736 check for the end of the sequence of still frames or the end of the first frame of a motion sequence.

The first action in FIG. 17 is to apply filter 1703 to the "image" of video signal S8. Filtering removes extraneous detail which improves the speed of the compression process, it decreases code size, and decreases the decode time because larger regions tend to be produced. Since simple low pass filters also tend to blur the image, nonlinear filters are preferred that remove low amplitude noise but preserve high amplitude information. There are many kinds of filters that can be used for this purpose, a preferred form being a cascade connection of a weighted median filter and a modified linear low pass filter. The modification is described subsequently in reference to FIG. 36.

FIGS. 35A-E illustrate the weighted median filter. FIG. 35A illustrates a pixel 3502 to be filtered and its eight nearest neighbors. FIG. 35B shows an array 3504 of weighting factors for filtering pixel 3502 to produce the weighted value (12) for this one pixel 3506 indicated in FIG. 35C. The weighting method is shown in FIG. 35D. First, the values of pixel 3502 and of its eight neighbors are listed in ascending order (3503). The un-weighted median is seem to have the value of "11" units. One half of the values are higher and one half are lower. The weighting values (3504) from FIG. 35B are listed beneath the ordered values 3503. They determine the number of times each value is repeated to form an ordered list 3508. In the example, the four corner pixels (11, 9, 1, 17) have weights of unity and are listed once in list 3508. The center side pixels (12, 5, 10, 13) have weights of 2 and so are listed twice in list 3508. The central pixel (15) to be filtered has a weight of 5 and so is listed 5 times in list 3508. The weighted median value (12) is the value taken from list 3508 for which half the weighted values are less and half are greater. This value (12) is the filtered value of the central pixel of the region 3503 as shown (3506) in FIG. 35C. The remaining pixels are determined the same way by applying the weighting array 3504 to each pixel and its 8 near neighbors.

The weights of FIG. 35B were selected for purposes of illustration to keep list 3508 reasonably short. Exemplary weights for an average scene are listed in FIG. 35E which shows corner weighting of 2, mid-side weighting of 4 and center pixel weighting of 13. One may vary these weights to achieve controlled directional spatial detail redirection while preserving edge transitions. One may, for example, change diagonal contributions to the filtered value by changing the corner weights. Vertical and horizontal contributions are determined, respectively, by the values of the top and bottom or the left and right weights. Accordingly, the weighted median, in addition to preserving edges due to being a median filter, can exhibit selective directional characteristics due to the weighting factors.

Figure 36A:
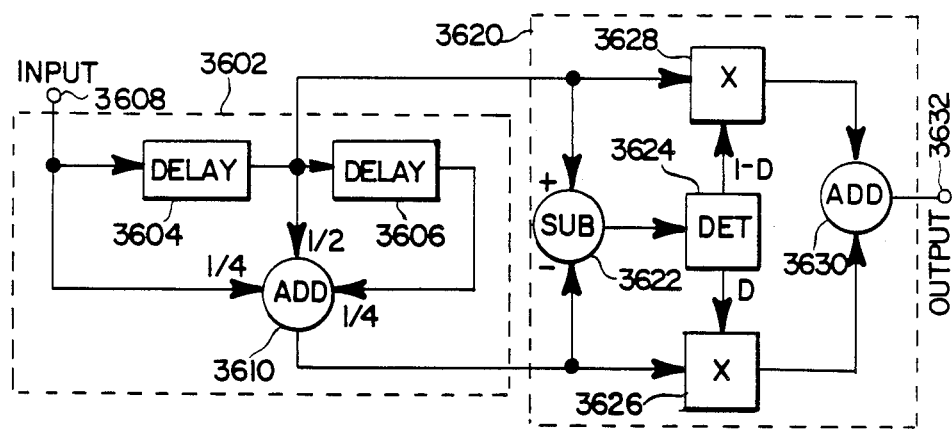
FIGS. 36A-36C are diagrams illustrating non-linear low-pass filtering for use in the encoder of FIG. 16.

FIG. 36A illustrates a modified low-pass filter suitable for use in the filtering step 1703 which removes unimportant detail while preserving edge transitions. The filter comprises the combination of a linear transversal filter 3602 and a modifier 3620 (both outlined in phantom). Briefly, the modifier detects edges and generates a "damping factor D" which is used to selectively mix the low pass filter input and output signals as a function of the edge amplitude to thereby suppress small changes while preserving larger signal transitions. Filter 3602 comprises a cascade connection of pixel delay elements 3604 and 3606 which delay an input signal at input terminal 3608 by one and two pixel periods. An adder 3610 produces a low pass filtered signal by forming a weighted sum of the input signal (weight=$\frac{1}{4}$), the pixel delayed signal (weight=$\frac{1}{2}$) and the two-pixel delayed signal (weight=$\frac{1}{4}$). Modifier 3620 includes a subtractor 3622 which detects transitions by subtracting the low pass filtered signal of adder 3610 from the unfiltered one-pixel delayed input signal provided by delay 3604. The output of subtractor 3622 is applied to a non-linear detector 3624 which produces complementary control signals D and 1−D for controlling multipliers 3626 and 3628, respectively, which multiply the filtered and un-filtered pixel delayed signals. An adder 3630 adds the multiplied signals to provide an output signal at terminal 3632. Detector 3624 may be a ROM programmed to output the values D and (1−D) responsive to the differences from subtracter 3622 applied as addresses.

Figure 36B:
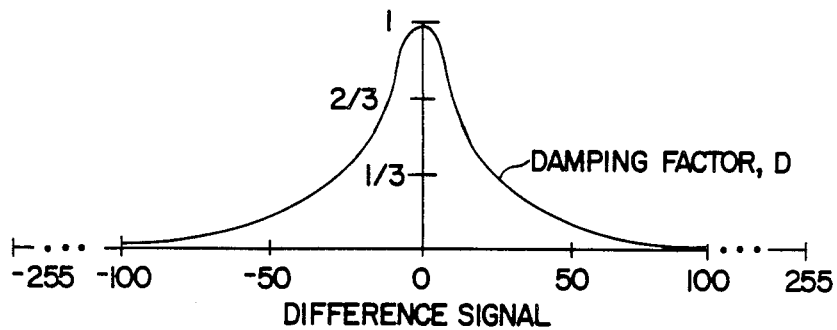
Figure 36C:
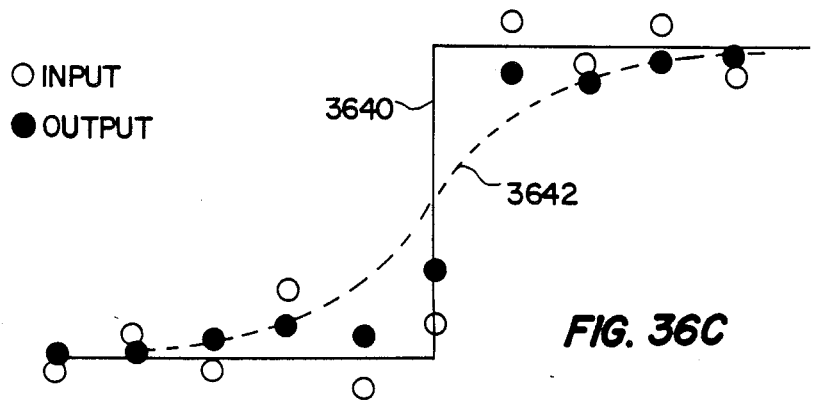

FIG. 36B illustrates the non-linear characteristic of detector 3624 for producing control signal D (hereafter, the damping factor) and 1−D as a function of the subtractor 3622 output (difference signal). For small differences characteristic of small detail features of an image the factor D is near unity. Accordingly, multiplier 3626 selects the filtered signal of adder 3610 as the output. For larger transitions the value of D decreases and so signal 1−D increases causing multiplier 3628 to select more of the unfiltered signal as the output. For very large transitions (D near zero) filter 3602 is essentially bypassed thereby faithfully preserving the full amplitude of large edges. This is further illustrated in FIG. 36C in which 3640 indicates the occurrence of a step transition for the input pixels represented by open circles. Dashed line 3642 illustrates the response of a conventional low pass filter which, as shown, tends to smooth both large and small pixel variations. The solid circles indicate the response of the modified filter of FIG. 36A. The damping factor D is low for pixels approaching and leaving the transition zone whereby small pixel variation (detail) are filtered. The damping factor is high in the transition zone thereby bypassing the filter and thus preserving the steep transition.

Returning now to FIG. 17, steps 1704, 1730 and 1732 select and list regions for subsequent analysis. This process has one of two possible effects. It may yield an encoding of the region via step 1716 or 1724, and hence removal of the region from further analysis. Or it may cause the current region to be split 1726, and both halves put on a list of regions for further examination. Each split reduces the size of the region. When the region gets small enough it encounters the test for a minimum size region, 1722. This test prevents unlimited splitting, and hence forces eventual encoding of every region.

Initially, the region selection step 1704 treats the entire image sub-frame as one single region. During this processing, it is likely that a split 1726-1732 will occur, resulting in two subregions that need to be processed. Boxes 1730 and 1732 "push" two regions onto a list of regions waiting to be removed by 1704. By "push" it is meant that the region identities (locations) are stored in the region list. The next time select region 1704 is used, the top region on the list is encoded as will be described. The order in which regions are processed is determined by the order in which they are placed on this list. For a horizontal split (1732) the bottom half region and the top half region are each added to the list and the top half is first to be encoded. For a vertical split 1730 the right half region and the left half region are added to the list with the left half region being first to be encoded. This orderly sequencing of how regions are examined is known to the video processor 30 (FIG. 1), and is used by it during decoding to interpret the sequence of codes used to represent each image.

Linear fill encoding is provided by steps 1704–1716 as will now be described. It will be recalled that region-specific coding gets its strength from the ability to choose optimal encoding strategies for each individual region. Linear fill encoding is tried first, since it can describe a large region with very few bits. If linear fill encoding is not possible, the region is split (1726) and linear fill encoding is again tried for each sub-region. As we shall see, the number of bits required to encode a region using linear fill techniques does not increase as the size of the region increases, so it is an excellent encoding strategy for large regions. Only when the resulting subregions fall below a minimum size (TEST 1722) is another encoding technique used.

A mean square error measure (MSE) is one method used to determine whether or not linear fill encoding is acceptable (1714). Since this measure is an average over the entire region, there may be localized portions of the regions where the deviation from a plane surface is quite large and visually apparent, yet the MSE may be acceptably low. To avoid this problem a roughness estimator 1706 is applied to the region before attempting linear fill coding (1710). If the region fails this test (1708) and is not of a minimum size (test 1722), it is split (1726–1732) and the same processing is applied to the resulting sub-regions so formed.

Figure 18:
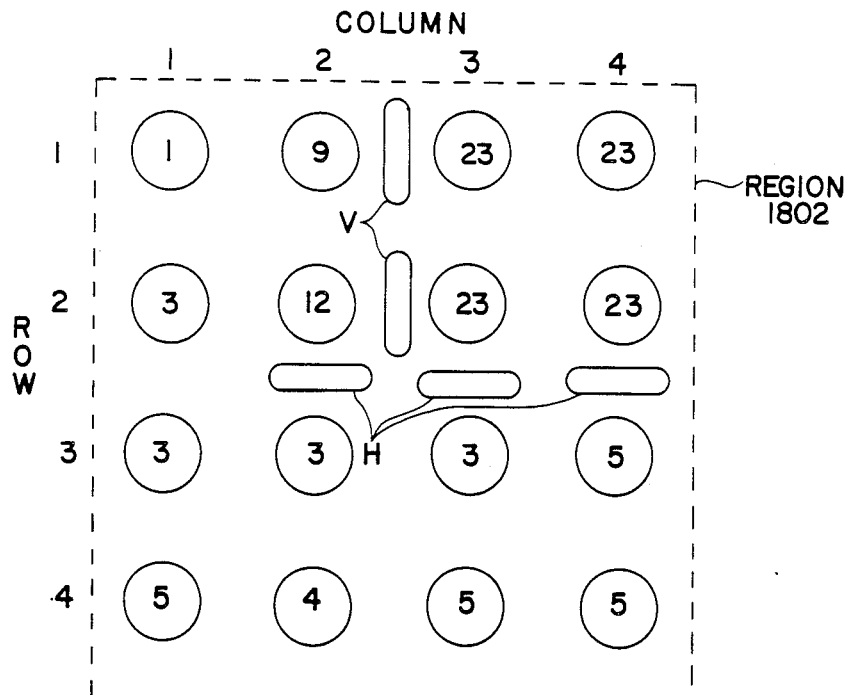
FIG. 18 is a region diagram illustrating image edge analysis used in the compressor of FIG. 16.
Figure 19:
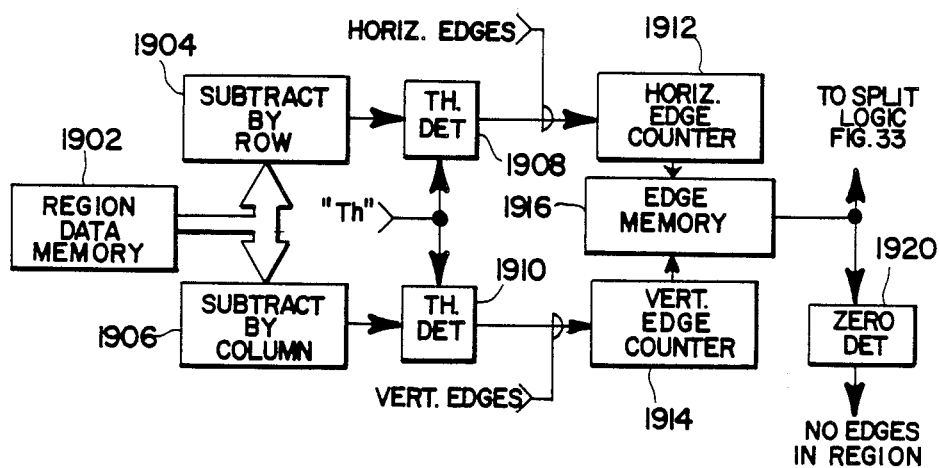
FIG. 19 is a block diagram of a roughness estimator providing split/fill decisions for use in the compressor of FIG. 16.

Roughness of a region in this example is determined by detecting edges in the region. FIG. 18 illustrates a simple definition of edges, based on large changes in gray level between adjacent pixels. FIG. 19 is a block diagram of apparatus providing edge detection.

In FIG. 18 a region 1802 is shown comprising four rows and four columns of pixels. Luminance (Y) signal values are indicated for the 16 pixels. By definition, an edge exists between adjacent pixels whose values differ by more than a threshold value (input via threshold control 238). A typical threshold value may be 25 units for a Y signal quantized to 8-bits (i.e., a 256 level scale from black to peak white). Using a level of 10 brightness units as an exemplary edge threshold, it is seen that there are two vertical edges (V) and three horizontal edges (H) in FIG. 18.

If region 1802 were "split" (i.e., divided) horizontally between rows 2 and 3, the result would be two regions neither of which contains a horizontal edge. Notice also that the pixels of rows 3 and 4 range only from 3 to 5 in brightness, which is less than the edge threshold. Thus, horizontal splitting of region 1802 provides two regions which have no horizontal edges and one region (rows 3 and 4) which may be encoded with a "fill" value of "4" that fairly represents the Y signal value for all eight pixels. Rows 1 and 2, however, still contain vertical edges V. By splitting this region vertically between columns 2 and 3 two more regions are formed and neither contains edges. The 4×4 region containing the uniform pixels "23" can be filled with a single value. The 4×4 region having pixel values 1, 3, 9 and 12 has no horizontal or vertical edges but is not "fillable" with a single value because of the presence of a pronounced "gradient". Filling of such a region requires a plane surface fill via 1710.

The fill procedure begins at step 1710 by using the method of least squares to find the coefficients A, B and C of the bi-linear polynomial (Ax+By+C) estimate of the region pixel values. Boundary error and MSE error measurements are made (1711) and tests 1712 an 1714 are performed to determine acceptability of the fill value.

If a linear fill is not acceptable, because of the results of any of the tests 1708, 1712 or 1714, then the next step is usually to split (1726) the region. However, the test at 1722 prevents splits if the region size is already small. This is done for two reasons. First, the code size for linear fill encoding is nominally independent of the region area. However, once the region falls below some predetermined size, other encoding methods require fewer bits. Second, there can be delays in the decoder (FIG. 48) whenever a new region must be decoded. If the image were represented using a large number of relatively small regions, these delays can become sufficiently significant to interfere with the requirement that images be decoded at a rate such as 30 FPS.

When the minimum size test indicates a minimum sized region, 1724 encodes the region in DPCM (Differential Pulse Code Modulation) format. In this encoding method, the difference between every pixel and its left neighbor is transmitted. However, since it does not have a left neighbor the first pixel of each line of the region is transmitted as the difference between itself and the pixel immediately above it. The first pixel of the first line of the region (which has no pixel to its left or above it) is transmitted as the difference between itself and a mid-gray value, namely 128. The resulting differences may be additionally data reduced by passing them through a nonlinear quantizer. For decoding purposes, a table describing the nonlinear quantization levels may be transmitted to the decoder in the header part of the compressed video bit-stream.

A number of DPCM quantizers may be used. This is practical because region-specific coding enables matching the coding technique to the individual region. These quantizer tables differ in the dynamic range of the differences. The DPCM encoder 1724 examines the statistics of each region and decides which quantizer table is better suited to that region, and generates a code specifying which dequantizing table is to be used in decoding it.

FIG. 19 shows apparatus for providing the roughness test. FIGS. 32 and 33 which are described later, show apparatus for determining the split direction. In FIG. 19 the region data is stored in a memory 1902. Subtractors 1904 and 1906 subtract the region pixels by row and by column, respectively. Threshold detectors 1908 and 1910 compare the differences of pixels with a threshold value Th (e.g., 10 is assumed) to detect the horizontal and vertical edges which, in turn, are counted by counters 1912 and 1914 and stored in an edge memory 1916. The stored edge data is applied to a zero detector 1920. A HIGH output of detector 1920 signifies that there are no horizontal or vertical edges in the region and initiates the process of finding a value (or values) to fill the region. If edges are present, the edge data in memory 1916 is applied to split logic circuit (FIG. 33A) for finding a split direction as described later.

Alternative definitions of roughness are also possible. For example, one can estimate the slope between adjacent pixels by multipoint interpolation techniques. If the slope is larger than a threshold and is not constant over the region, then the surface is rough.

Returning to FIG. 17, it will be assumed that test 1708 finds no edges present in the region. This initiates the process of finding a fill value for representing all pixels of the region as a group. This is done in step 1710 by generating coefficients A, B and C of a bilinear polynomial $(Ax+By+C)$ estimation of pixel values for the region using the method of "least squares" estimation. The estimated pixel values are compared with the actual values for all pixels of the region to determine the closeness or "fit" of the estimate. The "fill" value comprises the coefficients A, B and C of the polynomial that satisfies two tests, namely, a "boundary error" test 1712 and a "mean square error" test 1714.

Figure 20:
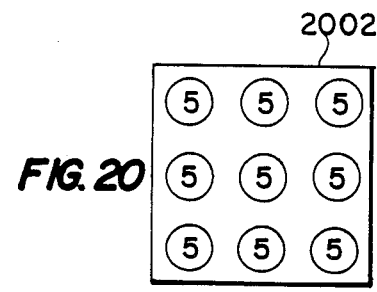
FIGS. 20–23 are region diagrams illustrating bi-linear absolute fill coding used in the compressor of FIG. 16.

FIGS. 20-24 show in detail how the polynominal fill values are found and how the two tests for acceptability of the fill are performed. FIG. 20 represents the most elementary case where all pixels of region 2002 are of the same value (5 units). There is no brightness gradient in the horizontal ("x") direction therefore the coefficient "A" which signifies the horizontal brightness gradient or "slope" equals zero. There is no brightness gradient in the vertical direction either. Therefore, the coefficient "B" representing vertical slope is also zero. The only coefficient remaining is "C", which is the polynominal coefficient representing the constant or uniform signal level of 5 units. The code to represent this simple case is shown as ABS 0 0 5 to signify what will be called absolute coding hereinafter to distinguish region codes based on the actual signal values from region codes based on frame-to-frame differences (hereinafter relative codes). Decoding of region 2002 comprises assigning a value of 5 to every pixel in the region.

Figure 21:
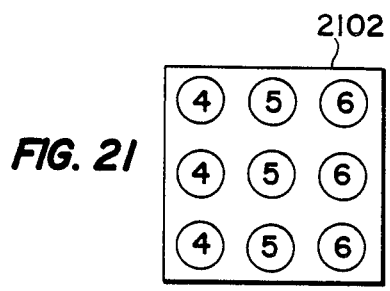
Figure 22:
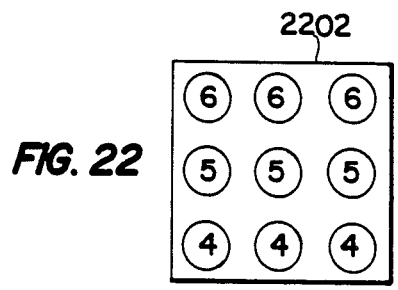

In FIG. 21 the region 2102 includes a horizontal brightness gradient of one unit per pixel in the x direction. Starting in the upper left hand corner the values are 4, 5 and 6. The fill polynomial $Ax+By+C$ therefore has coefficients $A=1$, $B=0$, $C=4$ (taking the upper left pixel as a reference level). The code is therefore ABS 1 0 4. This is decoded by assigning a value 4 to the upper left hand pixel and adding a gradient correction to each horizontal pixel of one unit of brightness per pixel. Since there is no vertical gradient, successive rows are replicas of the first row. FIG. 22 is similar except that the gradient is vertical rather than horizontal.

Figure 23:
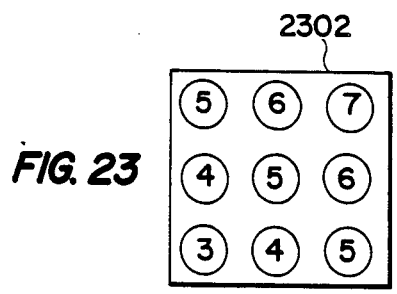

In FIG. 23 the region 2302 has both horizontal and vertical gradients. Taking the upper left corner pixel as a reference, the polynomial constant C equals 5, the brightness increases by 1 unit per pixel in the x direction and changes by $-1$ unit in the y direction. The code is therefore ABS 1 $-1$ 5. Decoding is effected by assigning a value of 5 to the first pixel and incrementing its value by one unit per pixel horizontally. The second and third rows are similarly decoded after decrementing the starting pixel value by the vertical slope value (minus one pixel per column).

The above examples suggest that the slope values A and B in the polynomial $Ax+By+C$ are always integers. It has been found, however, that most slopes that occur in real images are not integers, and in fact are usually less than 1 in absolute value. The A and B values are, therefore, speified in units of 1/256ths; i.e., binary numbers with the least significant 8 bits representing the fractional part of the slope.

In FIGS. 20-23 the polynomial coding is exact. That is, for the exemplary values given, it just happens that upon decoding the decoded regions will have exactly the same values as the original regions. In practice this ideal situation may not occur very often. For this reason measures are needed to determine if the bi-linear polynomial fill values produce a reasonably close replica of the actual pixels values when the region is ultimately decoded. The tests used are the mean square error (MSE) and the boundary error test of the polynomial fit as illustrated in FIG. 24.

Figure 24:
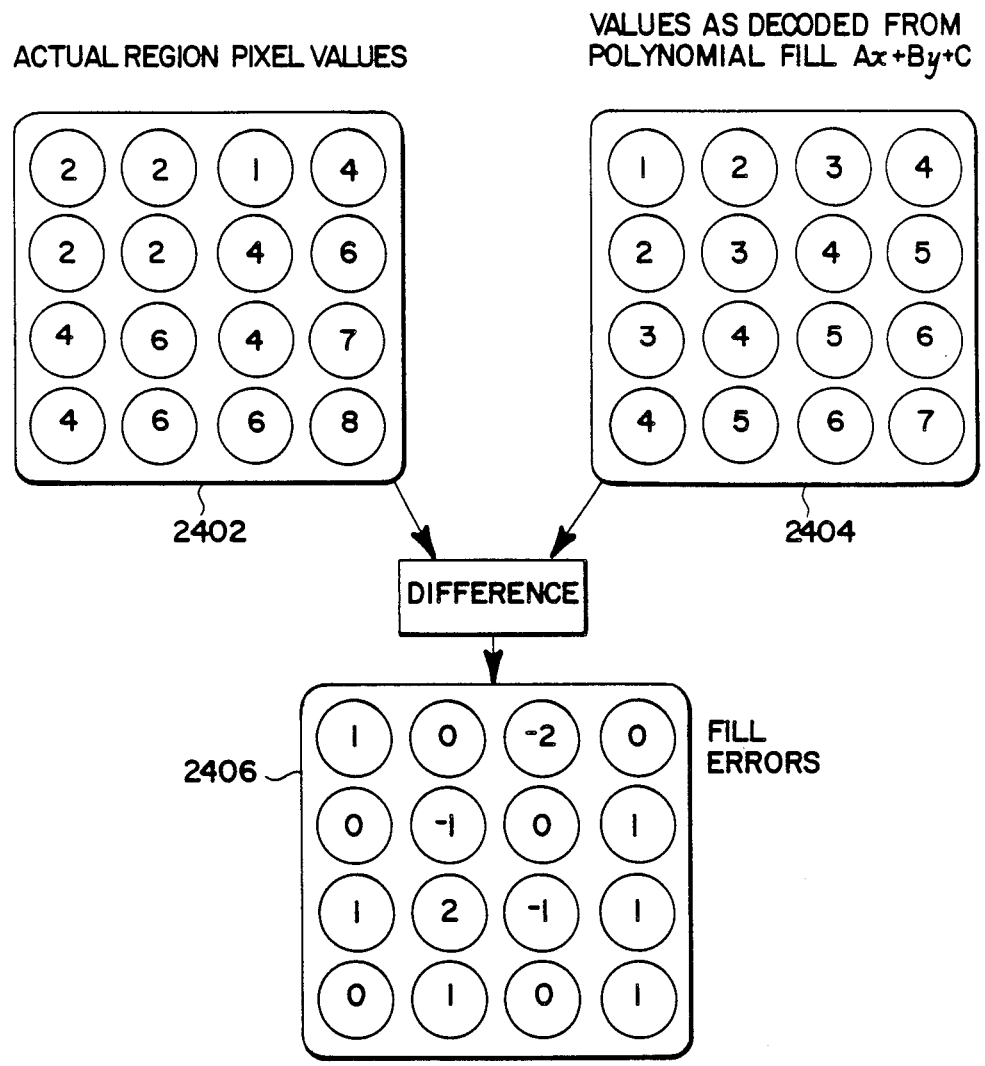
FIG. 24 is a region diagram illustrating measurement of boundary errors.
Figure 25:
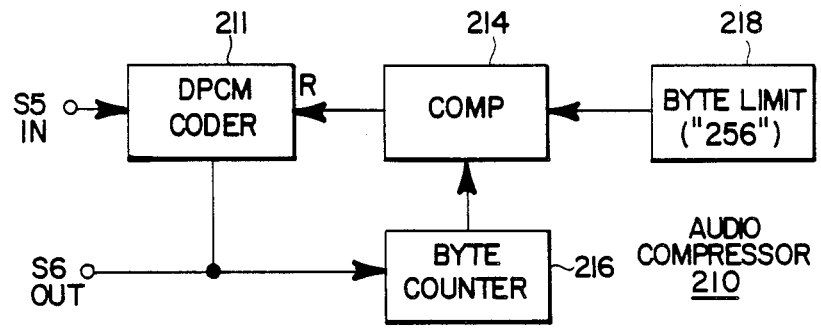
FIG. 25 is a block diagram of an audio compressor used in the encoder of FIG. 2.

FIG. 24 illustrates a specific case where the polynomial fill is not exact and acceptability of the fit is tested. Region 2402 is a region of pixel values as they appear in the image. Array 2404 is a corresponding set of values that is produced when using a polynomial of the form $Ax+By+C$, the coefficients of which were determined using least squares analysis on the data of region 2402. Array 2404 shows a uniform horizontal gradient of 1 and a uniform vertical gradient of 1. Array 2406 is a set of values corresponding to the errors between the actual pixel values and the corresponding generated pixel values. The MSE is obtained by taking the square root of the average value of the squares of the values in array 2406. For this specific example the MSE is 1. This value is compared with a theshold value to determine acceptance or rejection of the fill data.

The boundary error is based on analysis of the 12 pixels that constitute the boundary of this region. It has been found that boundary errors require tighter tolerances than errors interior to a region if false edges are not to be generated between abutting regions. One possible boundary test is to compare each of the boundary difference values in array 2406 against a predetermined threshold value, e.g., 10, and if any of the differences exceed this threshold, to reject the coefficients.

A preferred embodiment of the boundary test looks for coherence in values. It has been discovered that boundary errors are more visible when they are coherent; that is when adjacent pixels have errors with the same sign. Random differences such as those along the top, bottom and left side of array 2406 are unlikely to produce a false edge in a reproduced image. In the preferred embodiment, the boundary estimator 1711 identifies contiguous blocks of boundary errors which have the same sign. Only boundary pixels that are part of a block whose length is greater than a threshold (from threshold control 238), typically 2, may be considered. For example, in array 2406 of FIG. 24, only the block of error values having the value $+1$ on the right boundary would be considered, and a boundary error estimator of "1" generated. The average block error value of such coherent pixels is compared against a threshold value. If the error exceeds the threshold value the fill is rejected.

In summary, tests at 1712 and 1714 are performed to see whether the fit represented by $Ax+By+C$ should be accepted. The test at 1714 might fail because the average deviation from a plane surface is too high. In other words, the MSE test essentially measures closeness of the fit of the encoded pixel values $(Ax+By+C)$ to the actual pixel values. An MSE threshold is selected and used as an input for threshold control 238, and is typically 4. The test at 1712 might fail if the errors along the boundary might tend to introduce a visible transition between adjacent regions when they are decoded and displayed. The boundary threshold is also used an an input for threshold control 238 and is typically 20.

Returning to FIG. 17, once the decision has been made to split a region, the region is analyzed to find the best split direction. If test 1728 indicates the need for a vertical split, step 1730 splits the region into a left half and right half region. If test 1728 indicates the need for a horizontal split, step 1732 splits the region into a top half and a bottom half. If the split is horizontal, the compression process is repeated starting with the next region selected (1704) being the upper one of the split regions. If the split is vertical, the compression process is repeated selecting (step 1704) the left one of the split regions. This process of splitting and compressing continues until all the regions created by the splitting process are encoded (step 1705). Then remerge (step 1720 to be described) is done and the intra-frame compression operation ends (1736) for the luminance (Y) signal subframe. A complete color frame is encoded by repeating the compression process for the remaining I and Q sub-frames. If additional still frames are to be encoded, the next frame is selected (1735) as a result of a "last frame" test 1734 and the process repeats.

Finding a split direction for a region to be split (1726 of FIG. 17) may be accomplished by means of: (1) edge distribution analysis; or (2) polynomial fit analysis. Each of these procedures, and specific apparatus for providing the split direction indication are described as follows with reference to FIGS. 32-38.

Edge distribution analysis is used to find a most favorable split direction for cases where the reason for splitting the region is the presence of edges in the region (e.g., failure of the roughness test 1708 in FIG. 17). FIGS. 32A-J provide examples of regions to be split using edge distribution analysis. FIGS. 33A and B, discussed later, show how the analysis may be implemented.

Figure 32A:
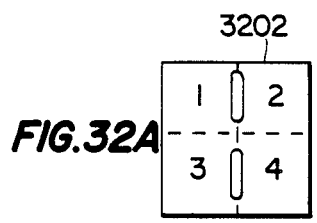
FIGS. 32A-J are region diagrams illustrating edge distribution analysis for determining a most favorable region split direction.
Figure 32F:
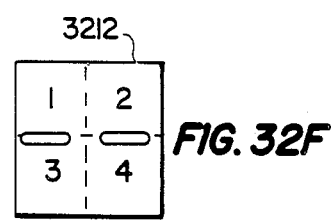
Figure 32B:
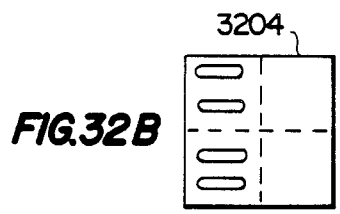
Figure 32G:
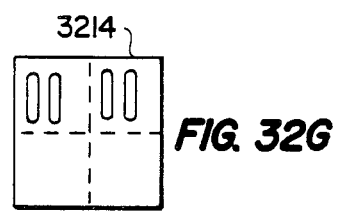
Figure 32C:
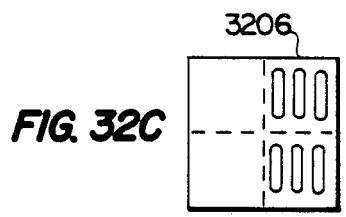
Figure 32H:
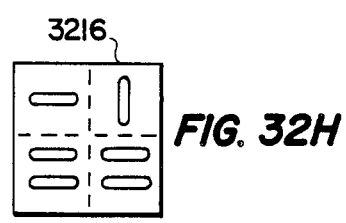
Figure 32D:
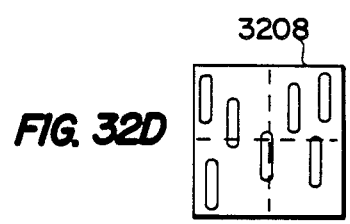
Figure 32I:
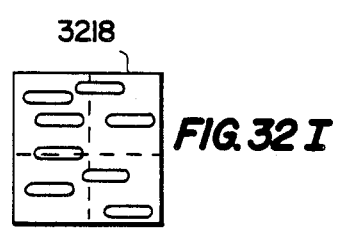
Figure 32E:
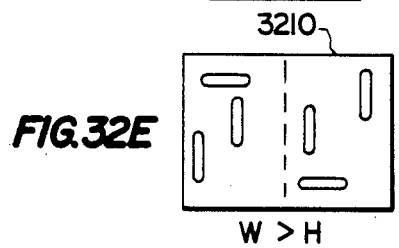
Figure 32J:
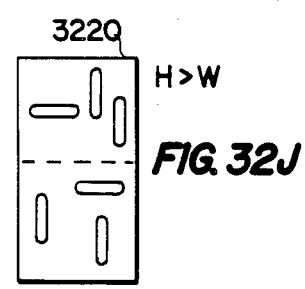
Figures 33A, 33B:
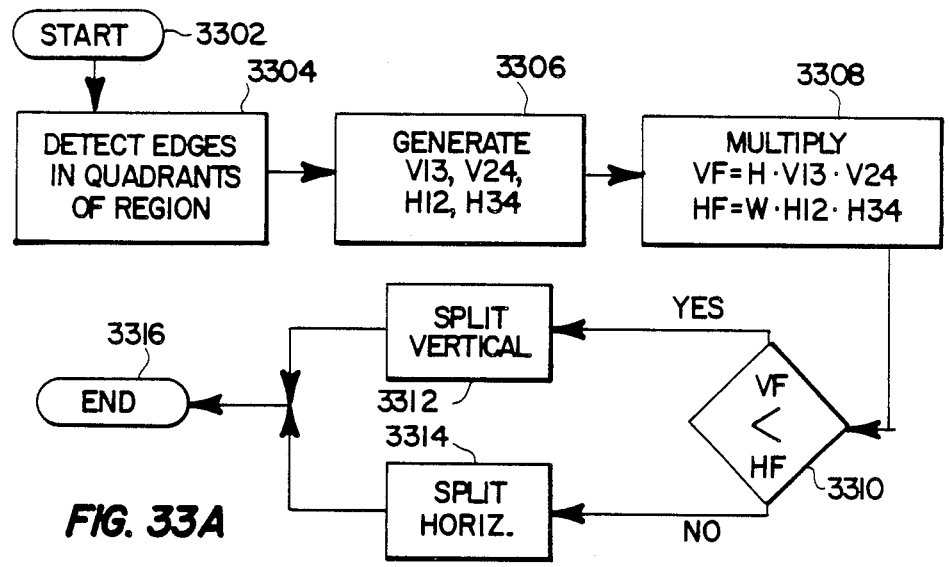
FIG. 33A is a flow chart for computer apparatus for determining a most favorable split direction in the compressor of FIG. 16 by analysis of the distribution of horizontal and vertical edges in a region.
FIG. 33B is a table listing of parameters for the apparatus of FIG. 33A.

FIGS. 32A-E illustrate five cases where a vertical split is favored over a horizontal split. In FIG. 32A the region 3202 contains two vertical edges which lie on the vertical bisector of the region. Nothing would be gained by splitting this region horizontally since each subregion would still contain an edge whereas a vertical split will produce two regions (1, 3 and 2, 4) neither of which contains an edge. In FIG. 32B there are no edges in the right half of region 3204 therefore a vertical split will produce one sub-region having no edges. A vertical split is similarly favored in region 3206 of FIG. 32C. In FIG. 32D there are many vertical edges in region 3208. Although edge free regions will not be produced here, a vertical split is favored since it is more likely that an edge will be eliminated than if it were split horizontally. In FIG. 32E region 3210 contains several horizontal and vertical edges with no clear advantage. For this case aspect ratio analysis is used. Specifically, region 3210 is wider than its height and a vertical split is selected because it will tend to produce sub-regions that are more square. On average, this has been found to result in fewer regions being produced for typical images where the edge analysis shows no clear advantage. Regions 3212-3220 of FIGS. 32F-J are split horizontally for reasons similar to those discussed with regard to vertical splitting of regions 3202-3210.

From the foregoing it is seen that there are a number of factors which have a bearing on selection of a split direction. In practice, the split decision is not as simple a matter as it might appear from the examples given because real images produce regions having many more edge distributions than the relatively simple examples of FIGS. 32A-J. The flow chart of FIG. 33A and associated table of FIG. 33B illustrate a method for finding a split direction which takes into account the complex edge distributions encountered in splitting regions of typical video images.

In FIG. 33A the split direction analysis starts (3302) with the step (3304) of detecting edges in four quadrants of the region to be split. As shown in FIGS. 32A and 32F, the quadrants are designated 1 for the top left, 2 for the top right, 3 for the bottom left and four for the bottom right. Next (step 3306) four functions V13, V24, H12 and H34 are generated as listed in the table of FIG. 33B. The function V13 equals the sum of a number of terms (Col. 1 of FIG. 33B) relating to edges in the left half of the region (i.e., quadrants 1 and 3). The function V24 is comprised of the sum of a number of edge distribution terms for the right half (quadrants 2 and 4) of the region. The function H12 and H34 similarly relate to sums of terms for the top and bottom halves of the region. Specific terms are discussed later.

At step 3308 multiplication is performed to produce what is herein termed a vertical factor VF and a horizontal factor HF. The vertical factor VF equals the product of the region height (H) times V13 times V24. The horizontal factor HF equals the product of the region width (W) times H12 times H34. The factors HF and VF are compared at step 3310. A vertical split is made (3312) if VF is less than HF and the program ends (3316) otherwise the region is split horizontally (3314) and the program ends.

In operation, any factor which tends to make VF smaller than HF favors a vertical split. From step 3308, for example, if the edge analysis factors V13 and V24 are equal to H12 and H34 than a vertical split will be favored if the region heigth H is less than its width. This condition corresponds to the example of FIG. 32E where it was seen that there was no clear advantage shown by edge analysis but the aspect ratio test favored a vertical split to obtain sub-regions that are more square.

The factors of FIG. 33B (calculated in generation step 3306) become important in cases where the vertical and horizontal edge distributions are not uniform in a region. Factors tending to make V13 (left half) or V24 (right half) small favor a vertical split. For example, if the number V1 of vertical edges in quadrant 1 is equal to the number V3 of vertical edges in quadrant 3, then the factor V1−V3 will be zero thus favoring a vertical split. Vertical and horizontal edge difference factors V1−V3, H1−H3, V2−V4, H2−H4 etc. are included for all quadrants. These terms are all squared in FIG. 33B to give them added weight. The terms Ho and Vo represent the number of horizontal and vertical edges, respectively, which will be eliminated by the split (i.e., edges falling on the split line). The elimination of edges has also been found important and so these terms are also squared to increase their weight in the split direction test. The remaining factors H1, H2, V1, V2 etc. represent the number of edges per quadrant. If, for example, there are many horizontal edges in the left and right halves a horizontal split will be favored (e.g., FIG. 32I). Other examples of the application of the table of FIG. 33B are apparent. For example, the terms may be weighted differently than shown. Also, the region may be more finely subdivided and additional terms for split direction analysis added to the table.

The foregoing assumed that the reason for a split was a YES exit from the roughness test 1708. If the reason for the split was a linear fill that failed the MSE test (1714) or the boundary error test (1712), then a different method for choosing the split direction is appropriate.

Figure 37:
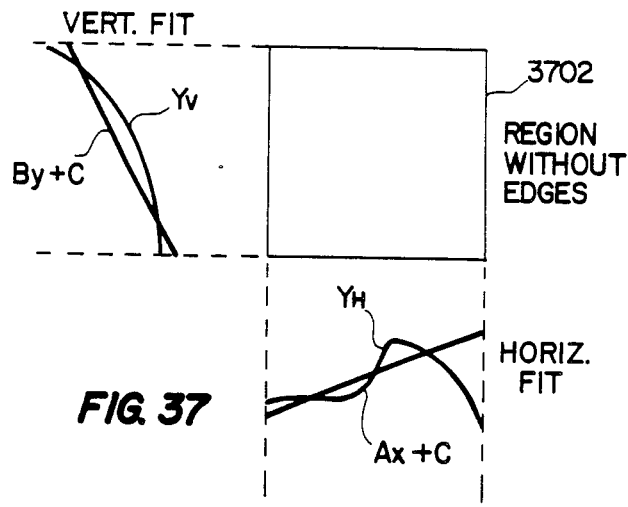
FIG. 37 is a diagram illustrating finding a most favorable split direction by polynomial fit comparisons.

FIG. 37 illustrates analysis of the polynomial fit to determine the split direction. Recall from FIG. 17 that a region will always be split if either the mean square error (MSE) or the boundary error tests of the bi-linear polynomial $Ax+By+C$ is unsatisfactory. In FIG. 37 the vertical portion $(By+C)$ of the bi-linear polynomial is compared with the vertical luminance values $Y_V$ (i.e., the average luma values by row). Also, the horizontal portion $(Ax+C)$ is compared with the horizontal luminance value $Y_H$ (i.e., the average luma value by column). The comparison providing the better "fit" (i.e., lower MSE) is selected as the split direction.

Figure 38:
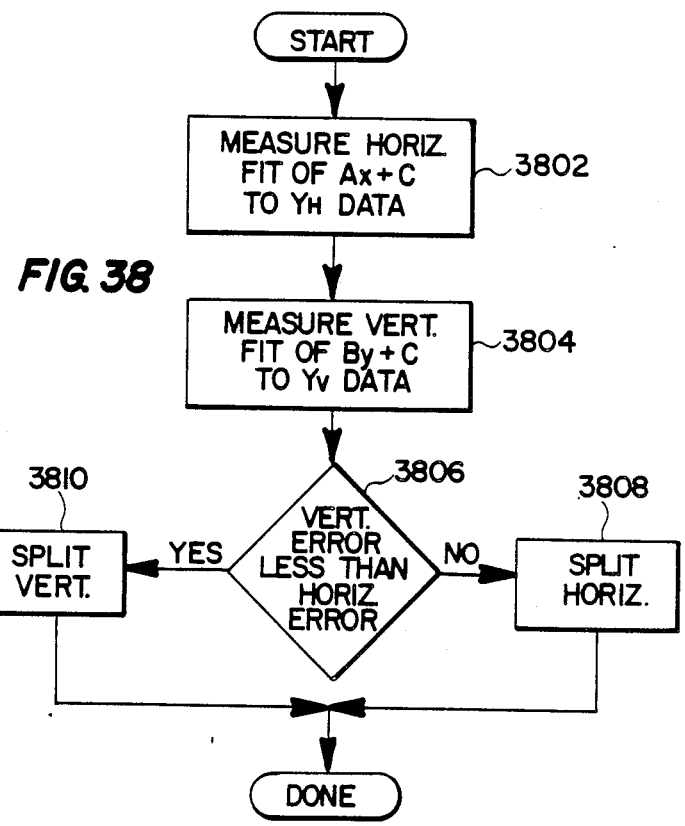
FIG. 38 is a flow chart for computer apparatus implementing the split direction method of FIG. 37.

A flow chart for a computer apparatus implementation of this method is shown in FIG. 38. Measurements of the fit of $Ax+C$ to $Y_H$ and $By+C$ to $Y_V$ are made in steps 3802 and 3804. Test 3806 selects a vertical split 3810 if the vertical "fit" (i.e., MSE) is better than the horizontal fit as shown in the example of FIG. 37. Otherwise test 3806 selects a horizontal split 3808 and the program ends (done).

An advantage of this technique of finding a split direction is that it frequently results in a "fillable" region if most of the error occurs in one-half of the region. In the example of FIG. 37 the vertical fit is good and most of the error in the horizontal direction is on the right-hand side of the image. Thus, for this case a vertical split is favored and the left side of region 3702 will probably not require further splitting since the errors (horizontal) are mostly on the right-hand side.

Returning to FIG. 17, when all the regions have been encoded, the process continues at step 1720. Remerge examines the encoding generated for all regions of the image, and performs some post processing on it to remove some code and to improve the decoding time. If two adjacent regions of like size have been encoded with the same DPCM quantizing table, the split could have been avoided. Remerge (step 1720) will modify the coding stream to replace the two smaller regions by the larger region. The larger region formed by the rejoined two regions can thereafter participate in a further rejoining operation with adjacent like sized DPCM encoded regions.

FIGS. 39–43 provide details for implementing the inter-frame coder 1620 of FIG. 16. As previously mentioned, inter-frame coding is used for the second and subsequent frames of a motion video sequence to take advantage of correlation or redundancy which exists between frames in a typical motion video sequence. The advantage is that if a region of a previous frame may be found that corresponds fairly well to a region being coded in a current frame, then one need only code the differences rather than the absolute values as was done in the intra-frame coder 1610. An advantage of inter-frame coding, as previously noted, is that the differences values tend to be small numbers that can be encoded with fewer bits. Region motion, due to panning or object movements within a scene, requires an additional code parameter, namely, the offset values $X_o$ and $Y_o$. The offset values $X_o$ and $Y_o$ represent the amount by which a moving object has translated in the horizontal and vertical directions between the current and the previous frame.

FIG. 40 illustrates the motion effect. The solid region 4004 represents a particular region of the current frame. Region 4002 is a region in the previous frame containing picture information corresponding to the information in region 4004. Relative to the corresponding region 4002, region 4004 has moved by $X_o$ horizontally and $Y_o$ vertically. As an overview, one task of coder 1620 is to encode the region 4004 (hereafter the "target" region T) as a bi-linear polynomial $Ax+By+C$ representing the differences between regions 4004 and 4002. The differences in the location of the regions $X_o$, $Y_o$ (hereafter, the "offset") is also coded to enable a decoder to locate the previous image and add the differences thereto to reconstruct the target image. This form of coding will hereafter be referred to as "relative" linear fill coding to distinguish it from the "absolute" linear fill coding of coder 1610. Other functions provided by coder 1620 include providing a high speed search routine for locating regions "C" in the previous frame corresponding to the target image in the current frame and, providing default coding alternatives if a suitable previous region can not be found.

Figure 39:
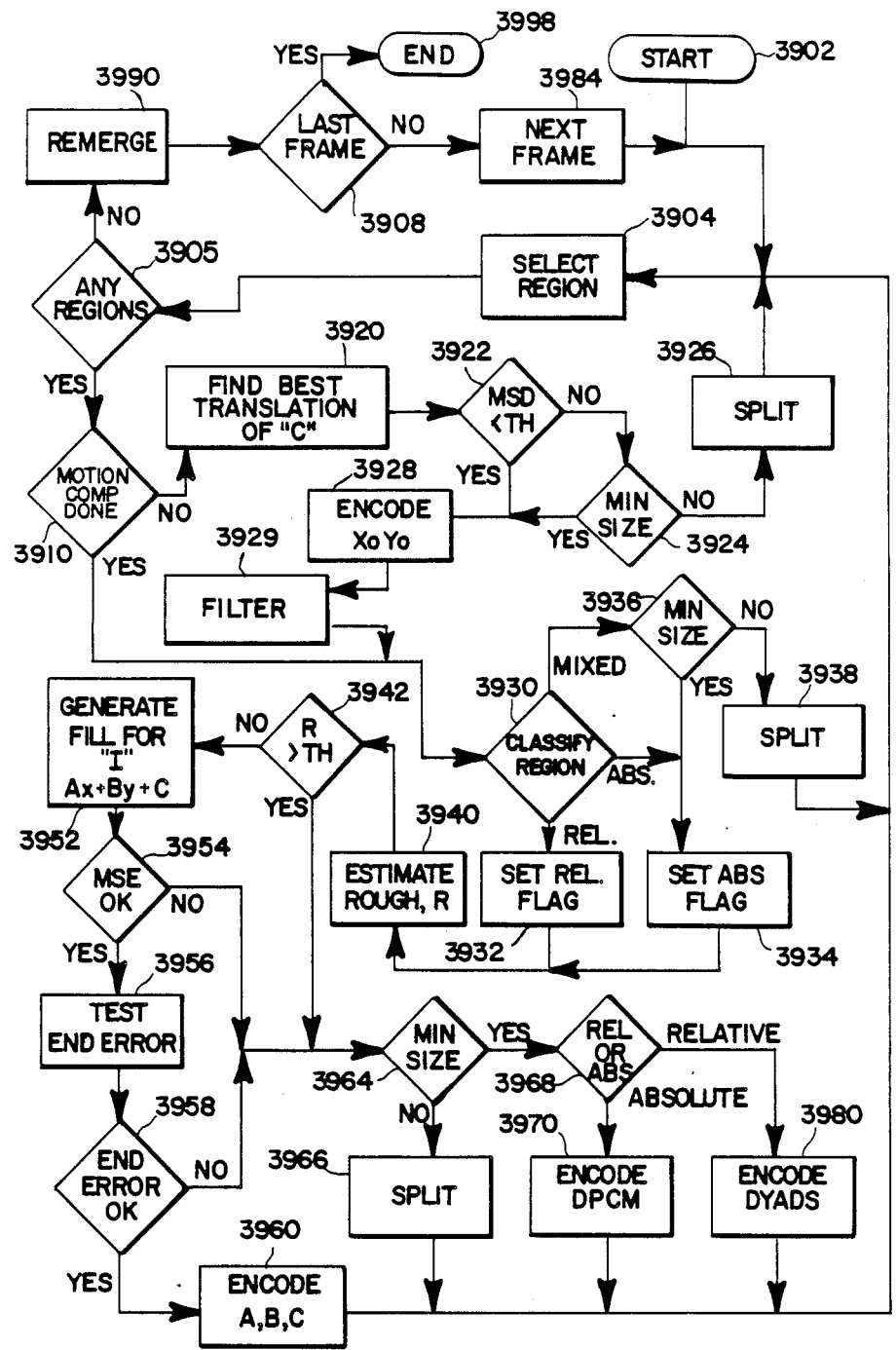
FIG. 39 is a flow chart illustrating operation of an inter-frame coder used in the compressor of FIG. 16 for coding the second frame and all subsequent frames of a motion video sequence.

FIG. 39 is a detailed flow chart illustrating each step in the inter-frame coding process provided by coder 1620. This "software" implementation is presently preferred. It will be appreciated that the individual processing functions may readily be implemented by individual apparatus elements providing the functions shown in the flow chart. Inter-frame coding is initiated (START 3902) by placing mode switch 240' (see FIG. 16) in the down position to begin encoding the second frame of a motion video sequence. Recall that switch 240' was previously in the UP position for coding the first frame using intra-frame coder 1610. This previous frame is already coded and stored in buffer store 232 (FIG. 2) and is also stored in uncoded form for comparison with the current frame to be coded.

Inter-frame encoding is performed separately on the Y, I and Q subframes. After starting the inter-frame coding, the next step 3904 comprises selecting the target (T) and the corresponding (C) previous regions. The target image controls the selection of the corresponding region by selecting the corresponding region to be of exactly the same size and, initially, at exactly the same location (X,Y coordinates) in the previous frame as the target region. As will be explained, a search is then performed in the vicinity of the target region coordinates to compensate for frame-to-frame motion effect.

The target region is selected similar to region selection for absolute fill encoding of still frames. Originally the entire image area is selected as the target region. If this region cannot be adequately encoded, it is split into sub-regions which are subsequently examined for encoding.

Once a target region is selected the resulting processing is the same regardless of whether the current region is the whole image, or one of the regions placed on the region list (3904) by a split action. If a region is available for processing (3908), it is examined (3910) to determine whether this region has already undergone motion compensation. If it has, there is no need to repeat this processing, and processing skips directly to step 3930. As will be described in later discussions of motion compensation, step 3928 generates a code describing the relative displacement of the "T" and "C" regions. This code is included in the code stream only once for a given region and all sub-regions derived from it later by splitting. This helps reduce the size of the coding bit stream and is one of the many benefits of binary tree decomposition.

If step 3910 determies that motion compensation has not yet been performed, the motion compensation process 3920 is initiated.

Briefly, the process 3920 comprises searching for a region "C" of the previous frame which most closely matches the target region "T" of the current frame. If no motion has occurred, regions C and T will have the same coordinates. If motion has occurred, region C will be offset or translated relative to region T by an amount $X_o$, $Y_o$. The mean square difference (MSD) between corresponding pixel values of the target region and the best choice for the translated "C" region is calculated. This MSD value is compared (3922) against a threshold entered via threshold control 238 (FIG. 2). If the comparison indicates that this best choice for a translated region does not provide an acceptable match to the target region, the target region is checked for minimum size (3924). If the target region is larger than the minimum size, it is split (3926) and motion compensation is performed on the split regions. If a translated region is found, which acceptably matches the target image (that is, passes test 3922) or the target region is of minimum size the $X_o Y_o$ displacement values are encoded (3928) to provide the region offset in the region description code. If step 3928 is reached via step 3924, and has not satisfied test 3922, the translated region will not accurately describe the target region. This occurs for example if the camera is panning and hence there are no antecedent pixels. Subsequent steps in FIG. 39 will represent the region as best as it can, probably via absolute DPCM.

A more detailed discussion of motion compensation will now be presented with reference to FIGS. 40, 41, 42 and 43. The purpose of motion compensation 3920 is to determine the offset or displacement of the region "C" that most closely approximates the target region. The process shown in FIG. 42 is a directed search for a displacement that minimizes some measure of closeness of fit. Nominally the mean square difference (MSD) between the two regions is used as the closeness of fit measure. The particular target region may contain a large number of pixel values and hence evaluating the MSD can be very time consuming. The time required to make this calculation may be significantly reduced without significantly affecting the end result, if the mean square difference is calculated only for a properly chosen subset of the pixels.

The first step in FIG. 42 is to determine (4210) a representative set of pixels for the MSD calculation. A strategy of picking the pixels at random, but uniformly distributed over the region has proven to be effective. The number of representative pixels needed in the subset depends roughly on the square root of the area of the region. More precisely, the required number is determined from the formula $K\sqrt{A}$, where K is a parameter entered via threshold control 238, and typically about 10 and A is the region area. In order to assure that the representative pixels are uniformly distributed throughout the region, the region is considered to be composed of $K\sqrt{A}$ equal sized sub-regions, and a pixel randomly selected from each of these sub-regions.

Next, simple low pass filtering is applied to the "T", and "C" regions. Such a filter (4204) makes use of representative pixels less sensitive to random effects. This filtering operation is done only for motion compensation, and the filtered regions are discarded before subsequent processing of the region.

The first phase of the search begins by setting (4220) the search resolution to one pixel. While it is desired to know the displacement between the target region and a corresponding "C" region to greater resolution, starting with single pixel resolution has two advantages. First, larger translations can be made with fewer time-consuming evaluations of the MSD. Second, the calculation time for the MSD is faster. The latter is true because calculating the MSD for fractional displacements of a pixel requires the additional step of interpolation between pixels.

Next trial evaluations of the MSD are done in eight different directions from the starting point (4230) These eight possible directions are shown in FIG. 41. The direction that gives the greatest reduction in the MSD is pursued. In practice, it is not necessary to do eight MSD calculations to pick the best direction. The algorithm assumes that the MSD is roughly a linear function in the neighborhood of the starting point. Hence, if the direction L gives a reduction, it is expected that direction R will give an increase, and its MSD is not evaluated. Similarly a reduction in the direction U will suppress the evaluation for the direction D. Finally, it is only necessary to evaluate one diagonal direction; first the best horizontal and vertical directions are determined, and then the diagonal direction between them is examined. This strategy often points in the right general direction. Further, even if it points in the wrong direction, other steps in the process can eventually direct the search in the proper direction.

Usually when these various directions have been examined, a direction is found that decreases the MSD more than others. If such a direction exists the test for local minima (4240) will fail, and the search proceeds to step 4260. At this point "C" regions are examined only along the direction which produced the smallest MSD at step 4230. Test regions are examined, with one pixel resolution, in the chosen direction for as long as the MSD continues to decrease. This process is suggested by the double arrow in FIG. 41. When further translations produce no further decrease of the MSD, step 4230 is repeated to find a new search direction. This process continues until there is no further reduction in the MSD. Then the resolution is increased to one eighth pixel (4240, 4250, 4270) and the search process repeats at this higher resolution until there is again no further reduction in MSD and the search ends (3922) with the values of $X_o Y_o$ being stored for possible subsequent encoding 3928.

Pixel values in the "C" regions are only available at one full pixel resolution. Searching for regions in the "C" frame at e.g., $\frac{1}{8}$th pixel resolution can only be meaningful if pixel values are available at $\frac{1}{8}$th pixel interval resolution. These pixel values are generated by interpolation to produce values at $\frac{1}{8}$ pixel increments. There are many known interpolation algorithms which may be used to produce these values such as linear interpolation, quadratic interpolation, cubic interpolation etc.

Figure 43:
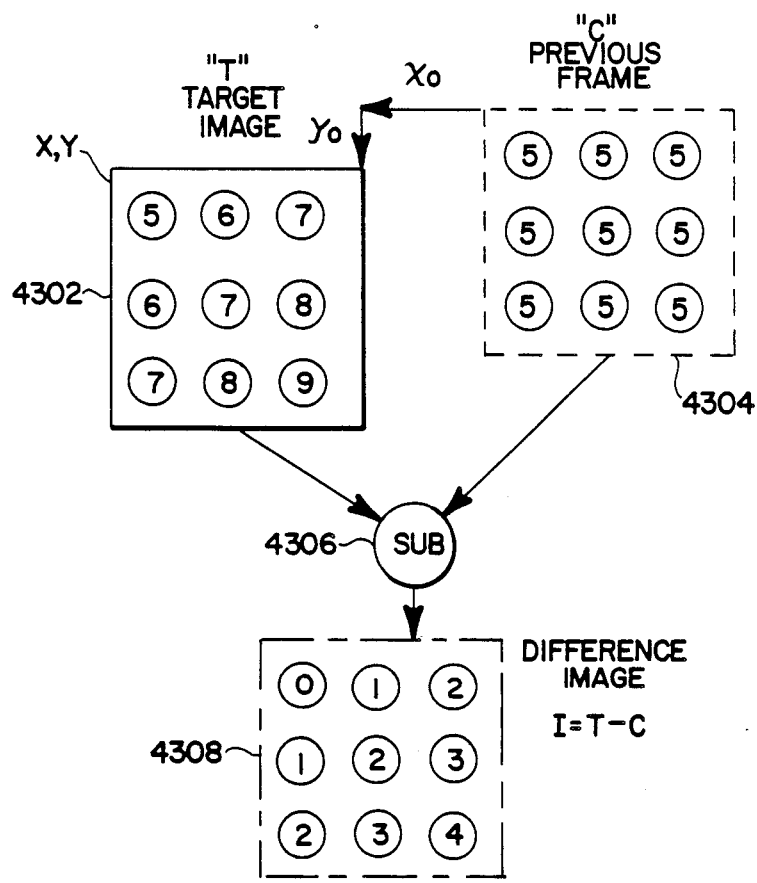
FIG. 43 is a diagram illustrating region translation and relative coding used in the inter-frame coder of FIG. 39.

FIG. 43 provides further illustration of the process of motion compensation and relative coding and illustrates the substantial region data reduction obtained. In this example the C region 4304 of the previous frame is assumed to be of uniform brightness (5 units). The target region 4302 is similar but has vertical and horizontal gradients of $-1$ and $+1$ units per pixel. Subtraction (4306) results in a difference image, I, 4308 with relatively low valued pixels to encode. As shown, the code comprises the changes in brightness (C) and gradients (A, B) and the region offset code $X_oY_o$ When motion compensation is completed for a target region, processing is continued at step 3930. Step 3930 determines the type of encoding to be performed on the target region. First, a region is generated comprised of difference values of corresponding pixel values in the target and selected "C" regions (see FIG. 43). If none of the difference values in this generated region are greater than a threshold, typically 30, the target region is classified as relative and selected for relative encoding. The advantage of relative encoding is that it tends to result in larger regions with smaller code values, and hence results in smaller code size and decode time. In this case we exit step 3930 along the decision path labeled relative (REL.).

Returning to FIG. 39, if there are difference values in the generated region greater than the threshold, the target region is not classified relative, but it is conceivable that part of it may successfully be processed by relative encoding. Hence step 3930 performs a trial split, and examines the two resulting subregions. This trial split uses a simple split (FIG. 35A). If either of these sub-regions satisfies the threshold requirement step 3930 is exited along the decision path labeled mixed, which leads to the split step 3938, so that the two half size regions can be separately processed. The split at 3938 is also a simple split.

The split at step 3938 is preceded by a minimum size test (3936). If the split at 3938 would reduce the region below the minimum size, the minimum size test (3936) reclassifies the target region as absolute. This prevents the generation of very small planar fill regions, which are inefficient both in code size and decode time.

It may be that neither half of the trial split region results in a sub-region that can clearly be classified as relative. In that case trial splits are performed (3930) on each of the sub-regions. This process continues until one of two things results. If a sub-region is found that is clearly relative step 3930 is exited along the mixed decision path. Otherwise trial splitting is continued until the resulting regions would fail the minimum region size test. If this happens, that is, no trial subregion is found which is larger than the minimum size, and is clearly relative, then the region is classified as absolute and step 3930 is exited along the absolute decision path to 3934.

If the exit is along the mixed path, the region will be split by step 3938. These sub-regions will eventually each be processed by step 3930 again. Since the reason for exiting along the mixed exit was the presence of a trial region that could be classified as relative, the split at 3938 will eventually yield that region.

Once the region has been classified, it is identified by relative and absolute flags at steps 3932 and 3934 for subsequent use in fill processing (steps 3952 and 3968).

It will be noted that relative regions are low-pass filtered at step 3929 after encoding of the $X_o$ $Y_o$ offset values (step 3928) and before region classification (step 3930). Filtering at this point removes extraneous detail which increases the probability that larger regions will be classified as relative thereby reducing code size and decode time. The target image is also filtered in case the region is classified absolute which tends to increase the size of absolute regions. In this regard it has been found that an additional nonlinear filter is very helpful. The eye is less sensitive to loss of detail in the difference value region, since the eye sees the sum of the encoded difference values and the pixel values in the "C" region. Therefore, it is extremely useful to weight the amount of filtering based on the human perceptual system. There are two reasons why the eye may be less sensitive to errors in one part of the difference image than another, and these two reasons are both used to determine the amount of filtering on a pixel by pixel basis. First, those portions of the difference region where the target region is bright are filtered more strongly then those portions where the target region is dark. Second, those portions of the difference region where the target region is "busy" (i.e., detailed) are filtered more strongly than those portions where the target region is relatively smooth. That is, if the target region is changing slowly, errors in the difference region will be more visually apparent than if the target region has a lot of detail. The degree of busyness of a point is estimated by subtracting neighboring pixel values, thereby getting a measure of the local gradient. In view of the foregoing, the detector 3624 in FIG. 36A may be modiied to increase the damping factor D for bright and/or busy images.

The next processing step is to try and represent the region by a planar surface: $Ax+By+C$. This step (3952) is either applied to the difference region or the target region, depending on whether step 3930 has classified the region as relative or absolute. This process is essentially the same as previously described for FIG. 17 steps 1706 to 1716.

If the region fails the roughness threshold test 942, the region will be tested for minimum size (3964). If the region is greater than minimum size, a split is done (3966) and new target regions generated for selection (3904). Conversely if the region size falls below a threshold value, one of two techniques is pursued depending on whether the region had been classified as absolute or relative. For absolute regions DPCM encoding (3970) of the region is performed which is substantially the same technique used for intra-frame encoding, and described in that context.

For relative regions, a different technique, referred to as dyad encoding, is implemented. This technique is optimized for regions that are fairly flat, but have a few exceptional pixels that prevent it from being properly encoded as a planar surface. Dyad encoding will be described in reference to FIG. 61. This figure shows a representative region of eight pixels in the target region 6110, and the associated best match corresponding region 6120 of the previous frame. The encoder will generate the target image pixels $A_1$ and $B_1$ by respectively adding the pair of values R, S, to the corresponding pixels, $C_1$ and $D_1$ The pair of values R, S, is herein referred to as a dyad. The decoder will find the pair of values R, S, in a dyad memory table by using the code value from the data stream to generate address values for application to the dyad memory.

Figure 61:
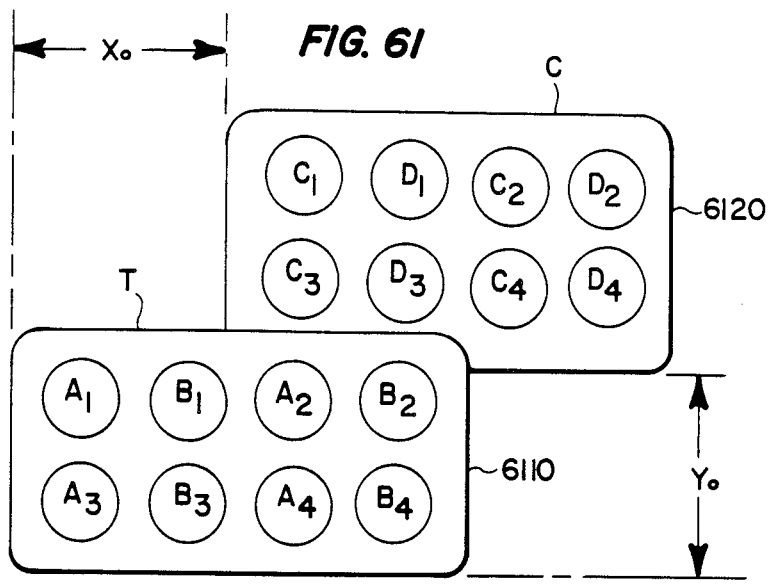
FIGS. 61 and 62 are diagrams illustrating dyad decoding in the decoder of FIG. 48.
Figure 62:
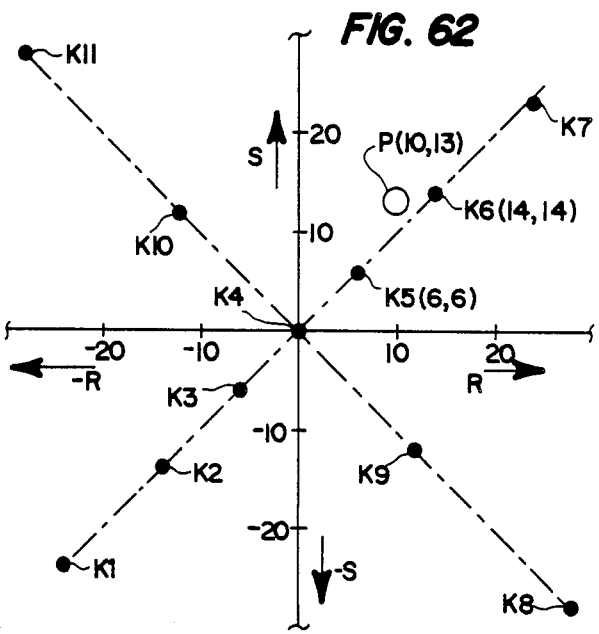

FIG. 62 illustrates the dyad coding process. Eleven dyad points (solid dots) are plotted on the diagonals of an RS coordinate system. The coordinates of the dyad points are entered in compressor 230 by means of threshold control 238. The dyad points are numbered K1-K11 and it is the dyad number (not its coordinate values) which is used to encode a pair of difference values R, S. This may be done by plotting the actual pixel difference values as a point (P) in the RS plane and choosing the nearest dyad point K as the code value. As an example, in FIG. 61 assume that pixels $A_1$ and $B_1$ are to be encoded. First, $C_1$ of the previous field is subtracted frame $A_1$ to yield a difference value $R_1$. Then $D_1$ is subtracted from $B_1$ to yield the difference value $S_1$. For purposes of illustration assume that $R_1=10$ and $S_1=13$. These values are then used as coordinates of point P (10, 13) in FIG. 62 and plotted in the RS plane. As shown, the closest dyad to point P (10, 13) is dyad number K6 at coordinates R=14, S=14. One may, therefore, encode $A_1$ $B_1$ of region 6110 (FIG. 61) by transmitting the dyad designator K6. When decoded (by a table look-up of K6) the $A_1$ and $B_1$ pixels would be only slightly brighter than their original values. Specifically, the true value of pixel $A_1$ is $C_1+10$ and the true value of pixel $B_1$ is $D_1+13$. Using dyad K6, the decoded values will be $C_1+14$ and $D_1+14$ which is very close to the true values of the pixel pair $A_1$ $B_1$.

It has been found that a superior dyad decoded image may be obtained by modifying the foregoing dyad selective procedure. In the example given, the dyad K6 was seen to provide a slightly brighter pixel pair $A_1$ $B_1$ when decoded than would be the case if the "true" differences had been transmitted. Choosing a dyad that yields smaller differences than the true pixel differences tends to be less visually apparent than choosing one (like K6) that tends to "over-compensate" or peak the decoded image. Accordingly, in the previous example the dyad K5 would be a better choice for encoding pixel pair P rather than K6 even though the coding errors are clearly somewhat larger for the given example. A further reason for choosing the smaller dyad is that it skews the dyad frequency distribution towards smaller values.

A further aspect of dyad region-specific coding shown in FIG. 62 is that the dyads K1-K11 are not uniformly spaced along the left and right diagonals of the pixel difference RS plane. Specifically, dyads near the origin are more closely spaced than those farther away. The effect is that there are more dyads available for coding small pixel pair difference (R, S) and thus the coding accuracy is improved as the differences A−C and B−D become smaller. This is important because it has been discovered that the eye is more sensitive to errors in the dyad values when the values are small.

It will be readily apparent that the accuracy of dyad encoding may be enhanced by increasing the number of dyads $K_i$. For example, dyads may be determined along two diagonals (e.g., 30° and 60°) rather than along the illustrated diagonal along 45°. In general, a number of dyad tables are available and a table is selected which best fits the region data. The particular table used is indicated as part of the encoded data.

To summarize, step 3904 provides a region for possible encoding by steps 3960, 3970 or 3980. If the region is not encoded, it is split at 3926, 3938 or 3966, and the separate sub-regions analyzed for possible encoding. Eventually the minimum size tests (3924) (3936) and (3964) force every region to be encoded.

Once every region has been encoded, the condition that all regions have been encoded is detected (3905). The process then shifts to the remerge operation (3990). Remerge examines the encoding generated for all regions of the images, and where possible, merges adjacent dyad encoded regions and adjacent DPCM encoded regions. This process is similar to the remerge operation discussed with respect to step 1720 of FIG. 17.

After remerge (3990) the process checks (3908) for further frames in the sequence. If there are no further frames, then all frames of the sequence have been compressed, and the process of FIG. 39 is exited (3998). If there are more frames, the next frame is readied (3984) for compression, and the process is repeated.

Returning to FIG. 16, the next compression process after intra-frame and inter-frame coding comprises applying the coded signals S12 and S13 to an area dependent adaptive quantizer 1630. This quantizer, as previously described, quantizes the coded data as a function of the region area. This quantizer is only applied to the "C" coefficient of the Ax+By+C linear fills. Area dependent quantization of coefficients A and B has been found to not be necessary because these coefficients are typically less than unity. The average brightness "C" of large regions is nominally represented by all eight bits. Smaller regions are progressively quantized using fewer bits and thus shorter code words.

Figures 44, 45:
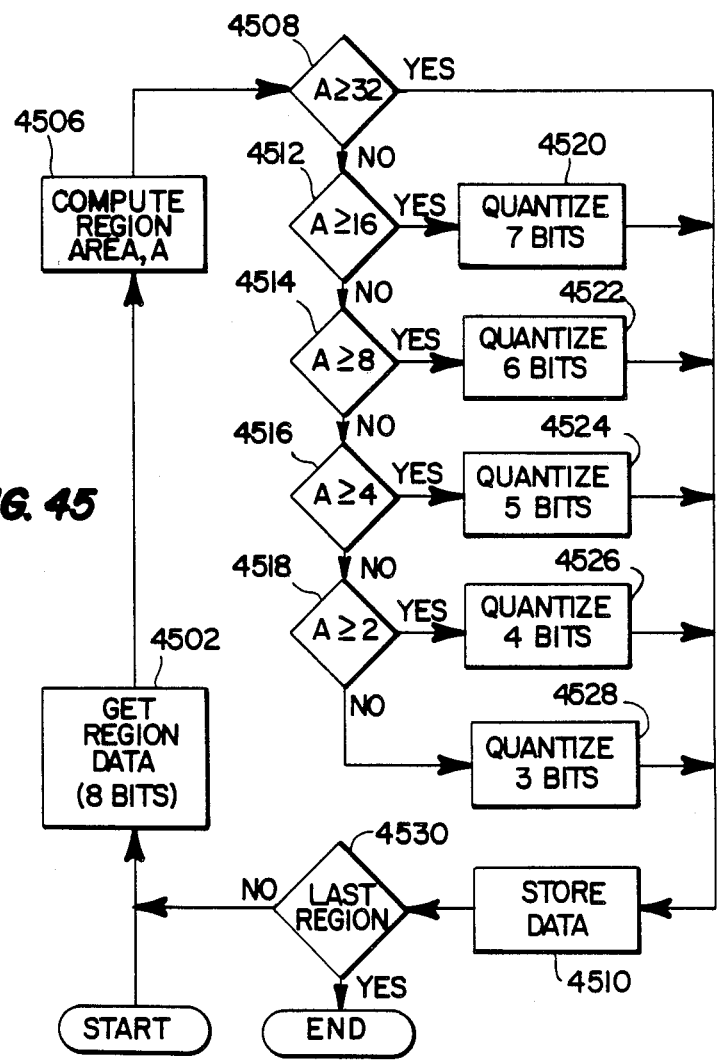
FIG. 44 is a table illustrating region area dependent adaptive quantization used in the compressor of FIG. 16.
FIG. 45 is a flow chart illustrating operation of the apparatus in FIG. 16 providing area dependent quantization of FIG. 44.

FIG. 44 is a table listing region sizes and the number of bits used to represent the region fill value. For a region of 32 pixels or more, 8 bits are used, thereby providing a fine resolution of 256 brightness levels. For regions in the range of 16 to 31 pixels, seven bits provide a resolution of 128 levels. One bit is dropped each time the area is halved. A one-pixel region is quantized to 3 bits giving a coarse resolution of 8 brightness levels.

From the foregoing, it is seen that 5 bits are saved for each one-pixel region, 4 bits are saved for each two-pixel region, etc. Area dependent adaptive quantization provides an additional data reduction as compared with assigning a full resolution value (8-bit byte) to every region fill value. Moreover, variable quantizing has been found to be visually acceptable because the large regions which are more visible are finely quantized thereby giving an overall appearance of high resolution. The smaller coarsely quantized regions are, in a manner of speaking, psycho-visually masked by the presence of large high resolution regions.

FIG. 45 is a flow chart implementation of the area dependent quantization of FIG. 44. The process begins by getting the height and width data for a region (4502) from a region data memory and computing the region area 4506. The region area (4506) is tested by area test 4508 and 4512 to 4518 to select the corresponding quantizers 4520 to 4528 for progressively decreasing the number of bits as the region "area" decreases below 32 pixels.

Returning to FIG. 16, the final element of compressor 230 to be described comprises what will herein be denoted as a "stream segmented" variable length code 1640. The term "stream segmented", as used herein, relates to the use of a plurality of variable length codes for each video frame. A minimum of 18 distinct variable length codes are generated for every single compressed digital video frame in the example herein described.

Recall that variable length codes, as is known, achieve data reduction by assigning shorter codes to more frequently occurring events. It has been discovered that there is no single variable length code that can efficiently code theseparately compressed Y, I and Q images. This is because the statistics of each of the Y, I and Q subframes are different. Moreover, it has been discovered that there is no single variable length code that can efficiently code the separate data elements of the sub-frames. Therefore, a different variable length code is used for each segment of each sub-frame.

Altogether, it has been found that six (6) different variable length codes are effective in describing the markedly different data comprising a single sub-frame. For this reason, the statistics (i.e., frequency of occurrence) of each major data category are calculated for every video frame stream. Since there are three subframes (Y, I, Q) a minimum of 18 statistical decoding "tables" are included in every video stream.

Figure 47:
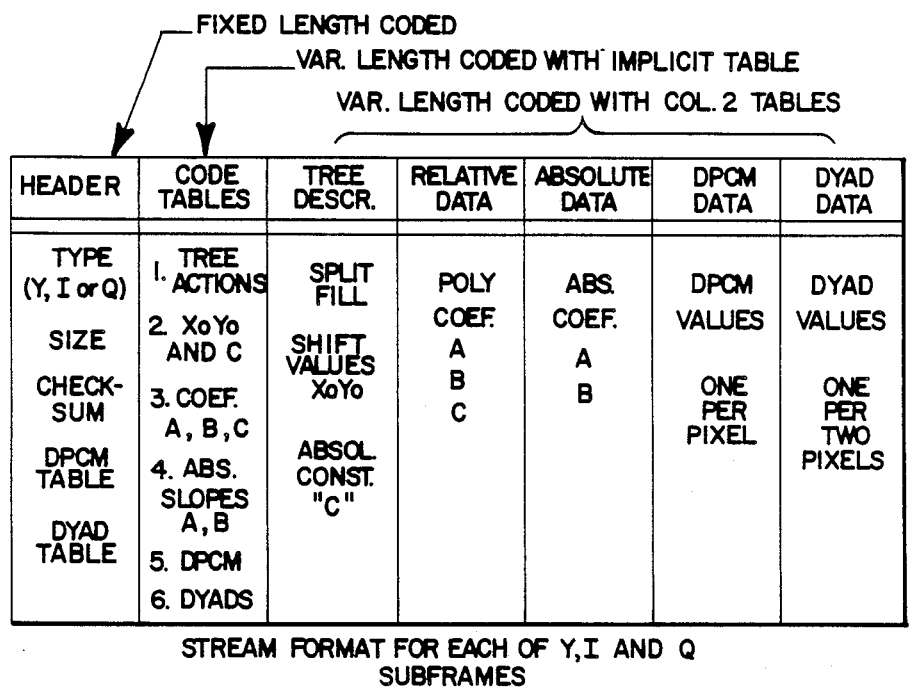
FIG. 47 is a diagram illustrating the format of data "streams" provided by the compressor of FIG. 16.

FIG. 47 illustrates the data format in detail of a compressed sub-frame of one video stream. The identical format is used for Y, I and Q portions of the compressed video stream.

The "header" segment, as previously mentioned, contains the sub-frame type (Y, I, or Q), its size (i.e., resolution), a check sum, and two tables (DPCM and dyad) that are used during decoding of the sub-frame. The header is followed by code tables describing the specific variable-length codes to be used in decoding the remaining segments of data. For efficiency, these table descriptions are themselves encoded using an implicit (i.e., agreed upon by the encoder and decoder) code table. The next section contains the binary tree description, containing "actions" and "values", as previously described under "Video Compression Processing". The "relative data" section follows, which contains the coefficients for all the relative bilinear fills. The "absolute data" sections contains only the A, B coefficients for absolute bilinear fills, since the C coefficients are contained in the tree description. The next section contains the DPCM data (one value per pixel) fo all the DPCM regions, and the last section contains the "dyad" data (one value per two pixels) for all the dyad regions. The ordering of the data within each of the last four segments is implicit: region data is ordered based on the order that regions will be generated by decoding of the binary tree, and pixel based values (DPCM and dyad) are ordered in ordinary raster-scan order (top line to bottom line, and left to right within each line).

Figure 46:
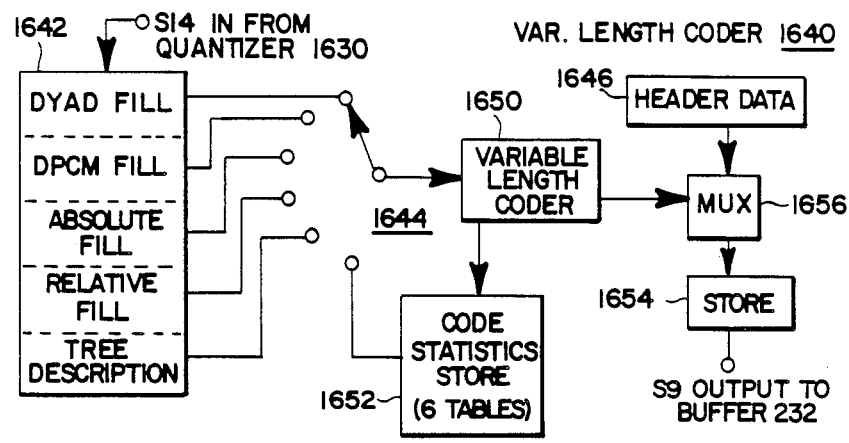
FIG. 46 is a block diagram of a stream segmented variable length coder for use in the compressor of FIG. 16.

FIG. 46 is a block diagram of the "stream segmented" variable length coder 1640. The region coded and quantized video signal S14 from quantizer 1630 is stored in memory 1642 as indicated. A selecter switch 1644 selects the dyad fill data, the DPCM fill data, the ABSOLUTE fill data, the RELATIVE fill data and the TREE descriptive data for application to a variable length coder 1650. Coder 1650 encodes the various types of data assigning the shortest codes to the more frequently occurring data code words and stores the variable length coded data in store 1654. The multiplex switch 1644 selects the stored data in the order shown in FIG. 47 to form the compressed digital video output signal S9 for application to buffer store 232. Header data provided by source 1646 is added by multiplex switch 1656.

More particularly, variable length encoder 1650 examines each data type independently of the other data types, to determine the statistics of the data in each data type over the entire subframe. For example, the relative frequency of occurrence of each codeword of the data is ascertained along with the range of, e.g. values, of the codewords in the data set. Using this information, one of a plurality of variable length code sets is selected which will most efficiently variable length encode the respective data types. The plurality of code sets are stored in element 1652. Once a code set is selected, coder 1650 retrieves the selected code set from store 1652 via switch 1644 and proceeds to encode the corresponding data type.

In addition, the particular variable length code sets are in turn variable length encoded and added to the data stream to provide additional data reduction. However, in this case variable length encoding is performed using a predetermined (implicit) variable length code set. This feature is provided in FIG. 46 by switch 1644 which couples the output of store 1652 to the variable length encoder 1650 when in the lower switch position.

Illustratively, the variable length encoding is a two pass process in which variable length coder 1650 first generates the code statistics and the variable length code sets for each of the data types. In the second pass the respective data types in store 1642 and the code sets in statistics store 1652 are variable length encoded.

Stream segmentation provides a significant advantage in reducing decoding time for the compressed video data. This results because it minimizes the number of times the variable length decoder (to be described) must be reprogrammed during decoding to accommodate the differing statistics of different code formats. In other words, by grouping all the DPCM data together the variable length decoder only has to be programmed once to decode all the DPCM regions. The same advantage results for the other code formats (relative, absolute, and dyad) as well as the tree data and other variable length coded data in FIG. 47.

Post Compression Processing

Once a sequence of images has been compressed, the formatter does further processing in preparation for full motion video playback. This processing is indicated in FIG. 13. In overview, the compressed video data S10 must be combined with the compressed audio data S7 and any auxiliary data S3 and prepared for recording on the CD-ROM 18.

The CD-ROM is shown as a representative member of a class of devices that have a high storage capacity (more than a 100 megabytes), and a relatively low sustainable data rate (1.23 megabits/sec for the CD-ROM). Other magnetic and optical storage media are also suitable.

FIGS. 8 and 9 illustrate how the audio data S7 is interleaved with the video data S10, and with other data to be described. FIG. 8 shows a logical frame. (The adjective logical is used to suggest that a logical frame may be different from 1/30 of a second, for example in 24 FPS playback.) In general, a logical frame is the set of all data that are needed during the time that a single image is displayed. FIG. 8 shows a logical frame with enough video data to construct one image, and enough audio data to be generated while the image is displayed. The size of a logical frame is determined by the sustained data rate from the input device (for a CD-ROM, 1.2288 megabits per second), and the image playback rate, commonly one every 33.3666 milliseconds. Hence for 30 FPS playback, the logical frame size must average 5125.12 bytes.

FIG. 13 shows how this average rate is achieved. It is a three phase process. In the first phase, data is captured from several sources, and written to disk 1350 as an interleaved stream of data. In the second and third phase, this stream is read back, processed through the dither switch 1390 and re-recorded on the disk. As a preview, the first phase collects the data and performs most of the processing needed to generate a single stream of data S4 that contains interleaved audio and video data. Phases 2 and 3 deal with any remaining problems, most importantly, with the possibility of oversized frames.

In the first phase, the control unit 1310 directs the audio ditherer 1360 to pass a specific amount of audio data each time that switch 1320 is coupled to it. The audio ditherer 1360 addresses the following problem.

The audio playback system 32 consumes bits at a specific and well defined rate. For voice quality audio, this may be set to 31.25 kilobits/sec. In order to sustain the maximum possible data rate from the CD-ROM player 22, the audio data rate in S16 must precisely match this. Too low a data rate from S16 will cause sound processor 32 to pause, waiting for data. Too high a rate will cause audio data to pile up in the host computer 28, waiting to be played. The audio ditherer 1360 assures that the average size of the digital audio data block in FIG. 8 is the right size as given by the relationship:

$$S*(D+1)/D*T = B$$

wherein: B is the number of audio bytes per frame, S is the audio data rate, D is the number of audio ADPCM samples between ADPCM resets (e.g., the ADPCM encoder is reset once for each 256 samples) and T is the period (in milliseconds) of the video frame rate. For a frame rate of 30 FPS, a data rate of 31.25 kilobits per second, reset frequency of 256 and a frame period of 33.36 milliseconds, the average value of B is equal to 130.847 bytes per frame.

The audio ditherer 1360 either passes 130 or 134 bytes for each logical frame. (The block sizes are rounded to multiples of four to increase the efficiency of moving data in the host computer 28). To make this decision, ditherer 1360 maintains a running average of how many bytes it has transferred so far. When the running average is less than 130.847, the audio ditherer 1360 passes 134 bytes. When the running average is greater than 130.847 the audio ditherer passes 130 bytes. The particular value 130.847 is passed from control element 1310, and is a function of the desired playback rate and the playback audio bit rate.

The switch 1370 is controlled by control element 1310, depending on the nature of the auxiliary data. Some auxiliary data needs to be available as the motion video is played, and is processed in phase 1. One example of auxiliary data may be imbedded directions to the host computer 28 to fade the audio volume at preselected times. Other auxiliary data may be passed via switch 1330, for incorporation in the signal stream during the second phase. Such other auxiliary data will not have critical timing relationships with the audio or video signal and, thus, ma be included at convenient locations in the bit stream, i.e., encoded video frames containing less than the nominal number of bytes. This auxiliary data may be loaded into the host computer 28 memory, as a side effect of playing the motion video sequence.

During Phase 1, for successive logical frames, switch 1320 is switched successively to the video data S10, the output of the audio ditherer 1360, and the output of the switch 1370. Switch 1320 also selects the output of a header data source 1361 which describes the length and location (pointers) of the individual pieces of data in the logical frame (FIG. 8). Note, during phase 1 there is no "filler" (i.e., padding) in the logical frame. Note also, the length of every logical frame may be different, because compressed video may have differing sizes, because of the audio dithering, and because the amount of auxiliary data may vary from one logical frame to another. The data for all the logical frames of the sequence are written to the disk store 1350, ending phase 1.

When phase 1 is complete, the control element 1310 initiates phase 2. In this phase the data collected by phase 1 is read in reverse from the disk store 1350 and rerecorded via loop 1351 in which switch 1390 inserts padding on additional auxiliary data to individual frames of the sequence. This process was earlier referred to as "reverse frame sequence reformatting." That is, during phase 2 the system e.g., computer, first processes the last frame, then the next to last, etc. The purpose of phase 2 is to generate padding data so that the average size of logical frame is 5125.12 as shown in FIG. 9 (for 30 FPS video).

Consider first the simplest case, the absence of oversize frames. In this case, the control unit merely adds the lengths of the audio, video and auxiliary data it finds, and then inserts enough padding bytes of zero value to raise the size of the logical frame to 5124 or 5128 bytes. The control logic for the dithering switch 1390 works similarly to that of the audio ditherer 1350. It maintains a running average of the size of the logical frames generated so far, and chooses whichever of 5124 or 5128 would tend to maintain an average of 5125.12. The required size for this average is set by the control 1310, based on the data rate of the recording medium and the desired playback rate in images per second.

If there are no oversized frames, the padding insertion could have been done during phase 1. The reason it is done in Phase 2 is to better deal with oversize frames. FIGS. 10, 11 and 12 illustrate the basic principle behind the processing of oversize frames. FIG. 10 shows the sizes a sequence of logical frames might have at the end of phase 1. Frame 3 is clearly too large to fit in 5125.12 bytes.

FIG. 11 illustrates one possible solution to this problem. On detection of oversized frames, the formatter sends a signal to the threshold control 238, requesting that the frame be recompressed harder so that it becomes small enough to avoid oversize frames. In FIG. 11 the result of such a recompression is shown. To simplify the figure, a logical frame size of 5000 is shown instead of 5125.12.

Note, in general oversize frames cannot be detected until after an entire sequence has been decoded and sent to the formatter. The reason is that the total size of a logical frame depends on information not directly available to the video compressor 30. For example, it may arise from the presence of a large block of auxiliary data.

The approach shown in FIG. 12 and implemented in FIG. 13 is a better solution, since it does not force recompression of the sequence. If such additional compression were done, it is likely that it would result in a perceptible loss of image quality, and the FIG. 12 approach avoids this. The compressed data for each frame should arrive at 1/30 of a second intervals, but up to a point (to be discussed), it does not matter if it arrives earlier. Hence the data for frame 3 can use space that is nominally associated with frame 2.

In general, the strategy is as follows. Each frame is read starting with the last and examined. If it fits in the current dithered size for a frame, just enough padding is added (switch 1390) to bring it up to that size. If not it is placed in the file so that it will start loading early, by borrowing space from the temporally previous frame. Next the temporally previous frame is examined. Despite the fact that space was borrowed from it, it is nevertheless possible that it will fit in its nominal frame allocation. This case is indicated in FIG. 12, where frame 2 and frame 3 both fit in the space associated with these two frames. In general, however, the temporally previous frame may not fit, even if it itself had not been oversized. In that case it is placed in the file so that it will be loaded ahead of the frame just processed. In this situation, no padding is generated, since every byte is needed. Continuing in this way, one of two things can happen. Either there is found a frame that fits where it was supposed to start, or the process reaches the first frame of the sequence.

In the first case, there is a subsequence of frames whose data can be read off the input device at a steady rate of one per frame. Some of the frames will start loading into the host 28 memory early, but none of the frames arrive late.

In the second case, it is apparently impossible to start the first frame so as to maintain a steady 30 FPS. This problem is solved by a third phase. As a result of the second phase processing, the formatter knows how many extra bytes were generated for the file. In the third phase the formatter reads the file generated by the second phase and generates the S4 bit stream. In this phase, the formatter looks for padding, and deletes it. This continues until an amount of padding equal to the excess bytes found in phase 2 has been deleted. The result is a file that can be played back in real time. In the unlikely case that phase 3 fails to find enough padding, the control 1310 signals the threshold control 238 that the sequence needs to be compressed for less code.

The control 1310 calculates two important statistics during phase 2 and 3. First, it may be necessary to pre-load a certain amount of CD-ROM data before beginning the playback. Control 1310 calculates this during phase 3 by looking at the time when each frame arrives compared to when it should arrive. Second, when a subsequence in the middle of a sequence has been blocked together during phase 2, some frames may occur very early. The control 1310 can tell exactly when each frame will arrive and hence how much temporary storage is needed for these early frames. These two important statistics are passed to the playback system to control the allocation of host computer memory prior to playback. If there is insufficient host memory, then control 1310 signals the threshold control that more compression is needed.

The above description ignored switch 1330. When padding is inserted, this basically introduces unused space in the S4 bit stream, that must be there to keep new frames arriving at the desired times. Depending on what the host computer is doing, there may be auxiliary data that can be loaded as a side effect of playing some motion video. If such data is present, control 1310 directs the switches 1370 and 1330 to use this auxiliary data instead of an equivalent amount of padding.

Playback System

The playback system 8 of FIG. 1 includes a CD-ROM player 22 which plays disc 20 to provide a recovered audio/video bit-stream signal S15 which is buffered in CD-ROM controller 24 and supplied to a bus 26 of a "host" computer 28. Recall that "frame header" data of bit-stream S15 identifies the location in the bit-stream of the compressed audio data (S7), the compressed video data (S10) and the auxiliary data. Computer 28 responds to the frame header identification data for directing the audio (S16) and video (S17) portions of bit-stream S15 to respective audio (32) and video (30) processors via bus 26. The auxiliary data (S18), if present, is stored in the host computer main memory for use, as an example, in interactive applications of the system. Illustratively, the auxiliary data may comprise address information of locations on disc 20 of specific still frames or motion video sequences. When prompted to select one of several sequences of still frames, the user enters his choice by means of input/output device 38 and the host computer responds by sending an appropriate seek command to player 22 by means of CD-ROM controller 24.

The sound processor 32 buffers and decodes the audio portion of bit-stream S15 to continuously supply one or more analog sound signals S19 to a speaker unit 34. Video processor 30 provides buffering, decoding and interlace conversion of the video portion (S17) of bit-stream S15. The processed video signal S20 is supplied at 30 frames per second, in for example, 2:1 interlaced RGB component form to a display 36 for displaying full motion color video. User interaction (control) of the over-all system is facilitated by an input/output unit 38 (e.g., a keyboard, monitor, "joy-stick", "mouse", etc.).

Video Decoding

Figure 48:
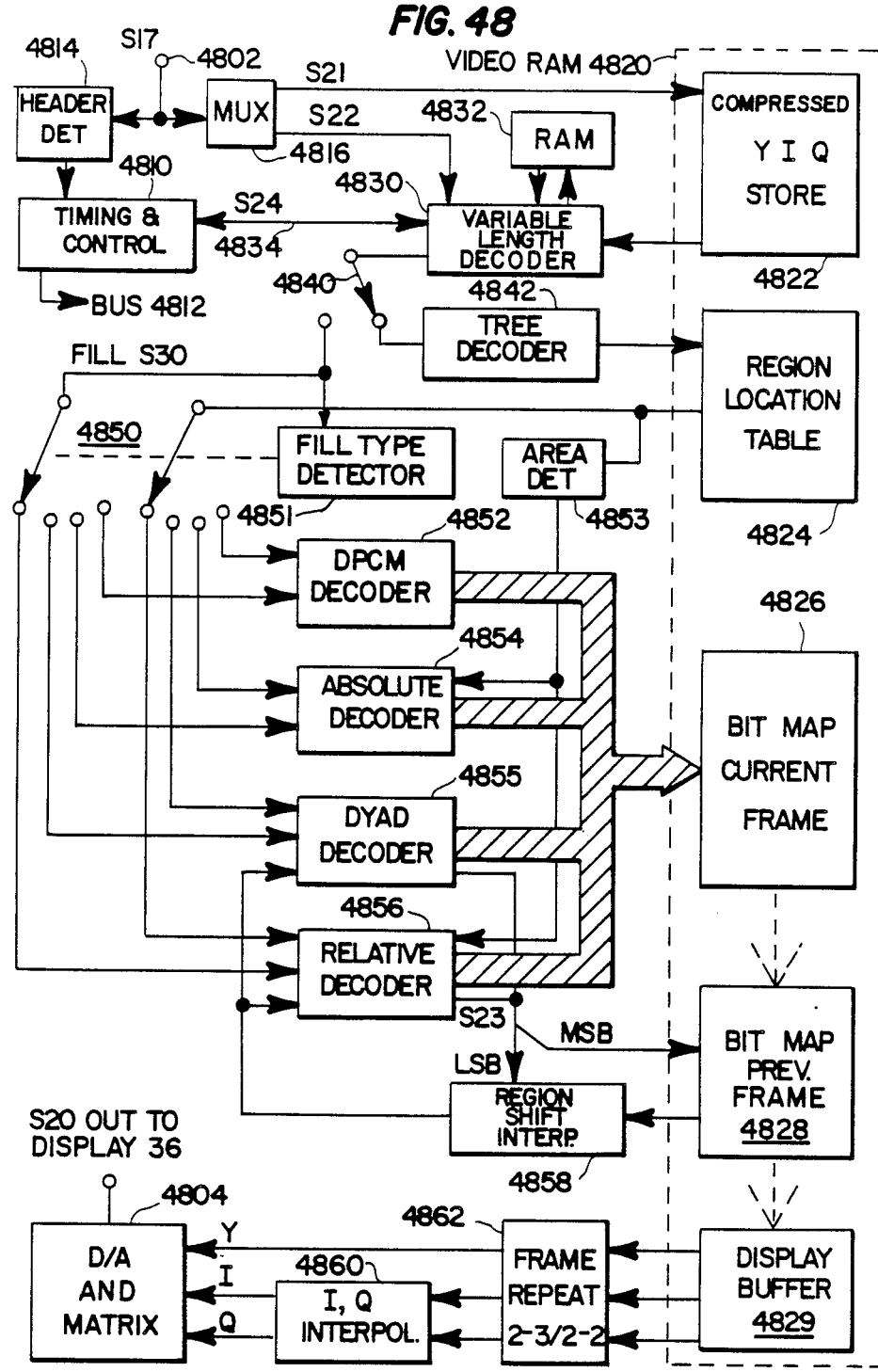
FIG. 48 is block diagram of a compressed digital video signal decoder used in the playback system 8 of FIG. 1.

Video processor 30, illustrated in detail in FIG. 48, decodes each frame of the compressed digital video signal S17 at terminal 4802 to provide a full-motion color video signal S20 (RGB) for display unit 36 (FIG. 1) in interlaced form at 60 fields per second. Processor 30 includes a timing and control unit 4810 which generates all timing signals for controlling such functions as memory read/write operations and decoder selection (switch control) by means of timing and control bus 4812 coupled to the various processor elements. To simplify the drawing bus 4812 is indicated only generally by an arrow. Header information relating to timing and control (e.g., frame rate, frame sizes, data pointers, etc.) is supplied to unit 4810 via a header detector 4814 coupled to input terminal 4802. A multiplex switch 4816 controlled by unit 4810 separates the compressed Y, I and Q data (S21) from signal S17 and stores it in compressed form at location 4822 of a video random access memory 4820 (outlined in phantom). Switch 4816 also separates the statistical code table data S22 from signal S17 and applies it to variable length decoder 4830. The decoder 4830 decodes the statistical data and stores it in a RAM 4832 for use by a variable length decoder 4830 when the compressed data S21 is recovered from location 4822 of video RAM 4820.

After loading the compressed Y, I and Q data as described above, the decoding process for one frame begins. To decode one frame, the identical process is performed three times—once for each sub-frame (Y, I and Q). The following description applies to the decoding of one sub-frame.

The first step in the decompression of one sub-frame is to "parse" the binary tree description. That is, the tree data, which describes the tree in terms of splits and fills, is converted into an explicit list of region locations and sizes and fill types. This is accomplished by applying the tree data to the tree decoder 4842, which traverses the tree and, at each terminal node of the tree, outputs the relevant data to the region list. This list is stored in the region location table 4824 in video RAM 4820.

The general format of the region table is shown in FIG. 49. For each cell, its "type" (relative, absolute, DPCM, or dyad), along with the coordinates of its upper left corner (X, Y) and its size (H, W) are listed. If the cell is a relative or a dyad cell, in which case the region shift interpolator 4858 will be used, the offset values ($X_o$, $Y_o$) are also stored. These values specify the relative offset between the region in the current image and its corresponding region in the previous image. If the cell is absolute, the absolute fill value (which is equivalent to the value C in the fill polynomial $Ax+By+C$) is also stored.

FIG. 50 shows an exemplary image and the corresponding region table FIG. 51 that would be output by the tree decoder. This image consists of two regions of each possible type. Notice that all of the cells of a particular type are not necessarily grouped together in the region table, due to the order in which the binary tree is traversed.

Since some types of cells (e.g., dyads) operate on pairs of pixels, it is desirable for all cells to have dimensions (H and W) equal to an even number. Simple binary-tree splitting, in which a dimension is divided in half on each split, rapidly leads to regions that have odd dimensions, unless the original image dimensions are powers of 2. Since this is overly restrictive, an improved splitting scheme is used, in which a dimension D that needs to be split will generate the two values $2\text{Int}(D/4)$ and $D-2\text{Int}(D/4)$ where $\text{Int}(D/4)$ is the integer part of the quotient $D/4$. This still splits approximately in the middle but ensures that all cell dimensions will be even numbers, provided the original image dimensions are also even. Since this restriction applies equally to all three sub-frames, and since the I and Q sub-frames are subsampled by a factor of 4, this means that the overall image dimensions must be multiples of 8.

Returning to FIG. 48, video RAM 4820 includes two bit maps, one for storing pixels of the current frame being decoded (map 4826) and the other (map 4828) storing pixels of the frame that was previously decoded and is available for display on display unit 36 (FIG. 1). To create bit map 4826 the compressed fill data at location 4822 and the region location data at location 4824 are applied via switches 4850 to a selected one of four decoders 4852, 4854, 4855 and 4856 depending on the "type" of fill data i.e. DPCM, absolute, dyad or relative. The fill data at location 4822 is first variable length decoded in unit 4830 for application (via switch 4840) to the decoder selector switch 4850. Control of switch 4850 is provided by a region fill type detector 4851 which directs DPCM fill data to decoder 4852, absolute fill data to decoder 4854, dyad fill data to decoder 4855 and relative fill data to decoder 4856.

The absolute and relative decoders (4854, 4856) receive data representing the region "area" (i.e., the number of pixels in a region) provided by area detector 4853. This is used, as will be explained, in "dequantizing" the fill data which, it will be recalled, is quantized on the basis of region size for regions having fewer than 32 pixels. Bit map 4828 receives address data from the dyad and relative decoder 4855 and 4856 for supplying region pixel data of the previous frame to decoders 4855 and 4856 via region shift interpolator 4858. As bit map 4826 is being generated, bit map 4828 is ready for display on unit 36. This may be facilitated by selecting a video RAM having multiple input/output ports and buffers. Alternatively, as shown, the contents of bit map 4828 may be transferred to a separate display buffer 4829 per display purposes.

Since the I and Q data is subsampled by 4:1 both vertically and horizontally with respect to the Y pixels, an interpolator 4860 is provided for interpolating the I and Q pixel arrays ($64 \times 60$ each) back to the size of the Y array ($256 \times 240$). The Y, I and Q data is first applied to a frame repeater 4862 which (for 30 FPS playback) doubles the frame rate (30 Hz) by reading bit map 4829 twice and interlacing the resultant 60 Hz field rate YIQ signal. When 24 FPS video is to be displayed at 60 fields per second, repeater 4862 repeats decoded frames using a 2-3-2-3 repeat sequence. The luminance signal Y and interpolated I and Q signals are applied to a digital-to-analog (D/A) converter and matrix unit 4804 which forms the RGB analog output signal S20 for display unit 36.

Figure 53:
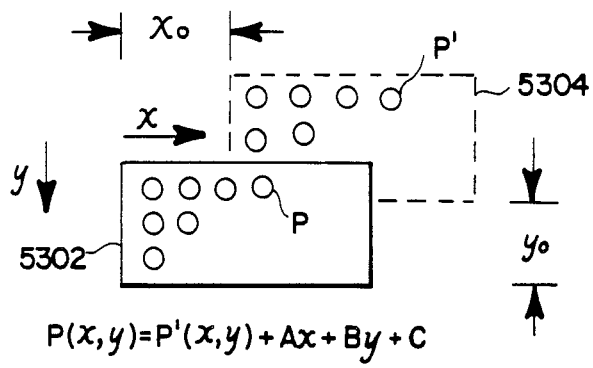
FIG. 53 is a diagram illustrating relative region decoding of an inter-frame coded region by the decoder of FIG. 48.

FIG. 53 illustrates the process of relative decoding. The value of each pixel $P(x,y)$ in the current frame 5302 is determined by adding the value of the polynomial function $Ax+By+C$ to the corresponding pixel $P'(x,y)$ in the previous frame 5304. The coordinates x and y are measured relative to the upper left corner of the region. The location of the region 5304 in the previous frame is determined by the offset values $X_o$ and $Y_o$, which represent the spatial offset of the region 5304 relative to the region 5302, expressed in units of $\frac{1}{8}$ pixel.

Figure 54:
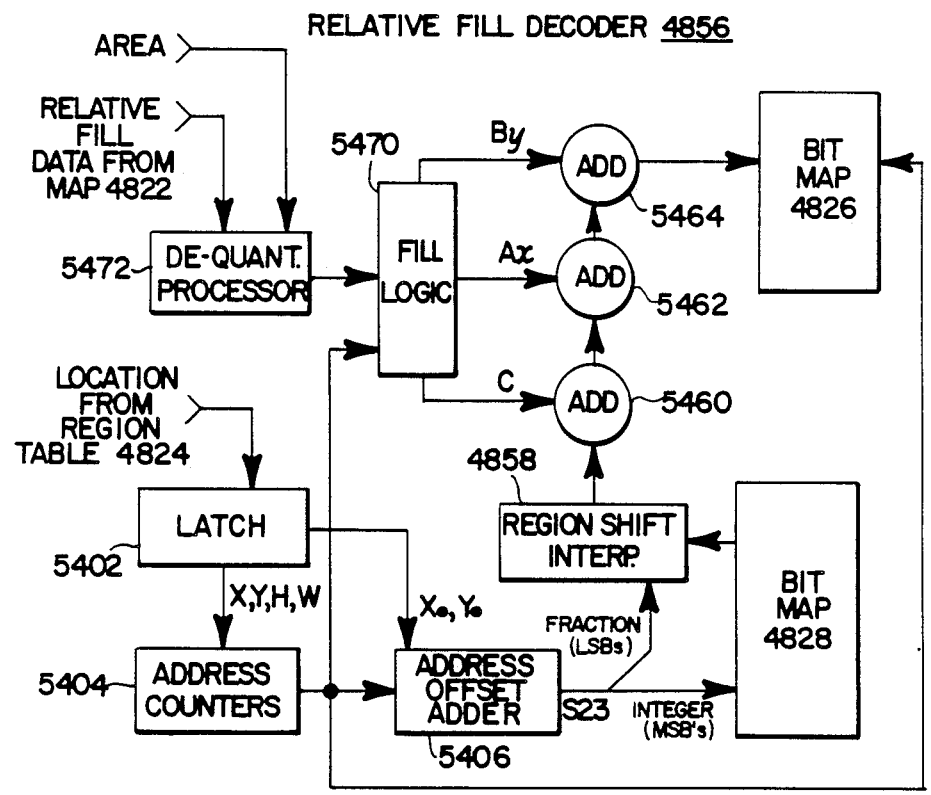
FIG. 54 is a block diagram of apparatus providing the relative decoding of FIG. 53.

FIG. 54 is a detailed block diggram of relative decoder 4856. The X, Y, H, W, $X_o$, and $Y_o$ values from region location table 4824 are latched in latch 5402. The coordinates X, Y are applied to an address counter unit 5404 to initialize it to the upper left corner of the region to be decoded in bit map 4826. The height and width values H, W are used to specify counter limits horizontally and vertically, so that the address counter steps successively through the address of each pixel in the region 5302.

Recall that the $X_o$, $Y_o$ values represent a region offset expressed in fractional-pixel precision. The integer parts of these values are passed through the address offset adder 5406 and added to the addresses from the address counter 5404. The resulting addresses are applied to bit map 4828 to address the pixels in the previous-frame region 5304. The fractional parts of the $X_o$, $Y_o$ values are applied to the region shift interpolator to produce interpolated values at intermediate locations between the actual pixels in bit map 4828.

The next stage of relative decoder 4856 adds the relative fill polynomial value $Ax+By+C$ to the shifted region data and stores the new region 5302 in bit map 4826. The coefficients A, B, and C are read from the bitstream and applied to the dequantizer 5472 to undo the area-based value quantization described previously. After dequantization, the coefficients are applied to the fill logic unit 5470. This unit takes the three coefficients and the values of x and y from the address counter 5404 and outputs the three terms of the fill polynomial. The x and y values are the region coordinates which are used in logic 5470 to determine the terms of the fill value. The three resulting terms are then summed, using adders 5460, 5462, and 5464, with the previous region data, and stored in bit map 4826. Recall that the coefficients WA and WB are fractional numbers, and therefore that the fill value output by the adders of FIG. 54 is also fractional. Before writing this value to bit map 4826, it is truncated to an integer.

Figure 55:
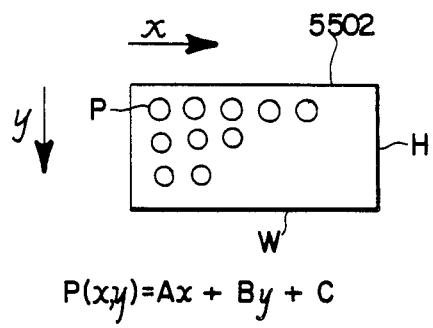
FIG. 55 is a diagram illustrating absolute region decoding in the decoder of FIG. 48 of an intra-frame coded region.

FIG. 55 illustrates the decoding of an absolute region. In this case there is no previous region to consider. The value of the each pixel $P(x,y)$ is the value of the polynomial $Ax+By+C$, where x and y are coordinates measured relative to the upper left corner of the region. Recall that the value of C is stored in the region location table, since it was encoded with the tree description, but the values of A and B are contained in the "absolute fill" segment of the bitstream.

Figure 56:
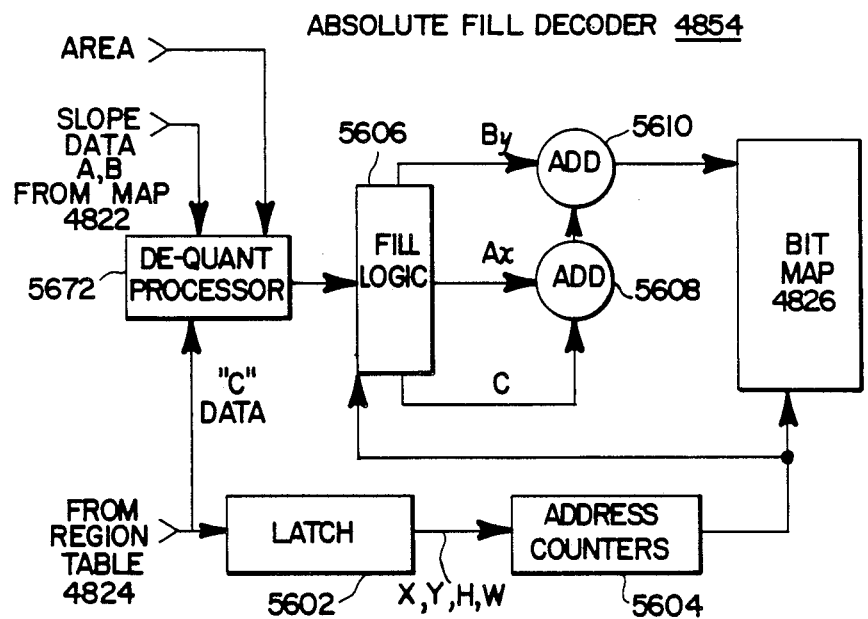
FIG. 56 is block diagram of apparatus providing the absolute decoding of FIG. 55.

FIG. 56 is a block diagram of the absolute decoder 4854. It is similar to relative decoder 4856 but does not use a previous bit map or the region interpolator. The A, B, and C values are dequantized by dequantizer 5672, as required, and processed by the fill logic 5606 to produce the terms of the fill polynomial. These terms are added by the adders and the result, after truncating to an integer, is written to bit map 4826. The address counters 5604 control this process to produce pixel values at all locations within the rectangular region defined by X, Y, H, W.

FIG. 57 illustrates the process of DPCM decoding. A pixel value (P') in region 5702 is obtained by adding a difference value D to the value of the pixel immediately to its left (P). A pixel (such as Q' in the figure) which is on the left edge of the region, and so does not have a region pixel immediately to its left, is decoded by adding the value D to the pixel above it (Q). The pixel in the upper left corner of the region, which does not have a pixel above it nor a pixel to its left, is decoded by adding the value D to the constant 128. Recall that all the D values are contained in the DPCM segment of the bitstream.

FIG. 58 is a block diagram of DPCM decoder 4852. The X, Y, H, and W values from table 4824 are stored in latch 5802 and used by the address controller 5804 to generate pixel addresses for every pixel in the region 5702 being constructed. Controller 5804 also generates pixel addresses for reading from bit map 4826 to provide the pixels P to be added with difference values D. The DPCM data from variable length decoder 4830 (FIG. 48) is applied to the DPCM dequantizer 5808, if required, which yields the difference values D. These values are then added, using adder 5805, to pixels values read from bit map 4826 (or to 128 if it is the first pixel of the region) to produce the new pixel value for writing to region 5702 of the bit map 4826.

FIG. 61 illustrates the process of decoding a dyad region. The values of pixels in the current frame 6110 are determined by adding pairs of values (R, S) to pairs of pixels (C, D) in a corresponding region of the previous frame 6120 to produce pairs of pixels (A, B) in the current frame. As in a relative fill region, the location of the region 6120 in the previous frame is determined by offset values $X_o$ and $Y_o$, which represent the spatial offset of the region 6120 relative to the region 6110, in fractional-pixel units.

Figure 63:
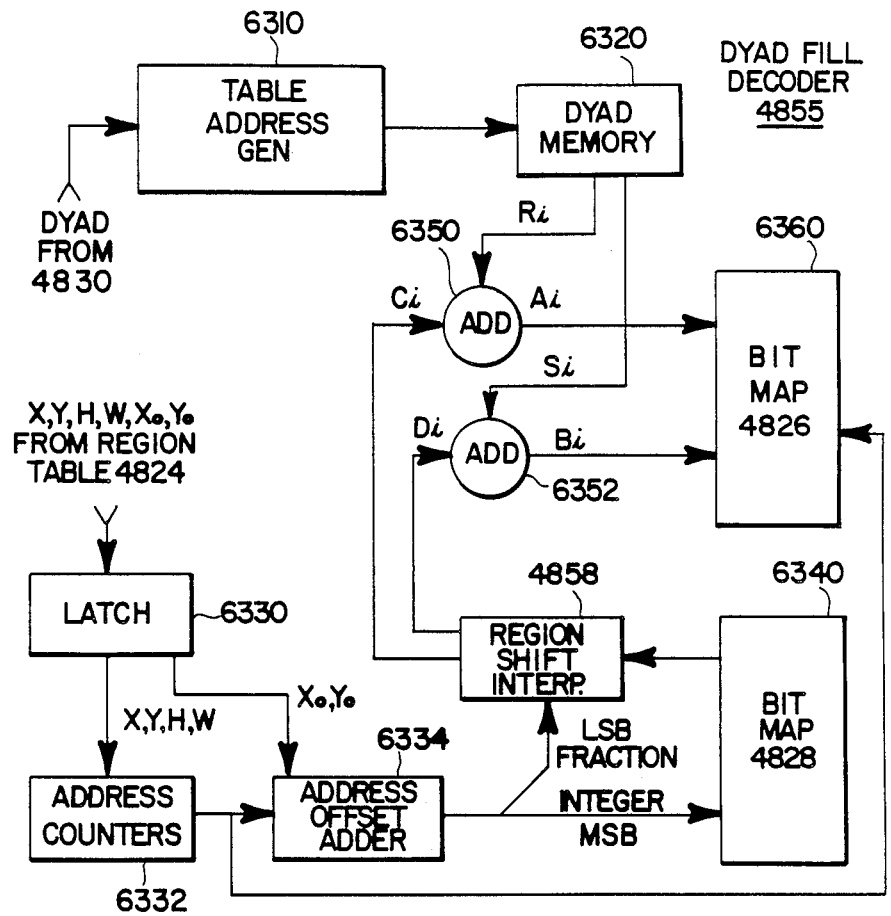
FIG. 63 is a block diagram of a dyad decoder for use in the decoder of FIG. 48.

FIG. 63 is a detailed block diagram of dyad decoder 4855. The X, Y, H, W, $X_o$, and $Y_o$ values from region location table 4824 are latched in latch 6330. The coordinates X,Y are applied to an address counter unit 6332 to initialize it to the upper left corner of the region to be decoded. The H,W values are used to determine the number of pixels that will be counted horizontally and vertically by the address counter.

The $X_o$, $Y_o$ values are applied to the address offset adder 6334 to generate the integer and fractional offset addresses for bit map 4828 and interpolator 4858 respectively. To produce pixel values for the target region, the shifted region data C,D is read from bit map 4828, processed through the region shift interpolator, 4858, and added to the dyad values R,S using adders 6350 and 6352. The resulting values A,B are written to bitmap 4826.

The dyad values are produced by first variable-length decoding a value from the bitstream using decoder 4830, and applying it to the table address generator 6310 to point at a dyad in dyad memory 6320. For example, if the value after variable-length decoding is a 3, this would cause dyad pair #3 to be read out of the dyad memory.

Figures 59, 60:
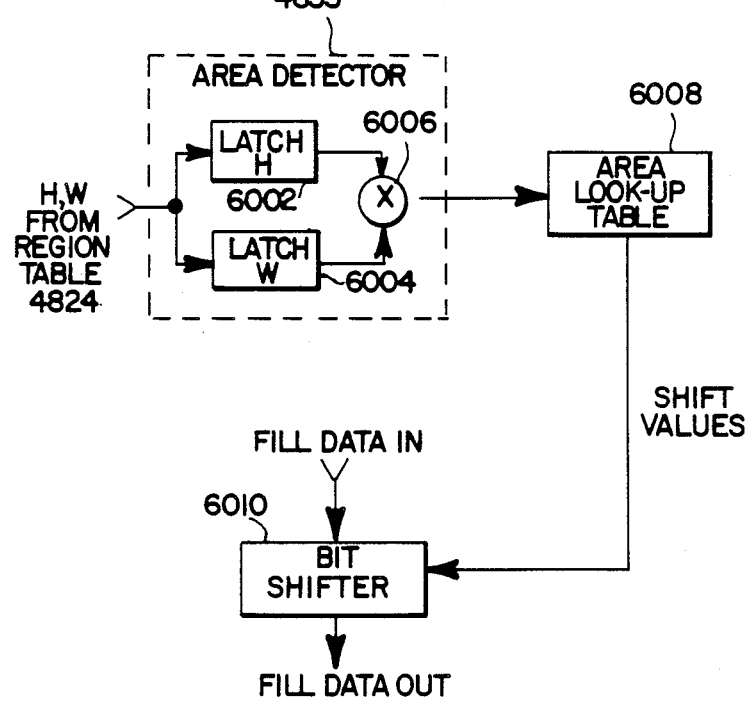
FIG. 59 is a table listing of area dependent adaptive quantization values for "dequantizing" pixel data in the decoder of FIG. 48.
FIG. 60 is a block diagram of apparatus for providing area dependent dequantization in the decoder of FIG. 48.

FIG. 59 is a table listing quantization values for regions smaller than 32 pixels. Recall that a one-pixel region was quantized to a resolution of 3-bits representing 8 levels of brightness. As the area doubles one more bit of accuracy is used up to full video resolution of 8 bits per pixel. This reduces the number of bits needed to represent small regions. Decoding or "dequantizing" of this data requires a shift left to give the bits their proper binary significance when the fill values are calculated.

FIG. 60 is a block diagram for implementing the left-shift "dequantizer" operation of FIG. 59. The region height (H) and width (W) data from region location table 4824 is latched in latches 6002 and 6004 and multiplied by multiplier 6006 of area detector 4853 (outlined in phantom). The multiplier provides address codes to an area look-up table 6008 to obtain shift values as a function of area (FIG. 59). These values are applied to bit shifter 6010. Quantized variable length fill data to be left justified is applied to the data input of the bit shifter 6010 which left shifts the data in accordance with the shift value provided by table 6008.

The discussion of the decode time monitor 236 indicated that occasional long-decode images were acceptable, since it is possible to borrow decode time from the previous image. This notion is discussed further in the context of FIG. 52 which shows further detail of the video RAM 4820. This memory includes a number of display buffers including a buffer 4826 into which the frame currently being decoded is stored, a buffer 4828 for storing a frame which was previously decoded, a graphics buffer 5202, a pipeline buffer 5204 and a display buffer 4829. Each of these buffers is large enough to hold an entire decompressed image. As described earlier, the decoding process uses data from a previous image stored in bitmap 4828 to decode the next image or current image which is stored in bitmap 4826. In FIG. 52, the frame contained in buffer 5202 was decoded just prior to the frame contained in display buffer 4828 and the frame contained in display buffer 4829 was decoded just prior to the frame contained in bit map 5204, and so on. That is, the image being displayed from buffer 4829 is not necessarily the image being used by the decode process, but may in fact have been decoded several frame times ago.

An advantage of having multiple display buffers is that it permits the host software to draw graphics on the display before it is viewed. Such changes cannot be made on bit map 4826 because it is in the process of being decoded. They cannot be drawn in bit map 4828 since the pixels of 4828 are used during decoding, and this cannot be corrupted by graphics pixels. They should not be drawn in buffer 4829 since the drawing process would be visible on display 36. Drawing them in buffer 5202 has none of these problems.

Another reason for multiple display buffers is that it facilitates decode time borrowing. By having a few extra buffers in the video RAM, the time at which a buffer is chosen for display may be independent of or asynchronous with the decoding process. As long as the pipeline of images does not run dry, frame repeater 4862 can work with no visible pauses or blanks in the displayed image. This principle is similar to the dithering boxes in FIG. 13. Repeater 4862 maintains a running average of the rate of display of images, and holds the current image or advances to the next, so as to keep the running average close to the desired playback rate. This feature is particularly useful for variable-speed playback applications. For example, a user may wish to slow down or stop the playback frame rate of material recorded at 30 FPS for viewing details of a particular frame or frame sequence. If 30 FPS recorded video is to be viewed as a sequence of still frames, then the CD-ROM player may be paused and the contents of the buffer pipeline may be selectively displayed a frame at a time. The CD-ROM may be operated in a start-stop mode to keep the display pipeline from emptying.

The formatter 250 (FIG. 2) is designed to assure that the pipeline of display buffers does not run dry. Based on the values produced by the decode time monitor 236, it can simulate the behavior of the display buffer pipeline during playback, and determine a minimum encoded frame size that prevents pipeline exhaustion. If this value is larger than the memory available on the host for display buffers, control 1310 may be used to signal the threshold control 238 that the compression is to be repeated using higher threshold values so as to obtain shorter decode times.

In the examples of the system herein described, a CD-ROM was used as the transmission media for the compressed signal. Alternatively, other transmission media may be used such as digital magnetic disk or tape. Also full-sized (e.g., 12 inch) optical discs or discs of the capacitive storage type may be used for transmission. Transmission of the compressed signal may also be provided by other means such as satellite or cable transmission systems. It will further be noted that linear fill data for absolute and relative regions are both represented by coefficients A, B, C of the equation $Ax+By+C$. It is to be remembered that the coefficients of absolute fill data are related to actual pixel values while the coefficients for relative fill data are related to the difference values between pixels in the target region and pixels in the corresponding region of the previous frame.

What is claimed is:

1. Decoding apparatus, comprising:
    means for providing a compressed digital video signal of a type in which each frame thereof comprises a plurality of coded regions, each region being encoded by a region descriptive code and a region fill code, said region descriptive code conveying data representative of the sizes and locations of said regions within said frame, said region fill codes conveying pixel amplitude indications for said regions;
    first decoding means, coupled to said providing means, for decoding said region descriptive codes and producing a table of region addresses for an entire frame;
    second decoding means, coupled to said providing means, for decoding said region fill codes and providing pixel values;
    memory means, coupled to said first and second decoding means for storing said pixel values at said addresses to provide a decoded bit map containing one frame of pixels.

2. Decoding apparatus as recited in claim 1 wherein said region descriptive and fill codes are conveyed by separate segments of said compressed digital video signal and further comprising control means for causing said first decoding means to decode said region descriptive codes prior to decoding of said region fill codes by said second decoder means.

3. Apparatus as recited in claim 1 wherein said region descriptive codes and said region fill codes are conveyed by separate segments of said video input signal and are individually variable length coded in accordance with their respective statistical distributions, said apparatus further comprising:
    multi-mode variable length decode means coupled to said providing means for variable length decoding said region descriptive codes in accordance with a first statistical code and for variable length decoding said region descriptive codes in accordance with at least one further statistical code; and
    circuit means coupled to said input means for deriving said statistical codes from data included in a third segment of said compressed digital video signal.

4. A decoder for decoding compressed video signal, said compressed video signal being region specific encoded wherein respective regions are encoded with one of a plurality of coding algorithms and said region specific codes are variable length encoded, said decoder comprising:
    means for applying said compressed video signal;
    memory means for storing a plurality of frames of video signal;
    means coupled to said means for applying said compressed video signal and conditioning said memory means for storing compressed video signal representing at least one frame of a video image;
    variable length decoding means coupled to said memory means for variable length decoding said compressed video signal stored therein;
    region specific decoding means having inputs coupled to said variable length decoder and said memory means, for selectively decoding ones of said region specific codes responsive to said region specific codes; and
    means for coupling decoded video signal from said region specific decoding means to said memory means.

5. The decoder set forth in claim 4 wherein an input of said region specific decoding means is coupled to said memory means through an interpolator for generating values representing pixels interstitial to decoded pixel values stored in said memory means.

6. The decoder set forth in claim 4 wherein the compressed video signal is segmented into segments of data corresponding to different ones of said plurality of region specific codes, each segment being independently variable length encoded, said compressed video signal including data corresponding to variable length codes applied to said segments, said decoder further comprising:
    means, including means coupled to said means for applying said compressed video signal, for applying said data corresponding to variable length codes, to said variable length decoder;
    means, coupled to said variable length decoder for storing decoded data corresponding to variable length codes for use by said variable length decoder to variable length decode said independently variable length encoded segments.

7. The decoder as set forth in claim 4 wherein said region specific decoding means includes means for requantizing region specific codes, that are quantized as a function of region size.

8. The decoder set forth in claim 4 wherein said region specific decoding means includes:

means for retrieving from said memroy mean pixel values from regions of a previously decoded image; and means, responsive to region specific codes describing interframe pixel differences with bilinear polynomial coefficients, and pixel values from regions of a previously decoded image, for altering said pixel values in accordance with a bilinear polynomial function describing said interframe pixel differences over respective regions.

9. The decoder set forth in claim 4 wherein said region specific decoding means includes means for decoding image regions described by DPCM code, image regions described by polynomial coefficient codes, and image regions described by dyad codes.

10. The decoder set forth in claim 9 wherein said region specific decoding means includes means for dyad decoding comprising:

means coupled to said variable length decoder for extracting data corresponding to dyad tables from said compressed video signal, and for storing said dyad tables;

means responsive to region specific codes corresponding to dyad codes of said compressed video signal for addressing said dyad tables to produce dyad values;

means for retrieving from said memory means pixel values from image regions of previously decoded images; and means responsive to said dyad values and said pixel values for combining said dyad values with respective ones of said pixel values.

11. A decoder for decoding compressed video signal provided on average at a predetermined frame rate, said compressed video signal including a plurality of region specific code types, each of which is independently variable length encoded, said decoder comprising:

an input port for applying said compressed video signal;

a variable length decoder, coupled to said input port, for variable length decoding said plurality of region specific codes according to respective corresponding independent variable length codes;

region specific decoding means coupled to said variable length decoder for decoding said region specific codes to generate frames of decoded video images on average at said predetermined frame rate;

memory means for storing said generated frames of decoded video images;

means for reading from said memory means, successively stored frames of decoded video images at said predetermined rate for display on an output device, and for repeating the readout of stored frames if said region specific decoding means fails to provide decoded frames of video images at said predetermined rate.

12. The decoder set forth in claim 11 further including means for storing at least one frame of compressed video signal coupled between said input port and said variable length decoder.

13. Decoding apparatus for decoding a video signal, encoded using region specific coding wherein parameters of the region specific codes, including region specific variables descriptive of pixel values in respective regions, are quantized with different numbers of bits according to the size of a particular coded region, said decoding apparatus comprising:

means for applying said encoded video signal;

means responsive to said encoded signal for determining region size values representative of the size of respective regions;

means responsive to said encoded signal, for extracting region specific variables quantized according to the size of corresponding regions;

means responsive to said extracted region specific variables and said region size values for requantizing said region specific variables parameters to values having like numbers of bits.

14. The decoding apparatus set forth in claim 13 wherein the means for requantizing comprises means responsive to the region size values for shifting bits of said region specific variables to bit positions of greater significance.

15. The decoding apparatus set forth in claim 13 wherein said means for determining region size values includes a table of values responsive to the dimensions of respective areas for providing shift control signals to the means for shifting bits of said region specific variables.

* * * * *